US009450010B2

(12) United States Patent
Kashihara

(10) Patent No.: US 9,450,010 B2
(45) Date of Patent: Sep. 20, 2016

(54) LIGHT RECEIVING ELEMENTS FOR PHOTOELECTRIC CONVERSION AND CAPACITOR ELEMENTS FOR CHARGE STORING IN JOINED SUBSTRATES

(71) Applicant: RENESAS ELECTRONICS CORPORATION, Tokyo (JP)

(72) Inventor: Keiichiro Kashihara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/017,293

(22) Filed: Feb. 5, 2016

(65) Prior Publication Data

US 2016/0155766 A1 Jun. 2, 2016

Related U.S. Application Data

(62) Division of application No. 14/464,423, filed on Aug. 20, 2014, now Pat. No. 9,293,496.

(30) Foreign Application Priority Data

Aug. 21, 2013 (JP) ................................. 2013-171334

(51) Int. Cl.
*H01L 27/146* (2006.01)
*H01L 49/02* (2006.01)

(52) U.S. Cl.
CPC ..... *H01L 27/14634* (2013.01); *H01L 27/1464* (2013.01); *H01L 27/1469* (2013.01); *H01L 27/14609* (2013.01); *H01L 27/14623* (2013.01); *H01L 27/14636* (2013.01); *H01L 27/14643* (2013.01); *H01L 28/75* (2013.01); *H01L 27/14621* (2013.01); *H01L 27/14627* (2013.01); *H01L 27/14685* (2013.01)

(58) Field of Classification Search
CPC .................. H01L 27/14623; H01L 27/14634
See application file for complete search history.

(56) References Cited

U.S. PATENT DOCUMENTS

| 2008/0265296 A1 | 10/2008 | Uya |
| 2009/0224345 A1 | 9/2009 | Lee |
| 2010/0238334 A1 | 9/2010 | Takahashi |
| 2013/0015328 A1 | 1/2013 | Goto |
| 2013/0068929 A1 | 3/2013 | Solhusvik |

FOREIGN PATENT DOCUMENTS

| JP | 2011-166171 A | 8/2011 |
| JP | 2011-228621 A | 11/2011 |

OTHER PUBLICATIONS

U.S. Notice of Allowance dated Nov. 6, 2015 issued in U.S. Appl. No. 14/464,423.

*Primary Examiner* — Thanh V Pham
(74) *Attorney, Agent, or Firm* — McDermott Will & Emery LLP

(57) ABSTRACT

Provided are a semiconductor device in which a solid-state image sensing element having a backside-illuminated structure and capacitor elements storing therein some of the charges supplied from light receiving elements has further improved reliability and a manufacturing method thereof. In the solid-state image sensing element of the semiconductor device, first and second substrates are joined together at a junction surface. The first substrate is formed with photodiodes. The second substrate is formed with the capacitor elements. The photodiodes and the capacitor elements are placed to be opposed to each other. In the first substrate, first coupling portions for coupling to the second substrate are placed. In the second substrate, second coupling portions for coupling to the first substrate are placed. A first gap portion between the first coupling portions and a second gap portion between the second coupling portions are placed to overlap a first light blocking film.

8 Claims, 39 Drawing Sheets

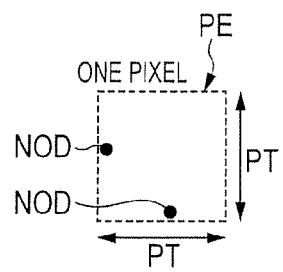
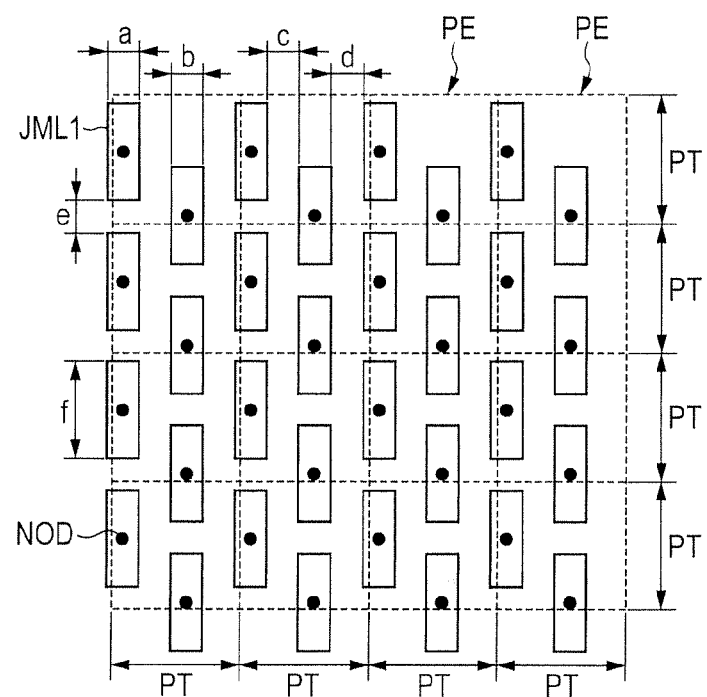
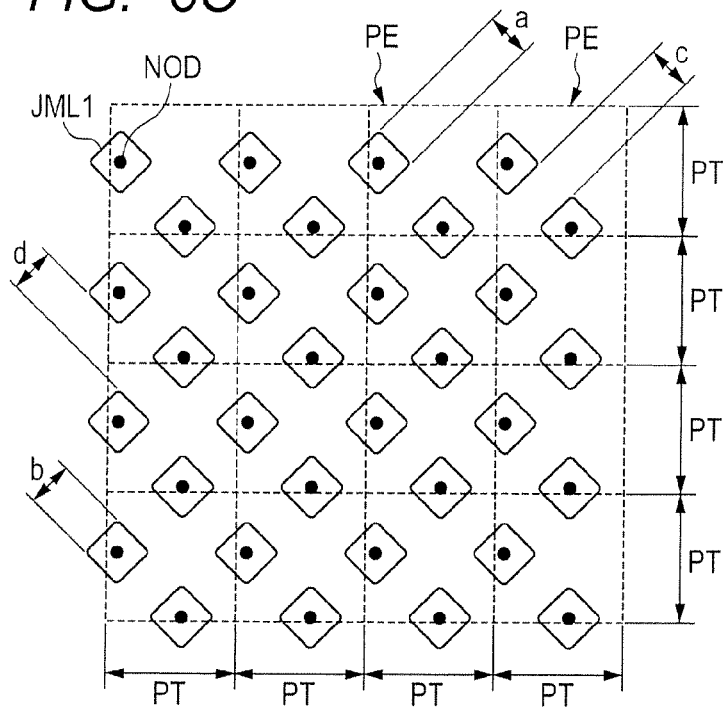

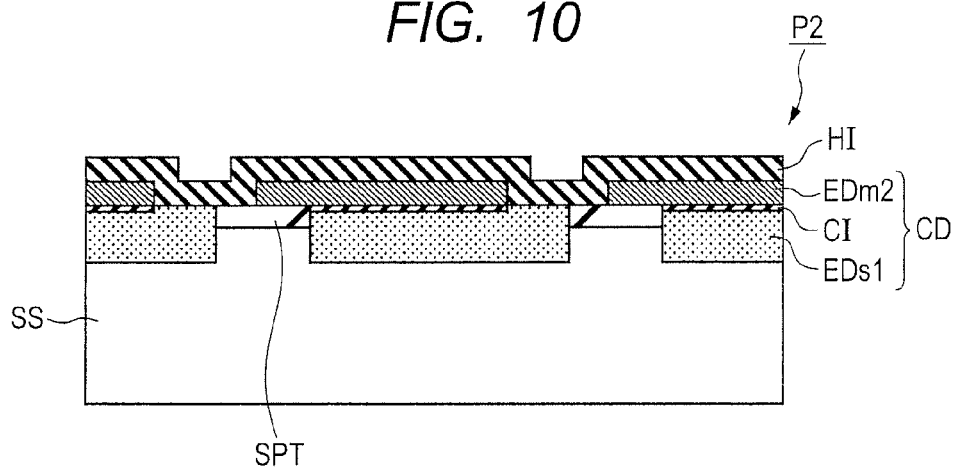
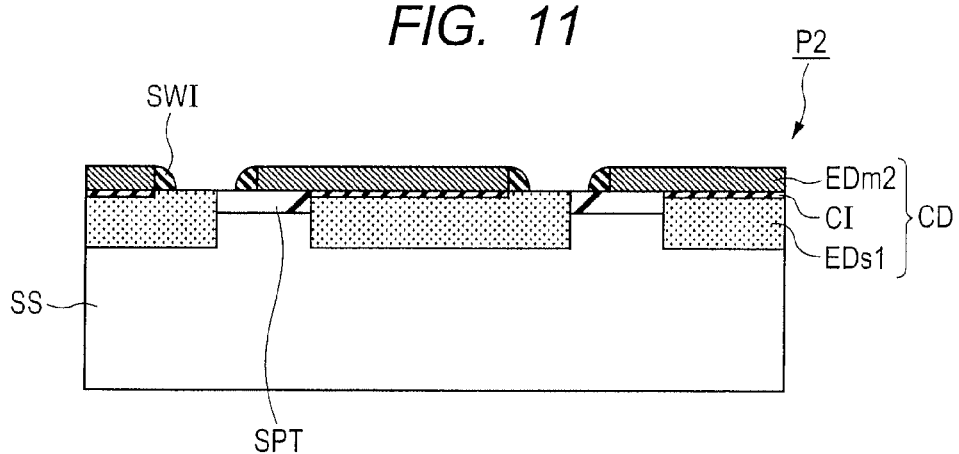

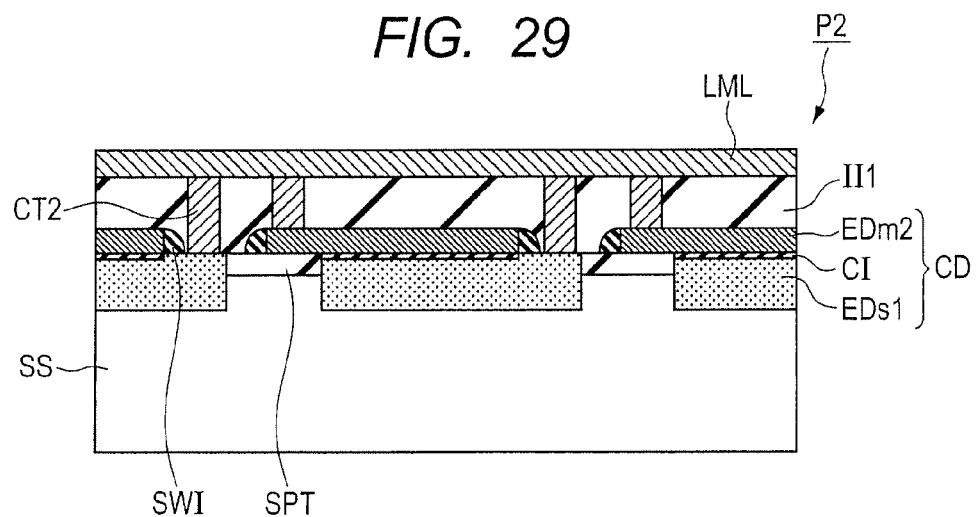
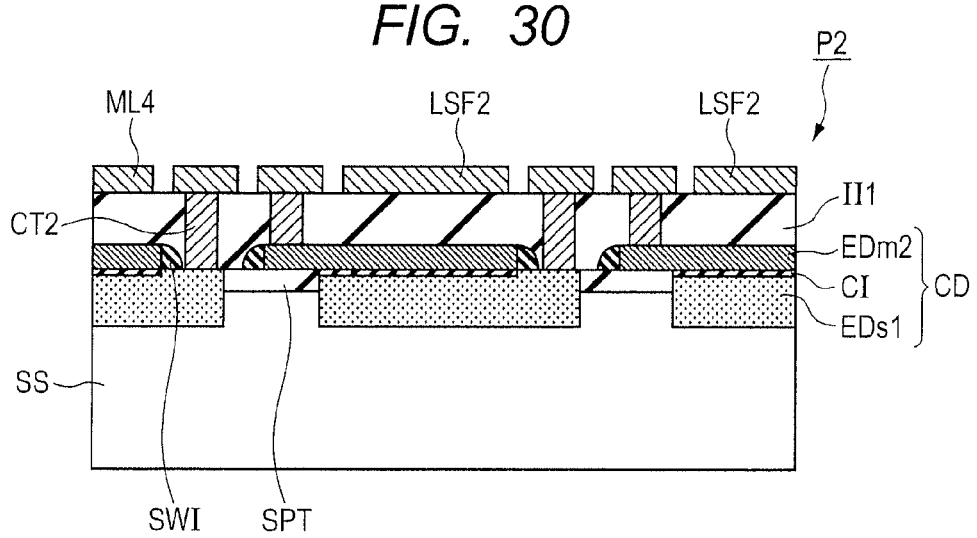

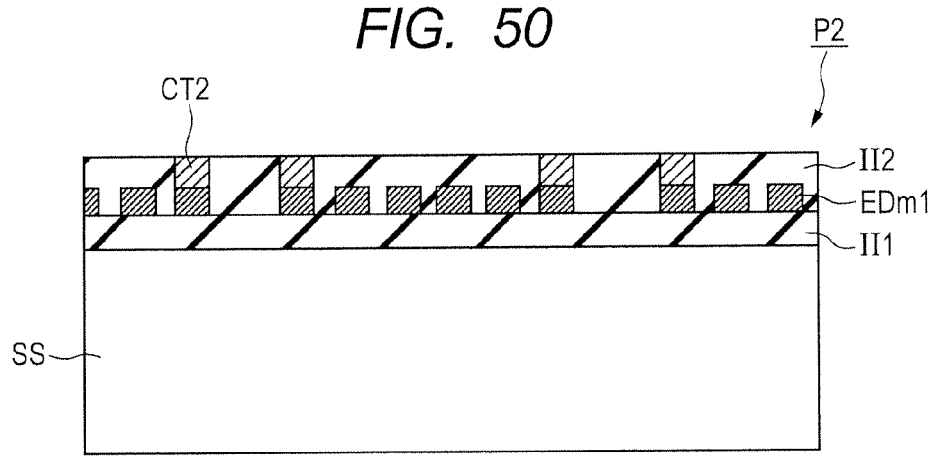
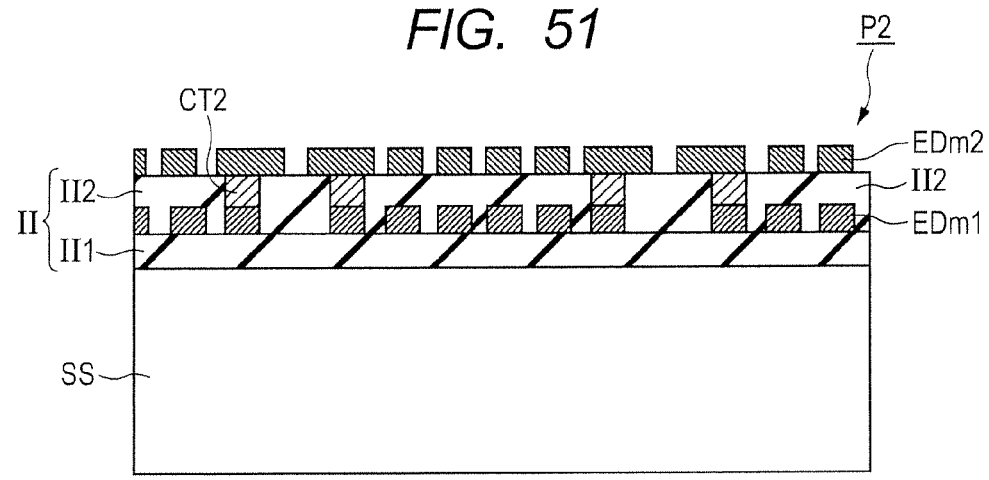

LIGHT RECEIVING ELEMENTS FOR PHOTOELECTRIC CONVERSION AND CAPACITOR ELEMENTS FOR CHARGE STORING IN JOINED SUBSTRATES

CROSS-REFERENCE TO RELATED APPLICATIONS

This application is a Divisional Patent Application of U.S. patent application Ser. No. 14/464,423, filed on Aug. 20, 2014, which in turn claims the benefit of Japanese Patent Application No. 2013-171334, filed on Aug. 21, 2013 including the specification, drawings and abstract are incorporated herein by reference in their entireties.

BACKGROUND

The present invention relates to a semiconductor device and a manufacturing method thereof, and particularly to a solid-state image sensing element having a so-called backside-reflection light receiving element and a manufacturing method thereof.

A solid-state image sensing element is a semiconductor device in which, over a front surface of a semiconductor substrate, electrodes, interconnects, and a light receiving element such as a photodiode are formed. The solid-state image sensing element typically has a so-called frontside-illuminated structure in which the light receiving element is illuminated with light for photoelectric conversion which is applied thereto from above (the front side thereof).

However, since the frontside-illuminated light receiving element is illuminated with the light applied thereto from above the metal interconnects formed above the light receiving element, a problem arises in that a part of the light is reflected by the metal interconnects or the like and the light does not efficiently reach the light receiving element. To solve the problem, a solid-state image sensing element having a so-called backside-illuminated structure has been developed in which a light receiving element is illuminated with light for photoelectric conversion which is applied thereto from below (from the back side thereof). A solid-state image sensing element having a backside-illuminated structure is described in, e.g., Patent Document 1.

Patent Document 1 shows the solid-state image sensing element as a CMOS (Complementary Metal Oxide Semiconductor) image sensor particularly having a global electronic shutter function. In the solid-state image sensing element as the CMOS image sensor having the global electronic shutter function, light simultaneously supplied to individual light receiving elements is simultaneously converted to signal charges by photoelectric conversion and stored in capacitor elements coupled to the individual light receiving elements. Since the charges including the signals simultaneous with each other are stored in the capacitor elements, when the signal charges are successively read, distortion of an image resulting from a time lag can be inhibited.

In Patent Document 1, a first substrate formed with the light receiving elements and a second substrate formed with the capacitor elements are joined together at a junction surface so that the capacitor elements are placed so as to overlap the light receiving elements (pixels including the light receiving elements) in planar view. Accordingly, by receiving light from the light receiving element side, it is possible to implement the backside illumination described above and also inhibit a reduction in the area of the region where the light receiving elements are placed due to the capacitor elements occupying the surface area of the substrate. This allows a high-performance solid-state image sensing element to be formed in which the light receiving elements occupy a large area part of the surface area of the substrate.

Besides, in a solid-state image sensing element having, e.g., so-called wide dynamic range performance also, signal charges are stored in capacitor elements coupled to individual light receiving elements. Specifically, the solid-state image sensing element is provided with the capacitor elements having the function of temporarily storing and keeping therein signal charges such as electrons stored in the light receiving elements or electrons generated in excess of the saturation charge capacity of each of the light receiving elements in the light receiving element and a floating diffusion layer capacitor associated therewith.

If the light supplied to the light receiving elements illuminates the capacitor elements storing therein the signal charges, the signal charges stored in the capacitor elements may leak out of the capacitor elements. For example, if the signal charges stored by the global electronic shutter function leak out of the capacitor elements prior to a read operation, correct image signals cannot be read during the read operation. Therefore, a light blocking film for inhibiting the foregoing illumination with light is preferably placed for the capacitor elements.

A solid-state image sensing element having a configuration in which the incidence of light on capacitor elements is inhibited by providing a light blocking film above capacitor elements is disclosed in, e.g., Patent Document 2. Patent Document 2 discloses the capacitor elements storing therein signal charges for outputting dark currents from effective pixels in a state where light is prevented from being incident on the effective pixels.

Thus, a solid-state image sensing element as a CMOS image sensor is mostly provided with capacitor elements for temporarily storing signal charges supplied from light receiving elements.

RELATED ART DOCUMENTS

Patent Documents

[Patent Document 1]
  Japanese Unexamined Patent Publication No. 2011-166171
[Patent Document 2]
  Japanese Unexamined Patent Publication No. 2011-228621

SUMMARY

In Patent Document 1, at the junction surface at which the first substrate having the light receiving elements and the second substrate having the capacitor elements are joined together, one of the electrodes of each of the capacitor elements is formed. Accordingly, if a stress for joining together the first and second substrates at the junction surface is applied to the electrode of the capacitor element and deforms the electrode, the light unintentionally travels toward the capacitor element storing therein the signal charges to possibly cause a phenomenon in which the signal charges in the capacitor element leak out of the capacitor element.

In addition, in Patent Document, the area of each of the capacitor elements is increased to increase the number of charges that can be stored in the capacitor element. As a result, at the surface at which the electrodes of the capacitor elements are formed, the ratio of the area of gap portions as regions other than the regions where the electrodes are formed is reduced.

In Patent Document 1, one of the electrodes of each of the capacitor elements is formed at the junction surface so that the electrode is directly electrically coupled to an electrode portion formed in the first substrate having the light receiving elements. Since the area of the electrodes is large and the area of the gap portions is small at the junction surface, the amount of misalignment tolerated during alignment when the electrode portions of the first and second substrates are coupled to each other is reduced. Accordingly, high precision is required during the alignment to possibly reduce machining efficiency.

Also, in Patent Document 1, when the foregoing second substrate is formed, metal interconnect layers are formed and then the capacitor elements are formed above the interconnect layers. Accordingly, the capacitor elements need to be formed of a material which can be formed at a temperature of not more than the temperature at which the interconnect layers as metal layers are formed. That is, when the interconnect layers are metal layers, the electrodes forming the capacitor elements also need to be formed of, e.g., metal layers. This reduces the number of types of materials which can be chosen to particularly form the electrodes of the capacitor elements. That is, by joining together the two substrates, it is possible to form a configuration in which, e.g., a member formed at a high temperature is located above a member formed at a low temperature, but this advantage has not been utilized in Patent Document 1.

Patent Document 2 discloses neither a solid-state image sensing element having a backside-illuminated structure nor a technique which joins together a substrate formed with light receiving elements and a substrate formed with the capacitor elements.

Other problems and novel features of the present invention will become apparent from a statement in the present specification and the accompanying drawings.

In a semiconductor device according to an embodiment, a first substrate including light receiving elements and a second substrate including capacitor elements are joined to each other at a junction surface. The capacitor elements are at positions away from a surface of the second substrate corresponding to the junction surface. The first substrate includes a light-receiving-element-side light blocking film which blocks light supplied to each of the light receiving elements. The light-receiving-element-side light blocking film is placed so as to overlap a gap portion between a plurality of coupling portions placed so as to electrically couple the first substrate and the second substrate to each other in a direction perpendicular to the junction surface.

In a semiconductor device according to another embodiment, a first substrate including light receiving elements and a second substrate including capacitor elements are joined to each other at a junction surface. The capacitor elements are at positions away from a surface of the second substrate corresponding to the junction surface. The semiconductor device includes a light-receiving-element-side light blocking film which is provided between the light receiving elements and the capacitor elements so as to overlap the light receiving elements in a direction perpendicular to the junction surface and block light traveling from each of the light receiving elements toward the second substrate.

In a method of manufacturing a semiconductor device according to still another embodiment, a first substrate including light receiving elements is provided and a second substrate including capacitor elements is provided. The first substrate and the second substrate are electrically joined together. In the step of providing the first substrate, first coupling portions are formed at a junction surface with the second substrate. In the step of providing the second substrate, second coupling portions are formed at the junction surface with the first substrate. In the joining step, a surface of the first substrate corresponding to the junction surface and a surface of the second substrate corresponding to the junction surface are joined together so as to bring the first coupling portions and the second coupling portions into contact with each other. The capacitor elements formed in the second substrate are at positions away from the surface of the second substrate corresponding to the junction surface.

In each of the semiconductor devices according to the embodiment and the other embodiment, the light-receiving-element-side light blocking film or the capacitor-element-side light blocking film reliably inhibits the illumination of the capacitor elements with light. This inhibits leakage of the charges stored in the capacitor elements. The effect is further enhanced by the positions of the capacitor elements which are away from the junction surface between the substrates.

In the method of manufacturing the semiconductor device according to the still other embodiment, the capacitor elements are formed and then a second interconnect layer is formed over the capacitor elements. This allows the capacitor elements to be formed by a process which performs processing at a higher temperature. Therefore, it is possible to widen the range of choices of the material forming the capacitor elements and improve the reliability of the capacitor elements.

BRIEF DESCRIPTION OF THE DRAWINGS

FIG. 6A is a schematic plan view for defining the size of one of the pixels in planar view, FIG. 6B is a schematic plan view showing a first example of a layout of first and second coupling portions, and FIG. 6C is a schematic plan view showing a second example of the layout of the first and second coupling portions;

FIG. 10 is a schematic cross-sectional view showing a fourth step of the manufacturing method of the semiconductor device in Embodiment 1;

FIG. 11 is a schematic cross-sectional view showing a fifth step of the manufacturing method of the semiconductor device in Embodiment 1;

FIG. 29 is a schematic cross-sectional view showing a first step of a manufacturing method of the semiconductor device in Embodiment 2;

FIG. 30 is a schematic cross-sectional view showing a second step of the manufacturing method of the semiconductor device in Embodiment 2;

FIG. 50 is a schematic cross-sectional view showing a second step of the manufacturing method of the semiconductor device in the second example of Embodiment 5;

FIG. 51 is a schematic cross-sectional view showing a third step of the manufacturing method of the semiconductor device in the second example of Embodiment 5;

DETAILED DESCRIPTION

A description will be given below of embodiments on the basis of the drawings.

Embodiment 1

Figure 1:
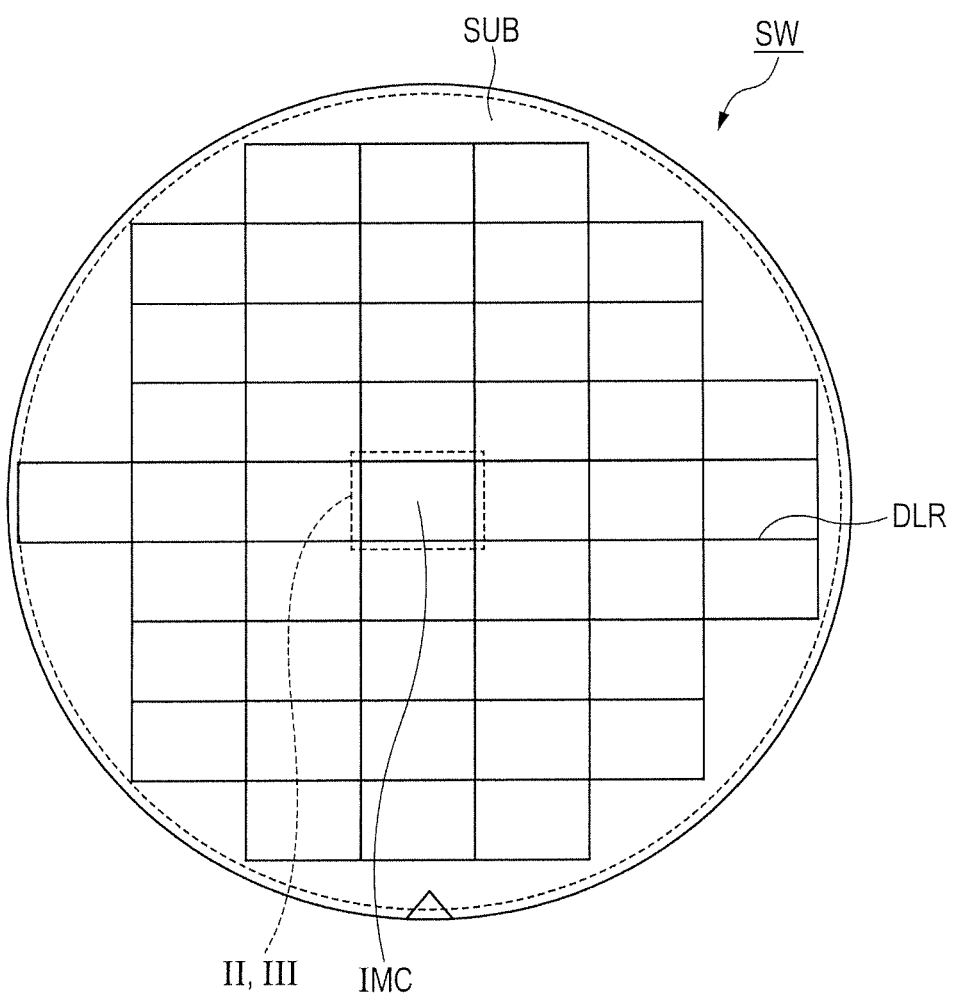
FIG. 1 is a schematic plan view showing the state of a semiconductor device of an embodiment of the present invention in the form of a wafer.

Referring to FIG. 1, a semiconductor device in the present embodiment is formed in a semiconductor wafer SW. In the semiconductor wafer SW, a plurality of chip regions IMC for image sensors are formed. The chip regions IMC each having a rectangular two-dimensional shape are arranged in the form of a matrix. The semiconductor wafer SW is subjected to dicing at dicing line regions DLR to be cut into the individual chip regions IMC each having, e.g., a rectangular two-dimensional shape.

Figure 2:
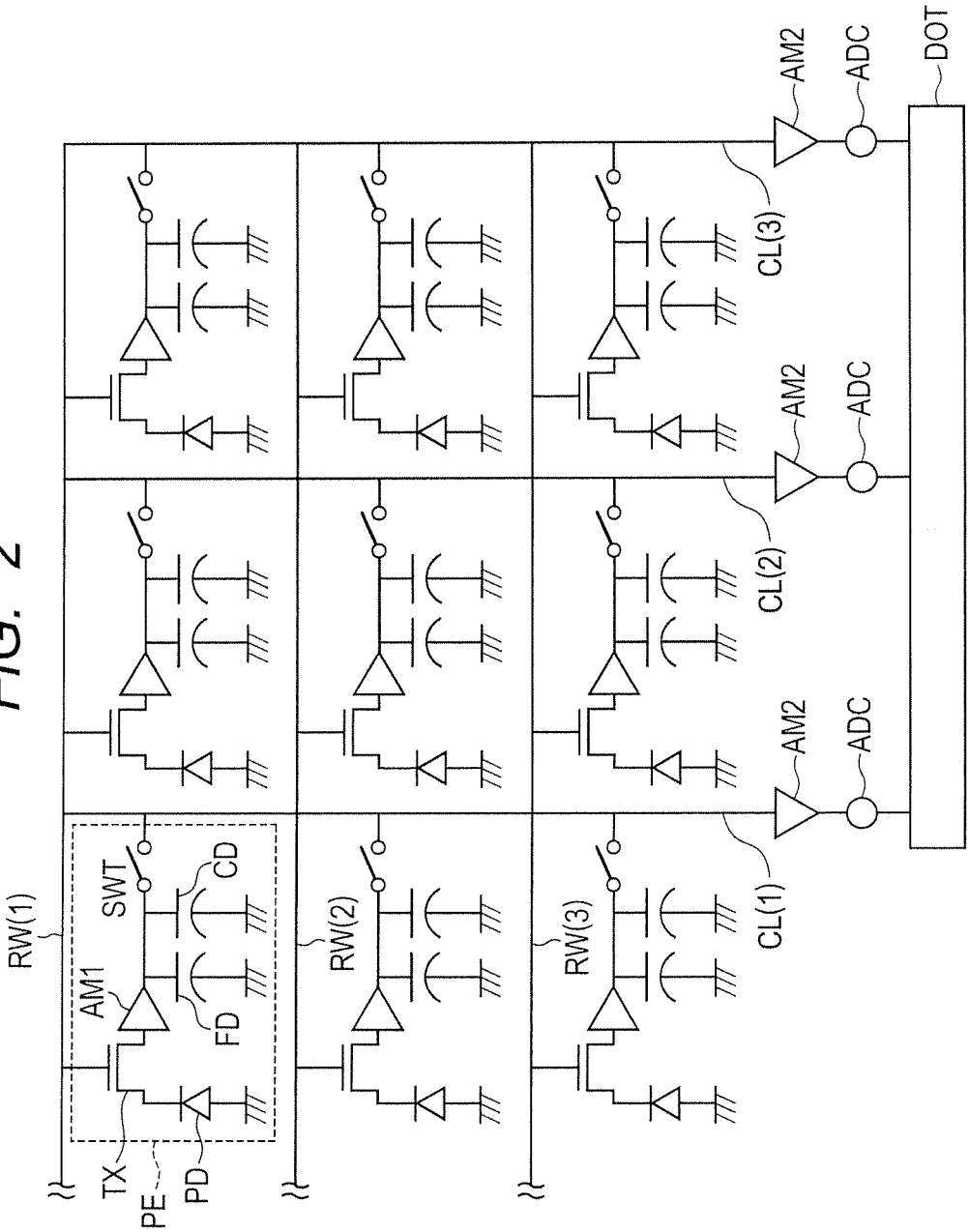
FIG. 2 is a circuit diagram showing a partial configuration of a solid-state image sensing element as the semiconductor device of the embodiment.

Referring to FIG. 2, in each of the plurality of chip regions IMC corresponding to regions II and Ill enclosed in the dotted square in FIG. 1, a solid-state image sensing element including a plurality of pixels PE and having the global electronic shutter function or wide dynamic range performance described above is formed. Each of the pixels PE has a photodiode PD as a light receiving element which performs photoelectric conversion, a transfer transistor TX which transfers an electric signal (charges) resulting from the conversion by the photodiode PD, an amplifier AM1 which amplifies the electric signal resulting from the conversion by the photodiode PD, and a capacitor region referred to as a floating diffusion FD which stores therein the charges transferred from the transfer transistor TX. The foregoing pixel PE further has a capacitor element CD other than the floating diffusion FD.

When the solid-state image sensing element has the global electronic shutter function, the capacitor elements CD are used to store the signals included in the charges simultaneously supplied from all the photodiodes PD. When the solid-state image sensing element has the wide dynamic range performance, the capacitor elements CD are used to store charges excessively supplied from the photodiodes PD to the floating diffusions FD.

Figure 3:
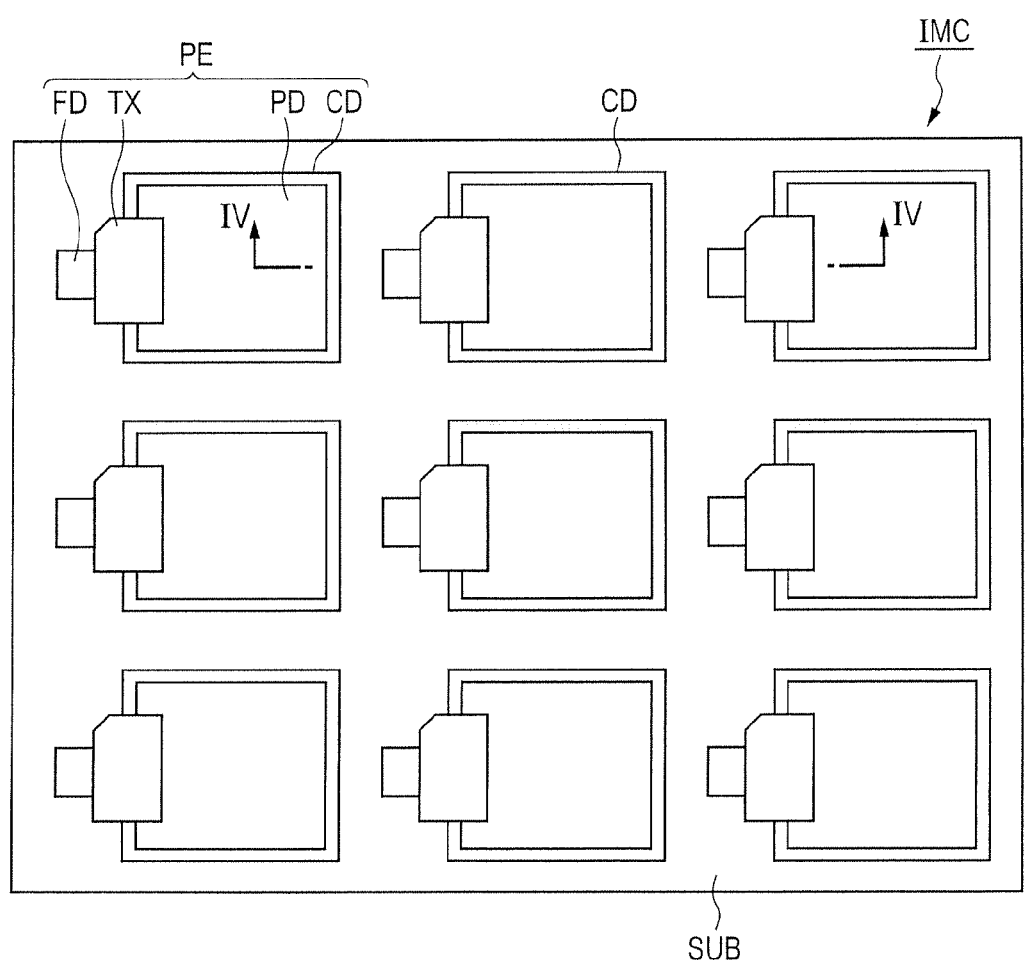
FIG. 3 is a schematic plan view particularly showing a configuration of a pixel in the solid-state image sensing element shown in the circuit diagram of FIG. 2.

Referring to FIG. 2 and FIG. 3 showing a specific two-dimensional structure of the circuit diagram of FIG. 2, the plurality of pixels PE are arranged in the form of a matrix of rows and columns over each of the chip regions IMC. Particularly referring to FIG. 2, when it is assumed that a lateral direction in the drawing is a row direction and a vertical direction therein is a column direction, the gate electrodes of the plurality of transfer transistors TX are electrically coupled to row signal lines RW(1), RW(2), and RW(3) each coupled to, e.g., a row decoder the illustration of which is omitted. The source region of each of the foregoing transfer transistors TX is coupled so as to generally correspond to the photodiode PD. The drain region of the transfer transistor TX is coupled so as to generally correspond to the floating diffusion FD and the capacitor element CD other than the floating diffusion FD.

Note that, in FIG. 2, the floating diffusion FD and the capacitor element CD are coupled to the downstream side of the amplifier AM1. However, the floating diffusion FD and the capacitor element CD may also be coupled to the upstream side of the amplifier AM1.

Column signal lines CL(1), CL(2), and CL(3) are coupled so as to be substantially orthogonal to the row signal lines RW(1) to RW(3). The column signal lines CL(1) to CL(3) are coupled to a digital signal output section DOT via a column amplifier AM2 and an A/D converter ADC.

To the downstream side of the drain region of each of the foregoing transfer transistors TX, a switch SWT is coupled. Of the signals (signals representing voltages or the like when the signals included in the charges are converted to electrical signals representing the voltages or the like) representing the charges output from the photodiodes PD of each of the pixels, only the signal from the pixel PE selected by the switch SWT passes through the column signals lines CL(1) to CL(3) to be amplified by the column amplifier AM2. Then, the signal passes through the A/D converter ADC to be output as a digital signal from the digital signal output section DOT.

In FIGS. 2 and 3, the chip region IMC as the solid-state image sensing element is shown in which the pixels PE (photodiodes PD) are arranged in the form of a matrix of lateral three rows and vertical three rows, but the arrangement is only exemplary. The number of the pixels PE (photodiodes PD) arranged in the solid-state image sensing element is arbitrary.

Figure 4:
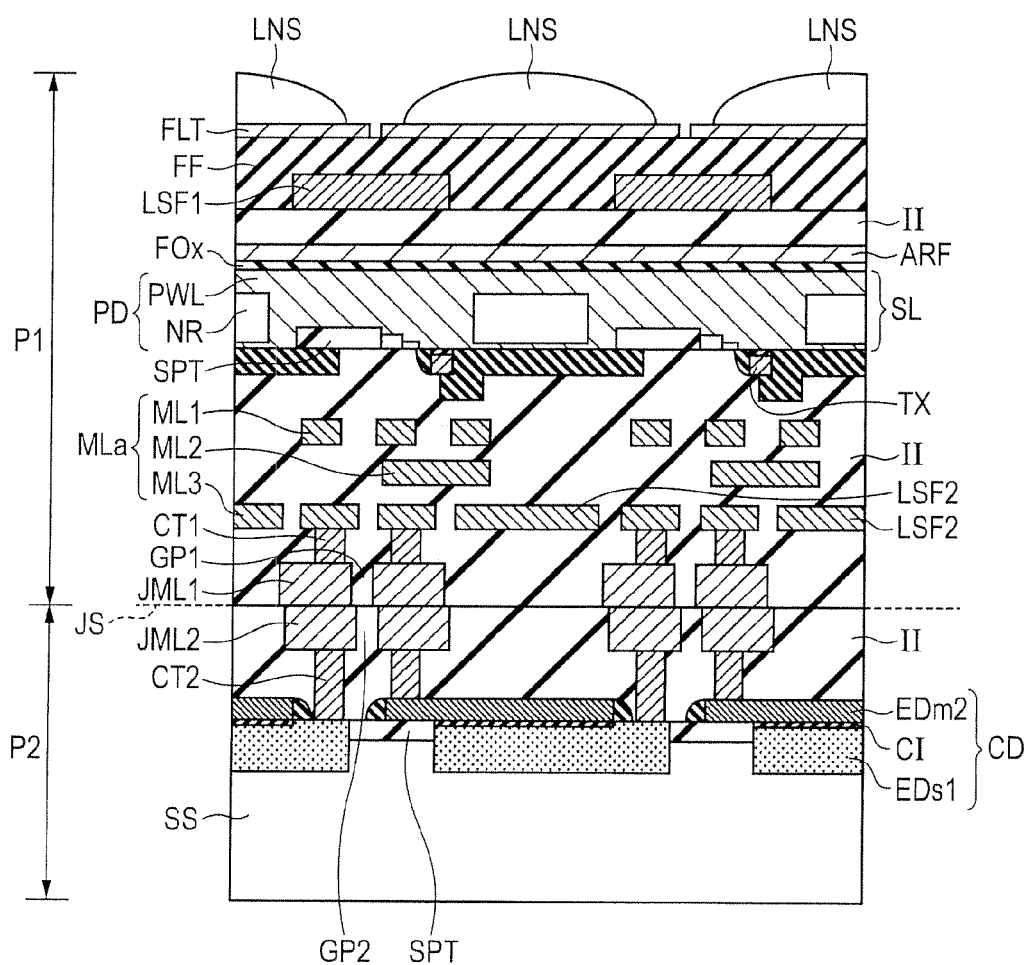
FIG. 4 is a schematic cross-sectional view showing a configuration of the portion of the semiconductor device in Embodiment 1 along the line IV-IV in FIG. 3.
Figure 5:
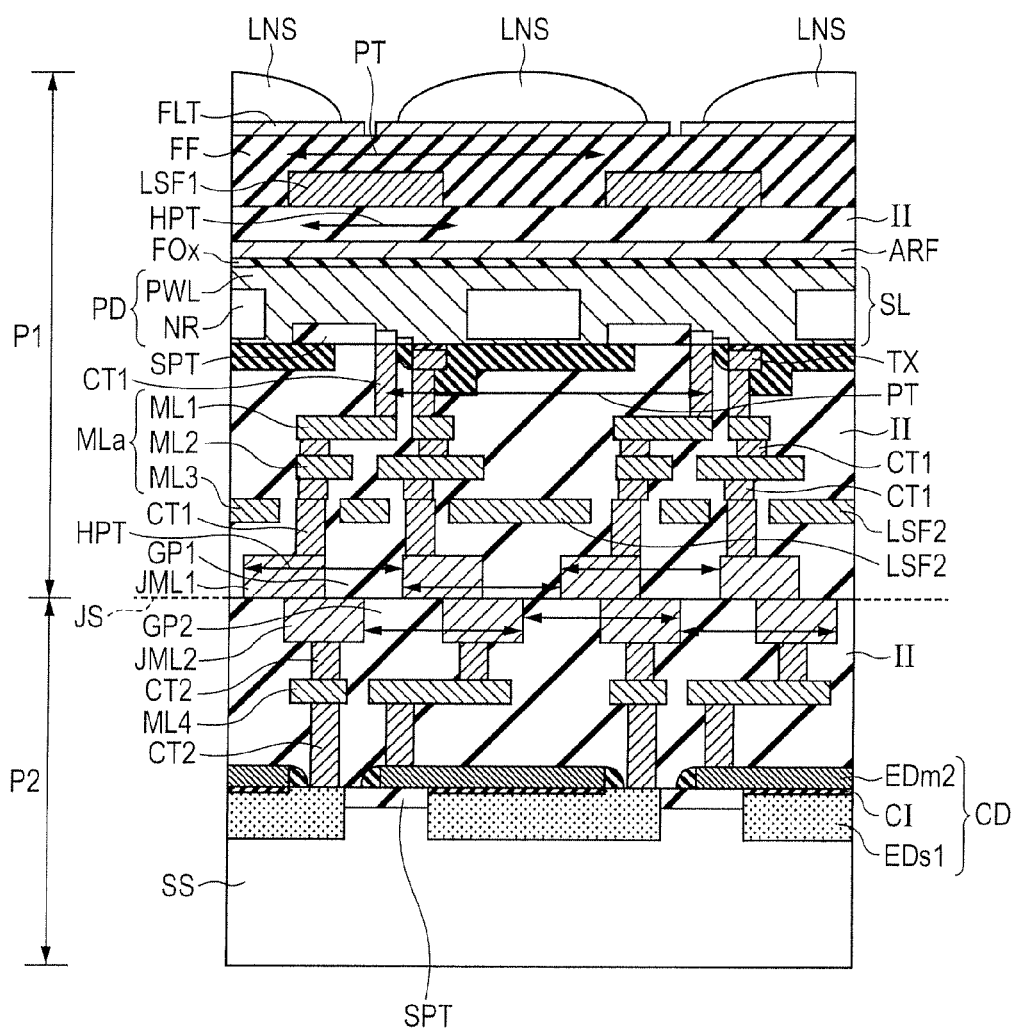
FIG. 5 is a schematic cross-sectional view for defining a pixel pitch and a half pitch in FIG. 4.

Referring to FIGS. 4 and 5, a detailed description will be given of a configuration of each of the pixels PE including components omitted in FIG. 3.

Referring to FIG. 4, the semiconductor wafer SW forming the chip regions IMC configures a substrate in which the first substrate P1 and the second substrate P2 are integrated by being joined together at a junction surface JS corresponding to each of the uppermost surfaces thereof.

Specifically, the first substrate P1 is a region located above the junction surface JS in FIG. 4 and has a semiconductor layer SL made of, e.g., silicon. In the semiconductor layer SL, the plurality of (e.g., three in FIG. 4) photodiodes PD are formed to form the main portions of the plurality of pixels PE.

On the other hand, the second substrate P2 is a region located below the junction surface JS in FIG. 4 and has a supporting substrate SS made of, e.g., silicon. Over the supporting substrate SS, the capacitor elements CD are formed. Each of the capacitor elements CD may also include a part of the inner portion of the supporting substrate SS. In FIG. 4 a part of each of first electrodes EDs1 forming the capacitor elements CD is formed in the supporting substrate SS. The capacitor elements CD are formed at positions in the second substrate PS away from the junction surface JS (below the junction surface JS in FIG. 4).

As a result of the joining together of the first substrate P1 and the second substrate P2, particularly the photodiodes PD of the pixels PE formed in the first substrate P1 and the capacitor elements CD thereof formed in the second substrate P2 are placed so as to be opposed to each other in a direction (vertical direction in the drawing) perpendicular to the junction surface JS. In other words, since the first substrate P1 and the second substrate P2 are joined together at the junction surface JS, each of the pixels PE has such a configuration in which the capacitor element CD is stacked over the photodiode PD.

Next, a more detailed description will be given of a configuration of the first substrate P1. The description will be given first of the configuration on the back side (upper side) of the semiconductor layer SL.

In the first substrate P1, over the main surface of the semiconductor layer SL formed with the photodiodes PD on the back side thereof (side of the photodiodes PD opposite to the side thereof where the second substrate P2 is located, i.e., the upper side in FIG. 4), a thin silicon oxide film FOx, an antireflection film ARF, and an interlayer insulating film II are stacked in this order.

Each of the interlayer insulating film II and the thin silicon oxide film FOx is formed of a silicon oxide film and the antireflection film ARF is formed so as to be interposed therebetween. The antireflection film ARF is formed of a material having a refractive index of a value between the refractive index of a silicon single crystal and the refractive index of the silicon oxide film.

For example, if the antireflection film ARF is not placed, due to the refractive index difference between each of the interlayer insulating film II and the thin silicon oxide film FOx (silicon oxide film) and the semiconductor layer SL (silicon single crystal) located thereunder, light incident on the region is reflected at a high ratio. However, by providing the antireflection film formed of a material having a refractive index of a value between the refractive index of the silicon oxide film and the refractive index of a silicon single crystal, such as a silicon nitride film, the ratio of the reflection mentioned above can be reduced. This allows desired light to be more efficiently incident on the photodiodes PD.

On the back side (upper side) of the interlayer insulating film II, a planarization layer FF and a first light blocking film LSF1 are stacked. In the same layer as the planarization layer FF, the first light blocking film LSF1 as a light-receiving-element-side light blocking film is formed in some regions in a direction (direction along the junction surface JS) along the main surface of the semiconductor layer SL. Note that, here, a "light-supply side" means the upper side in FIG. 4 where light for photoelectric conversion is supplied to the photodiodes PD.

From the upper side in FIG. 4 toward the photodiodes PD, the light for photoelectric conversion is supplied (applied for illumination). The first light blocking film LSF1 is placed on the side where light is supplied to the photodiodes PD (i.e., the upper side in FIG. 4). The photodiodes PD are formed from the main surface of the semiconductor layer SL on the front side thereof (side of the photodiodes PD where the substrate P2 is located, i.e., the lower side in FIG. 4) into the semiconductor layer SL to be spaced apart from each other in the direction along the main surface of the semiconductor layer SL. Between a pair of the photodiodes PD adjacent to each other in the direction along the main surface of the semiconductor layer SL, isolation insulating films SPT are formed to provide electrical insulation between the pixels adjacent to each other and including the pair of photodiodes PD adjacent to each other.

If the first light blocking film LSF1 located on the back side (upper side) of the photodiodes PD is placed at positions overlapping the photodiodes PD in planar view, it is difficult to supply light to the photodiodes PD from above. Accordingly, the first light blocking film LSF1 is preferably formed in a region which is interposed between the pair of photodiodes PD adjacent to each other and in which the photodiode PD is not formed in planar view, and preferably has openings in the regions overlapping the photodiodes PD in planar view. In terms of inhibiting light from traveling toward the capacitor elements CD located on the front side (lower side) of the photodiodes PD, the region where the photodiode PD is not placed is preferably not illuminated with light applied to illuminate the photodiodes PD.

Thus, the first light blocking film LSF1 is formed so as to interrupt the travel of light toward the region particularly undesired to be illuminated with light where the capacitor element CD or the like is located. The first light blocking film LSF1 is formed of a thin film made of a material which shows a light blocking property to the light applied to illuminate the photodiodes PD, such as a thin film of, e.g., aluminum or tungsten.

The planarization layer FF is formed of, e.g., a coat type silicon oxide film such as, e.g., SOG (Spin On Glass). On the back side (upper side) of the planarization layer FF, color filters FLT each including a red filter, a green filter, and a blue filter are formed. On the back side (upper side) of the color filters FLT, on-chip lenses LNS (light receiving lenses) are formed. The color filters FLT and the on-chip lenses LNS each mentioned above are formed at positions substantially overlapping the photodiodes PD in planar view. The light incident on the on-chip lenses LNS passes through the on-chip lenses LNS to be supplied to the photodiodes PD.

Next, a description will be given of the configuration on the front side (lower side in FIG. 4) of the semiconductor layer SL. On a lateral side (left side in FIG. 4) of the photodiodes PD in the direction along the main surface of the semiconductor layer SL, a gate insulating film GI and a gate electrode TG of each of the transfer transistors TX are formed and a lower-concentration diffusion region LD and an n-type diffusion region ND are formed, as will be described later. Around the portions in which the lower-concentration diffusion region LD and the n-type diffusion region ND are formed, the floating diffusion FD in FIG. 3 is formed, though not clearly shown in FIG. 4.

On the front side (lower side) of the semiconductor layer SL, the interlayer insulating film II and first interconnect layers MLa are formed. The interlayer insulating film II is formed of, e.g., a silicon oxide film. The interlayer insulating film II is formed such that a plurality of layers are stacked therein. The first interconnect layers MLa are formed so as to be interposed between the individual stacked layers (so as to be adjacent to the individual stacked layers in the interlayer insulating film II).

As each of the first interconnect layers MLa, three interconnect layers ML1, ML2, and ML3 are stacked in order of decreasing distance from the junction surface JS (in the descending order in the drawing), but the three interconnect layers are only exemplary. The number of the stacked interconnect layers is arbitrary. Each of the interconnect layers ML1, ML2, and ML3 is formed in a pattern of a plurality of thin films arranged to be spaced apart from each other in the direction along the main surface of the semiconductor layer SL. Consequently, in each of the regions in the same layers as the interconnect layers ML1, ML2, and ML3 where the interconnect layers are not placed, the interlayer insulating film II is placed.

Of the plurality of interconnect layers ML1 to ML3 forming the first interconnect layer MLa, the interconnect layers ML1 and ML2 closer to the photodiodes PD are not positively placed in the regions overlapping the photodiodes PD in the direction (vertical direction in the drawing) perpendicular to the junction surface JS. However, the interconnect layer ML3 most distant from the photodiodes PD is placed so as to overlap the photodiodes PD in the direction perpendicular to the junction surface JS.

The interconnect layers ML1 to ML3 each made of a generally known metal material block the light supplied to the photodiodes PD. In particular, a part of the interconnect layer ML3 in FIG. 4 functions as a second light blocking film LSF2 as a capacitor-element-side light blocking film which blocks light by interrupting the travel of the light that has passed through the photodiodes PD and the light that seems to travel so as to go around the periphery of each of the photodiodes PD and further travel from the photodiode PD toward the second substrate P2. It is assumed here that the charge-supply side means the lower side in the drawing since the charges generated by the photodiodes PD after photoelectrical conversion are supplied from the first interconnect layers MLa to the second substrate P2.

Similarly to the first light blocking film LSF1, the second light blocking film LSF2 is formed of a thin film of a material which shows a light blocking property to the light applied to illuminate the photodiodes PD such as a thin film of, e.g., aluminum or tungsten. Accordingly, each of the interconnect layers ML1 to ML3 forming the first interconnect layers MLa is also preferably formed of a thin film of, e.g., aluminum or tungsten (since the interconnect layer ML3 is identical to the second light blocking film LSF2).

The interlayer insulating film II is placed also under the interconnect layers ML3 in FIG. 4 and, in the same layer as that of the interlayer insulating film II, contacts CT1 and first coupling portions JML1 are formed.

The contacts CT1 are conductive portions which electrically couple the interconnect layers ML3 and the first coupling portions JML1 to each other and formed so as to extend through parts of the interlayer insulating film II in the vertical direction in the drawing. The contacts CT1 are preferably formed of a metal material such as tungsten.

The first coupling portions JML1 are in a pattern of conductive thin films for outputting the signals included in the signal charges generated from the photodiodes PD toward the second substrate P2. The first coupling portions JML1 are formed at the junction surface JS located on the frontmost side (lower side) of the first substrate P1. The first coupling portions JML1 are each formed of a generally known metal material (such as aluminum or tungsten) similar to that of the first interconnect layers MLa.

Next, a more detailed description will be given of a configuration of the second substrate P2. As described above, the second substrate P2 has the capacitor elements CD at positions away from the junction surface JS (on the front side (lower side) of the junction surface JS). Each of the capacitor elements CD has the first electrode EDs1, a dielectric layer CI, and a second electrode EDm2.

Each of the first electrodes EDs1 is formed in a part of the main surface of the supporting substrate SS on the back side (upper side) thereof. The first electrode EDs1 is placed in the supporting substrate SS. The first electrode EDs1 is a semiconductor region formed by implanting a conductive impurity into the supporting substrate SS and diffusing the conductive impurity therein. The dielectric layer CI is formed so as to cover at least a part (come in contact with a part) of the upper main surface of the first electrode EDs1. The second electrode EDm2 as a metal layer (of titanium nitride or the like) is formed so as to cover at least a part of the upper main surface of the dielectric layer CI. Thus, each of the capacitor elements CD in the present embodiment has a so-called MOS stacked structure. However, in the present embodiment, as the second electrode EDm2, a polysilicon layer which is a semiconductor layer containing a conductive impurity may also be used instead of the metal layer.

Each of the capacitor elements CD is placed in one-to-one correspondence to each of the pixels PE and at a position generally two-dimensionally overlapping the photodiode PD and the on-chip lens LNS. The plurality of capacitor elements CD are formed to be spaced apart from each other in the direction along the main surface of the supporting substrate SS (direction along the junction surface JS). Between a pair of the capacitor elements CD adjacent to each other in the direction along the main surface of the supporting substrate SS, the isolation insulating film SPT is formed to provide electrical insulation between the pair of capacitor elements CD adjacent to each other.

On the back side (upper side) of each of the supporting substrate SS and the capacitor elements CD, the interlayer insulating film II, contacts CT2, and second coupling portions JML2 are formed. Similarly to the interlayer insulating film II of the first substrate P1, the interlayer insulating film II of the second substrate P2 is formed of, e.g., a silicon oxide film. The second coupling portions JML2 are formed of a generally known metal film (such as aluminum or tungsten) similar to that of the first coupling portions JML1.

Each of the plurality of contacts CT2 that have been formed is placed so as to couple either the first electrode EDs1 or the second electrode EDm2 to the second coupling portion JML2. As a result, each of the first electrode EDs1 and the second electrode EDm2 is electrically coupled to the second coupling portion JML2. Similarly to the contacts CT1, the contacts CT2 are preferably formed of a metal material such as tungsten.

The second coupling portions JML2 are in a pattern of conductive thin films for inputting the signals included in the signal charges generated from the photodiodes PD from the first substrate P1. The second coupling portions JML2 are formed at the junction surface JS formed at the lowermost position in the first substrate P1. The second coupling portions JML are electrically coupled to the first coupling portions JML1 at the junction surface JS to provide electrical coupling between the first substrate P1 and the second substrate P2.

As described above, to inhibit the light applied to illuminate the photodiodes PD from traveling toward the capacitor elements CD, the solid-state image sensing element as the semiconductor device of the present embodiment has the first light blocking film LSF1 located at positions (on the back side) not two-dimensionally overlapping the photodiodes PD and the second light blocking film LSF2 located at positions (on the front side) two-dimensionally overlapping the photodiodes PD.

The plurality of first coupling portions JML1 are arranged at the junction surface JS of the first substrate P1 to be spaced apart from each other. Here, when attention is focused on first gap portions GP1 as the foregoing spaces formed in the regions other than the regions overlapping the photodiodes PD in planar view, the first gap portions GP1 are located so as to overlap the first light blocking film LSF1 in planar view. In other words, the first gap portions GP1 are located so as to overlap the first light blocking film LSF1 in the vertical direction in the drawing which is perpendicular to the junction surface JS.

Likewise, the plurality of second coupling portions JML2 are arranged at the junction surface JS to be spaced apart from each other. When attention is focused on second gap portions GP2 as the foregoing spaces formed in the regions other than the regions overlapping the photodiodes PD in planar view, the second gap portions GP2 are located so as to overlap the first light blocking film LSF1 in planar view. In other words, the second gap portions GP2 are located so as to overlap the first light blocking film LSF1 in the vertical direction in the drawing which is perpendicular to the junction surface JS.

On the other hand, the second light blocking film LSF2 is located between the photodiodes PD and the capacitor elements CD in the vertical direction in the drawing which is perpendicular to the junction surface JS so as to overlap at least parts of the photodiodes PD in planar view (in the direction perpendicular to the junction surface JS). However, as shown in FIG. 4, the second light blocking films LSF2 may also be located so as to completely overlap the photodiodes PD in the vertical direction in the drawing which is perpendicular to the junction surface JS.

When the first substrate P1 and the second substrate P2 are joined together, it is necessary to align the first substrate P1 and the second substrate P2 with each other so as to bring the first coupling portions JML1 and the second coupling portions JML2 opposed thereto into contact with each other. However, there is an amount of misalignment tolerated at this time. Referring to FIGS. 5 and 6, a description will be given thereof.

Referring to FIG. 5, in FIG. 4, the contacts CT1 coupling, e.g., the interconnect layers ML1 and the interconnect layers ML2 are omitted. However, in an actual situation, electrical coupling between the individual interconnect layers are provided by the contacts CT1 (each formed of a metal material such as tungsten in the same manner as described above). Paths for the signal charges from the transfer transistors TX and the floating diffusions FD not shown to the capacitor elements CD include the interconnect layers ML1 to ML4, the contacts CT1 and CT2, and the first and second coupling portions JML1 and JML2. Note that FIG. 5 is different from FIG. 4 in that the interconnect layers ML5 are formed in the second substrate P2 and in the layout of the interconnect layers ML1 to ML3. However, the configurations in FIGS. 4 and 5 are each exemplary and either of the configurations may be used.

As described using FIGS. 2 and 3, in the solid-state image sensing element in the present embodiment, the plurality of pixels PE are placed (in a grid pattern) so as to be arranged in rows and columns in planar view. That is, in units of pixel pitch PT shown by the arrow in FIG. 5, the configuration of the identical pixel PE is repeated in the direction along the junction surface JS.

It is assumed that, in the pixel pitch PT, the region where the photodiode PD is placed and the region where the photodiode PD is not placed are formed to have dimensions each corresponding to half the pixel pitch PT in the lateral direction in FIG. 5. Since junction portions at which the first coupling portions JML1 and the second coupling portions JML2 are joined together are coupled to the respective two electrodes of the capacitor elements CD, two junction portions are placed for each of the pixels. Accordingly, it is assumed that a pattern of the first coupling portions JML1 and the second junction portions JML2 for one pixel is formed to have a dimension (dimension corresponding to ¼ of the pixel pitch PT) corresponding to half the half pitch HPT in the lateral direction in FIG. 5.

In this case, the tolerated amount of misalignment between each of the first coupling portions JML1 and the second coupling portion JML2 to be joined thereto in the lateral direction in the drawing is ¼ of the pixel pitch PT.

In FIG. 5, the configuration has been studied by taking only the lateral direction (in one dimension) in the drawing into account. However, the same result is obtained in the case of two-dimensionally examining the configuration by viewing the pixels in two dimensions. Referring to FIG. 6A, when each of the pixels PE is viewed in two dimensions, each of the vertical and lateral dimensions thereof corresponds to the pixel pitch PT and the pixel PE has a square two-dimensional shape. It is assumed that nodes NOD (nodes for transmitting electric signals from the substrate P1 to the substrate P2) to which the first coupling portions JML1 are to be electrically coupled via the contacts CT1 in FIG. 5 are present at the positions in the drawing.

At this time, referring to FIG. 6B, in the first substrate P1, the first coupling portions JML are arranged such that the two first coupling portions JML1 present in each of the pixels PE have dimensions a and b in the lateral direction in the drawing each corresponding to ¼ of the pixel pitch PT and that the pair of first coupling portions JML1 adjacent to each other in the lateral direction in the drawing also have spacings c and d therebetween each corresponding to ¼ of the pixel pitch PT.

The direction (lateral direction in the drawing) of each of the foregoing dimensions a to d is the same as the lateral direction (direction of the pixel pitch PT or the like) in FIG. 5. By contrast, the vertical direction in FIG. 6B shows a depth direction in FIG. 5. Each of the first coupling portions JML1 has a dimension corresponding to ¾ of the pixel pitch PT in the vertical direction in the drawing and the first coupling portions JML1 are laid out such that each of dimensions e and f showing the spacings between the first coupling portions JML1 adjacent to each other corresponds to ¼ of the pixel pitch PT. Note that the second coupling portions JML2 formed in the second substrate P2 are also arranged so as to have the same layout as that of the first coupling portions JML1 in FIG. 6B, though not shown in the drawing. Each of the directions of the vectors of the dimensions c to f each showing the spacing between the first coupling portions JML1 is a direction along the direction in which the pixels PE are aligned in rows and columns in FIG. 6B.

In this case, since each of the dimensions c to f corresponds to ¼ of the pixel pitch, the amount of misalignment between each of the first coupling portions JML1 and the second coupling portion JML2 (to be coupled thereto) at the time of joining together the first substrate P1 and the second substrate P2 should be controlled to be less than ¼ of the pixel pitch. When the amount of misalignment is controlled to be less than ¼ of the pixel pitch, it is possible to prevent a problem such as a short circuit resulting from electrical coupling between, e.g., one of the first coupling portions JML1 and the second coupling portion JML2 to be coupled to another first coupling portion JML1 adjacent thereto.

Referring to FIG. 6C, the positions of the nodes NOD in the pixel PE are the same as those in FIG. 6B, but the shapes and dimensions of the first coupling portions JML1 are different from those in FIG. 6B. That is, each of the first coupling portions JML1 is placed so as to extend in a direction oblique to the directions in which the pixels PE are aligned in rows and columns. Here, the dimensions of the individual sides of the first coupling portion JML1 are a and b (a and b are equal).

In FIG. 6C, the vector of the shortest length of the first gap portion PG1 (see FIG. 4) between the pair of first coupling portions JML1 adjacent to each other in planar view and the vector of the shortest length of the second gap portion PG2 (see FIG. 4) between the pair of second coupling portions JML2 adjacent to each other in planar view extend in oblique directions in the drawing in the same manner as in the pattern of the first coupling portions JML1. That is, each of the dimensions c and d in FIG. 6C shows the shortest length of each of the foregoing gap portions and the vectors of the shortest distances extend in the directions oblique to the directions in which the pixels PE are aligned in rows and columns. Note that the directions of the vectors of the dimensions a to d are inclined 45° with respect to the vertical and lateral directions in which the pixels PE are aligned.

Here, the distance between the nodes NOD of the pair of coupling portions JML1 adjacent to each other in the direction of each of the foregoing dimensions a to d (oblique directions) is the square root of 2 times the distance between the nodes NOD of the pair of coupling portions JML1 adjacent to each other in each of the lateral direction and the vertical direction in the drawing. Accordingly, each of the dimensions a to d is the square root of ⅔ times the pixel pitch PT. Note that the second coupling portions JML2 formed in the second substrate P2 are also arranged so as to have the same layout as that of the first coupling portions JML1 in FIG. 6C.

Thus, if the coupling portions JML1 and JML2 are arranged in the directions (directions at 45°) oblique to the directions in which the pixels PE are aligned, even though the positions of the nodes NOD are the same, the tolerated amount of misalignment between the first coupling portion JML1 and the second coupling portion JML2 is larger (the square root of 2 times larger) than in the case where the coupling portions JML1 and JML2 are arranged to be located along the directions in which the pixels PE are aligned.

Next, using FIGS. 7 to 27, a description will be given of a manufacturing method of the solid-state image sensing element as a manufacturing method of the semiconductor device of the present embodiment.

Figure 7:
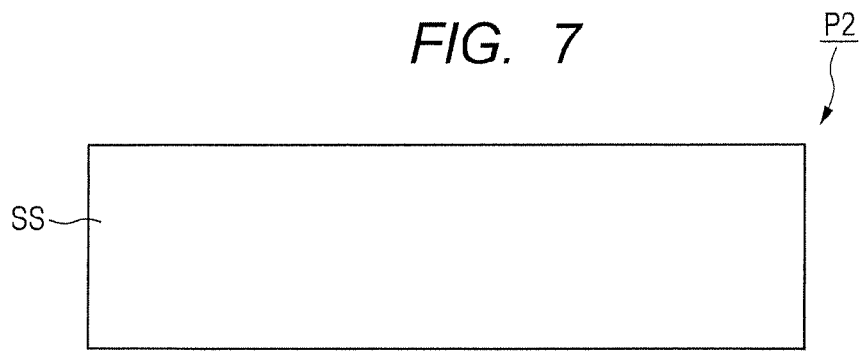
FIG. 7 is a schematic cross-sectional view showing a first step of a manufacturing method of the semiconductor device in Embodiment 1.

First, using FIGS. 7 to 15, a description will be given of a manufacturing method of the second substrate P2. Referring to FIG. 7, the supporting substrate SS made of, e.g., a silicon single crystal having an n-type impurity is provided first.

Figure 8:
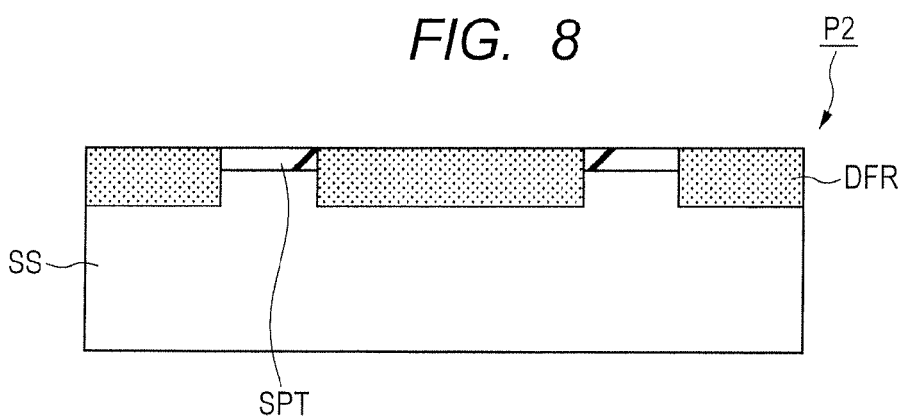
FIG. 8 is a schematic cross-sectional view showing a second step of the manufacturing method of the semiconductor device in Embodiment 1.

Referring to FIG. 8, in one of the main surfaces of the supporting substrate SS, the plurality of isolation insulating films SPT are formed to be spaced apart from each other. Each of the isolation insulating films SPT may be formed by, e.g., a so-called junction isolation method or a LOCOS (Local Oxidation of Silicon) method or may be a so-called STI (Shallow Trench Isolation).

After the isolation insulating films SPT are formed, a conductive impurity region for forming the first electrodes EDs1 is formed in the main surface of the supporting substrate SS. As a result, in the supporting substrate SS, the first electrodes EDs1 as semiconductor regions in which the conductive impurity is diffused are formed.

Specifically, using a typical ion implantation technique, a conductive impurity (such as boron) is implanted into desired inner regions (regions other than the regions in which the isolation insulating films SPT are formed in planar view) in the supporting substrate SS to form impurity diffusion regions DFR.

Figure 9:
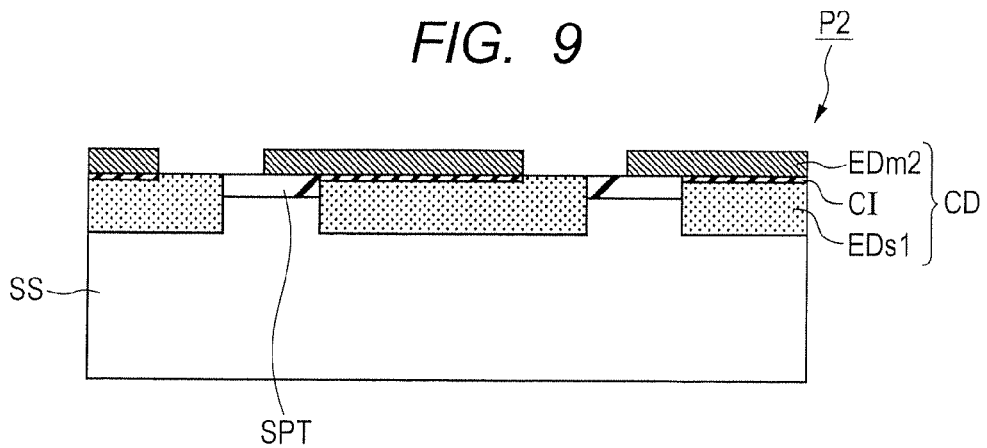
FIG. 9 is a schematic cross-sectional view showing a third step of the manufacturing method of the semiconductor device in Embodiment 1.

Referring to FIG. 9, the impurity diffusion regions DFR formed in the step of FIG. 8 are used as the first electrodes EDs1 forming the capacitor elements to be formed eventually. The insulating films CI each as a dielectric layer made of, e.g., a silicon oxide film are formed by, e.g., a typical thermal oxidation method so as to cover at least parts of the upper surfaces of the first electrodes EDs1. The insulating films CI may also be formed over the entire main surface of the supporting substrate SS including the portions in which the first electrodes EDs1 are formed or may be processed by, e.g., a typical photoengraving technique and etching so as to remain only in desired regions in planar view.

Next, using, e.g., a typical CVD method, a typical photoengraving technique, and etching, in desired regions in planar view, the second electrodes EDm2 each as a metal layer made of a generally known material such as titanium nitride are formed so as to cover at least parts of the upper surfaces of the insulating films CI formed so as to cover the upper surfaces of the first electrodes EDs1. However, in the present embodiment, as the second electrodes EDm2, polysilicon layers which are semiconductor layers each containing a conductive impurity may also be formed instead of the metal layers.

Referring to FIG. 10, by, e.g., a typical CVD method, an insulating film HI made of, e.g., a silicon nitride film is formed so as to cover the upper surface of the structure formed in the step of FIG. 9.

Referring to FIG. 11, by performing a typical etch-back process on the insulating film HI, sidewall insulating films SWI are formed so as to remain over the side walls of the second electrodes EDm2. Thus, the capacitor elements CD are formed in the supporting substrate SS.

Figure 12:
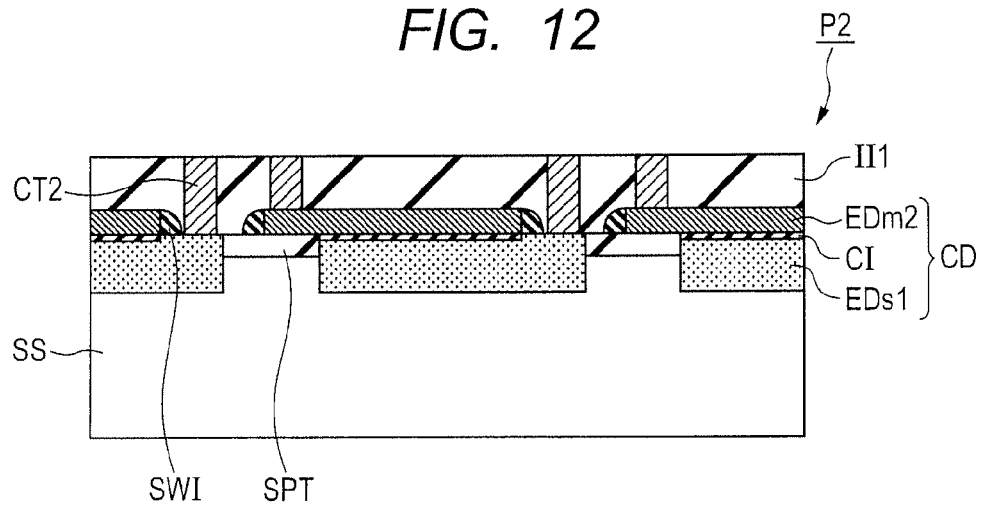
FIG. 12 is a schematic cross-sectional view showing a sixth step of the manufacturing method of the semiconductor device in Embodiment 1.

Referring to FIG. 12, by, e.g., a typical CVD method, the interlayer insulating film II1 made of, e.g., a silicon oxide film is formed so as to cover the upper surface of the structure formed in the step of FIG. 11. Preferably, in each of the following steps, the uppermost surface of the formed interlayer insulating film is polished by, e.g., CMP (Chemical Mechanical Polishing) so as to be planarized.

Through holes are formed so as to extend from the uppermost surface of the interlayer insulating film II1 in the downward direction in the drawing to respectively reach either the first electrodes EDs1 or the second electrodes EDs2 through the interlayer insulating film II1. A thin film of, e.g., tungsten is formed over the interlayer insulating film II1 by, e.g., a typical CVD method so as to be embedded in the through holes. By removing the thin film of tungsten over the interlayer insulating film II1 by CMP, the contacts CT2 each having a configuration in which the thin film of tungsten is formed in the through hole are formed.

Figure 13:
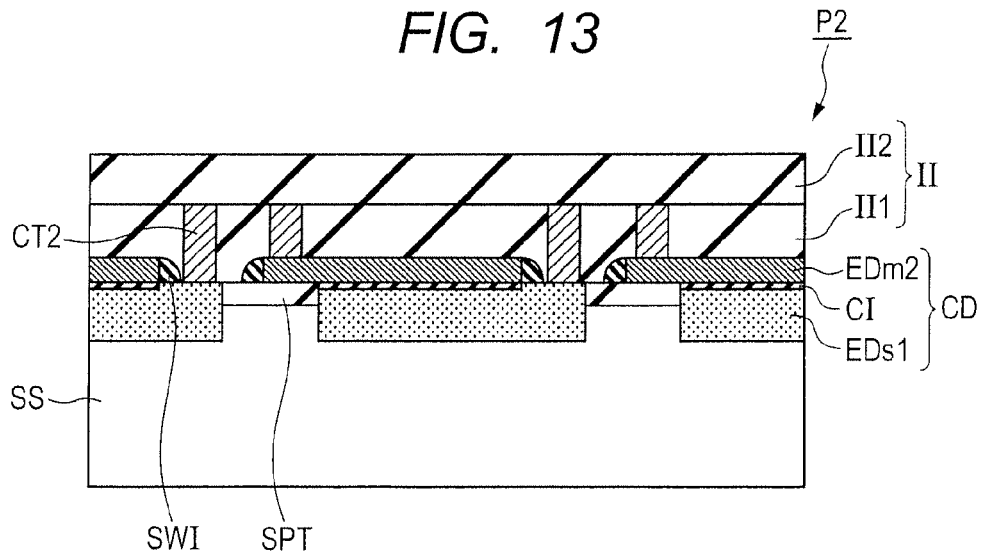
FIG. 13 is a schematic cross-sectional view showing a seventh step of the manufacturing method of the semiconductor device in Embodiment 1.

Referring to FIG. 13, an interlayer insulating film II2 made of, e.g., a silicon oxide film is formed by, e.g., a typical CVD method so as to cover the upper surfaces of the interlayer insulating film II1 and the contacts CT2.

Figure 14:
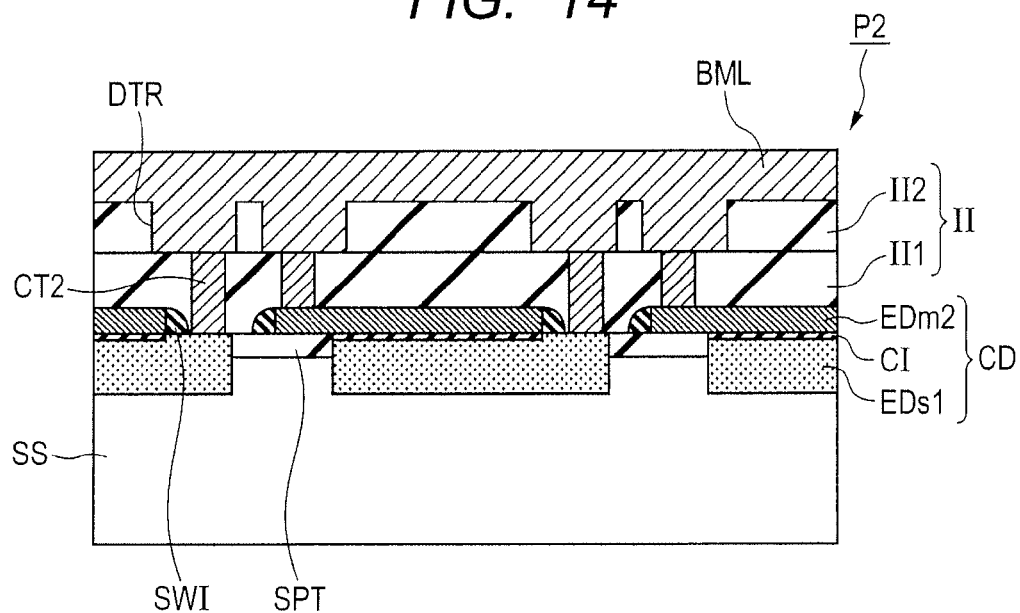
FIG. 14 is a schematic cross-sectional view showing an eighth step of the manufacturing method of the semiconductor device in Embodiment 1.

Referring to FIG. 14, by performing a typical photoengraving process and etching on the interlayer insulating film II2, a plurality of trench portions DTR are formed from the uppermost surface of the interlayer insulating film II2 to reach the upper surfaces of the contacts CT2. In other words, the trench portions DTR are formed so as to extend through the interlayer insulating film II2 from the uppermost surface thereof to the lowermost surface thereof. The plurality of trench portions DTR are formed to be spaced apart from each other in the lateral direction in the drawing.

Next, by, e.g., a typical sputtering method, a thin film of aluminum or tungsten is formed as an embedding metal film BML over the interlayer insulating film II2 so as to be embedded in each of the trench portions DTR.

Figure 15:
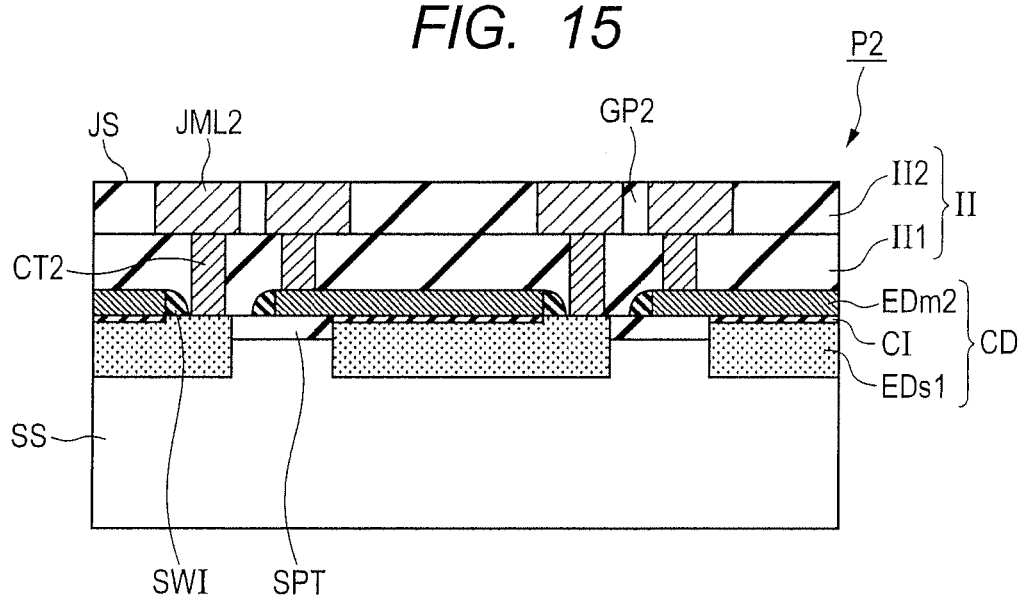
FIG. 15 is a schematic cross-sectional view showing a ninth step of the manufacturing method of the semiconductor device in Embodiment 1.

Referring to FIG. 15, the embedding metal film BML over the interlayer insulating film II2 is removed by CMP to form the second coupling portions JML2 each having a configuration in which the thin film of aluminum or tungsten is formed in the trench portion DTR.

A combination of the interlayer insulating films II1 and II2 formed in each of the foregoing steps corresponds to the interlayer insulating film II (second interlayer insulating film) shown in FIG. 4. Also, the uppermost surface of the interlayer insulating film II2 after planarized by, e.g., CMP serves as the junction surface JS between the second substrate P2 and the first substrate P1. That is, the second coupling portions JML2 are formed at the junction surface JS. Thus, the configuration shown in FIG. 4, i.e., the second substrate P2 having the capacitor elements CD storing therein the charges supplied from the photodiodes PD is formed.

Figure 16:
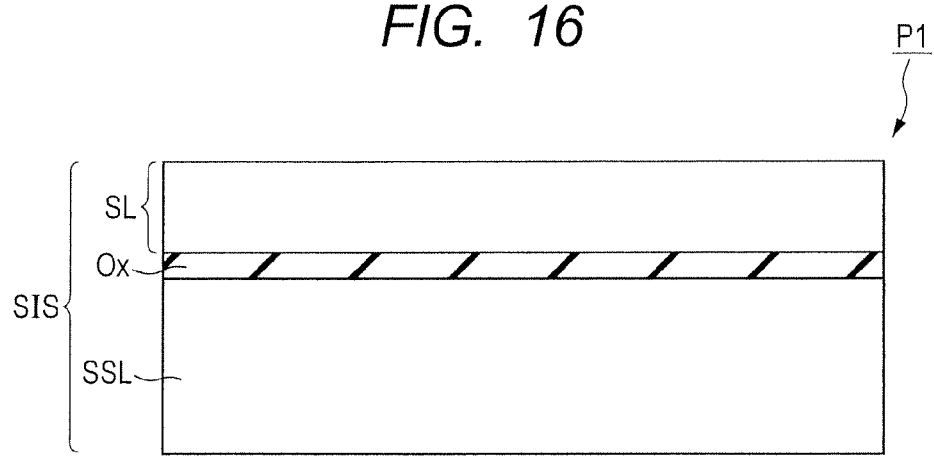
FIG. 16 is a schematic cross-sectional view showing a tenth step of the manufacturing method of the semiconductor device in Embodiment 1.

Next, using FIGS. 16 to 22, a description will be given of a manufacturing method of the second substrate P2. Referring to FIG. 16, a semiconductor substrate SIS is provided first. The semiconductor substrate SIS is formed such that an insulating film layer made of, e.g., a silicon oxide film is embedded in the semiconductor substrate SIS. That is, over one of the pair of main surfaces (upper and lower main surfaces in FIG. 16) of the insulating film layer Ox, the semiconductor layer SL made of a silicon single crystal is formed while, over the other main surface thereof, an underlying substrate SSL made of a silicon single crystal is formed. By way of example, it is assumed that the semiconductor layer SL and the underlying substrate SSL are each made of a silicon single crystal having an n-type impurity. Thus, the semiconductor substrate SIS as a so-called SOI (Silicon on Insulator) substrate is provided which has a structure in which the underlying substrate SSL, the insulating film Ox, and the semiconductor layer SL are stacked in this order.

Figure 17:
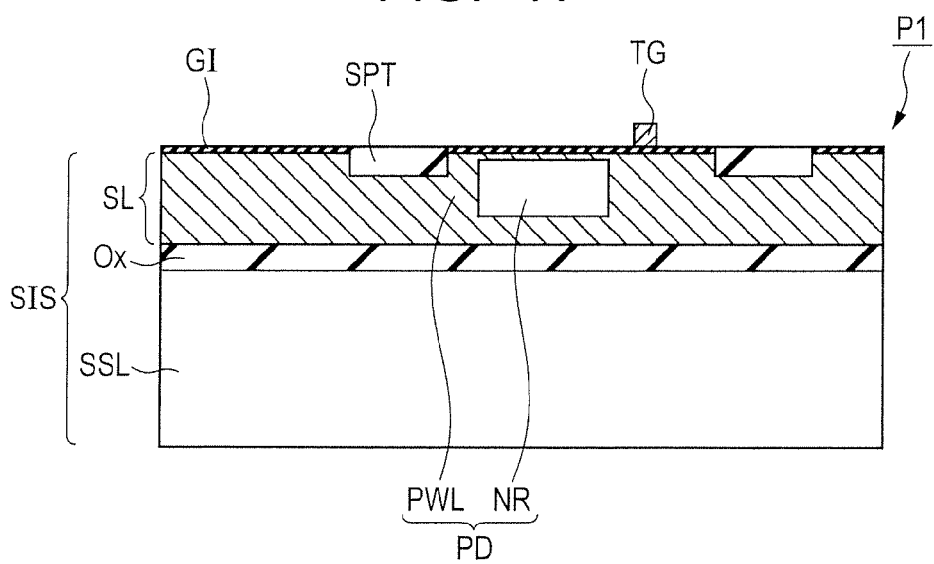
FIG. 17 is a schematic cross-sectional view showing an eleventh step of the manufacturing method of the semiconductor device in Embodiment 1.

Referring to FIG. 17, first, in the same manner as in the step of FIG. 8, the plurality of isolation insulating films SPT are formed to be spaced apart from each other in the main surface (upper surface) of the semiconductor layer SL opposite to the insulating film layer Ox. After the isolation insulating films SPT are formed, e.g., boron (B) or the like is implanted using a typical ion implantation technique into the semiconductor layer SL to form a p-type well region PWL. Note that the p-type well PWL may also be formed before the isolation insulating films SPT are formed. It may also be possible that, after the p-type well region PWL is formed, the isolation insulating films SPT are formed and then the p-type well region PWL is introduced again.

Next, to form an n-type region NR for each of the photodiodes PD, e.g., phosphorus (P) ions as an n-type impurity are introduced into the predetermined areas of the p-type well region PWL using a typical ion implantation technique. Thus, the (plurality of) photodiodes PD are formed in the semiconductor layer SL.

Next, by, e.g., a typical thermal oxidation method, the insulating film GI made of a silicon oxide film is formed over the main surface of the semiconductor layer SL opposite to the insulating film layer Ox.

Next, by, e.g., a CVD method, a thin film of, e.g., polysilicon is formed so as to cover the main surface of the semiconductor layer SL formed with the insulating film GI. Here, it is preferable to introduce, e.g., a phosphine ($PH_3$) gas and then perform a CVD process. As a result, a polysilicon layer containing an n-type impurity is formed. Note that, instead of the polysilicon layer, a so-called amorphous silicon film may also be formed. Alternatively, a method may also be used in which a polysilicon layer or an amorphous silicon film containing no impurity is formed and then the thin film is doped with an impurity using a typical ion implantation technique.

Thereafter, by a typical photoengraving technique and etching, the polysilicon layer is formed as the gate electrode TG.

Figure 18:
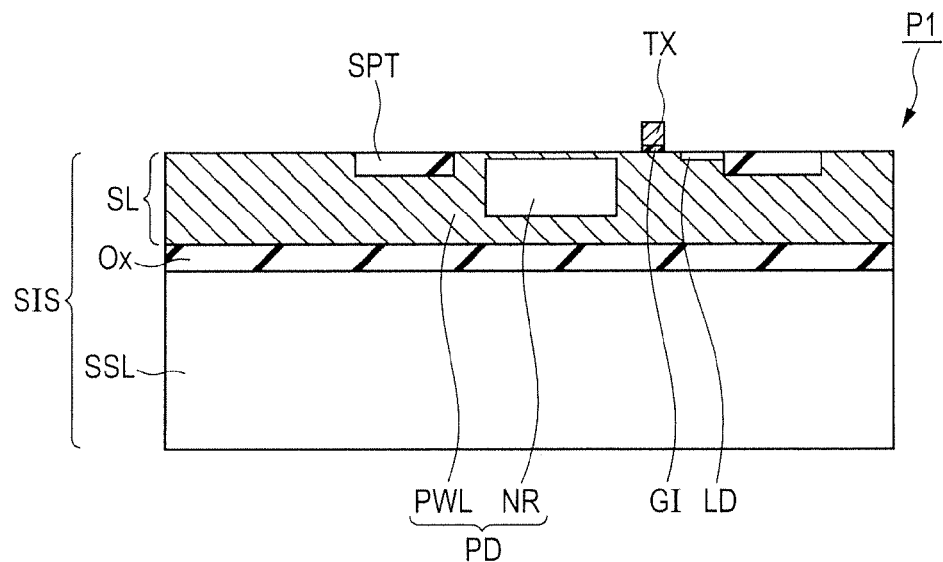
FIG. 18 is a schematic cross-sectional view showing a twelfth step of the manufacturing method of the semiconductor device in Embodiment 1.

Referring to FIG. 18, when the foregoing gate electrode TG is formed, the gate electrode TG may also be formed such that the insulating film GI except for the portion thereof located immediately under the gate electrode TG is removed and the remaining insulating film GI serves as the gate insulating film GI.

Next, into a desired region in the semiconductor layer SL, an impurity for forming the drain region is introduced by, e.g., an ion implantation method. As a result, the lower-concentration diffusion region LD is formed as the so-called LDD (Lightly Doped Drain) region of the transistor to be formed eventually. The lower-concentration diffusion region LD is formed as a part of the drain region. Thus, the structure of the transfer transistor TX is formed which has the gate electrode TG, the gate insulating film GI, the source region (photodiode PD), and the drain region (lower-concentration diffusion region).

Figure 19:
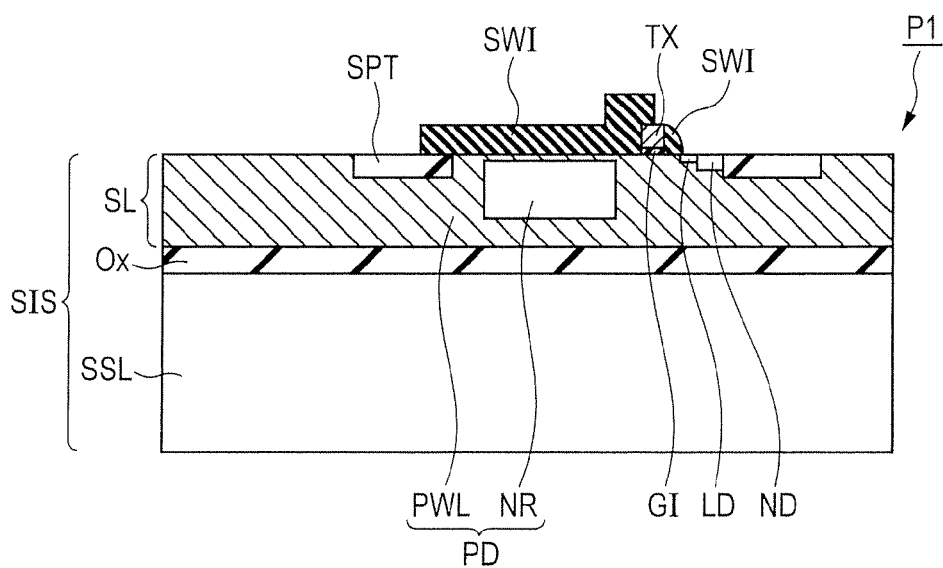
FIG. 19 is a schematic cross-sectional view showing a thirteenth step of the manufacturing method of the semiconductor device in Embodiment 1.

Referring to FIG. 19, by, e.g., a typical CVD method, e.g., a silicon nitride film is formed so as to cover the upper surface of the structure formed in the step of FIG. 18 and formed into the sidewall insulating films SWI by, e.g., a typical photoengraving technique and etching. Using the sidewall insulating films SWI as a hard mask, e.g., phosphorus (P) ions as an n-type impurity are implanted particularly into the region in the semiconductor layer SL located between the lower-concentration diffusion region LD and the isolation insulating film SPT in accordance with a typical ion implantation technique. As a result, the n-type diffusion region ND (having an impurity concentration higher than that of the lower-concentration diffusion region LD) is formed.

Figure 20:
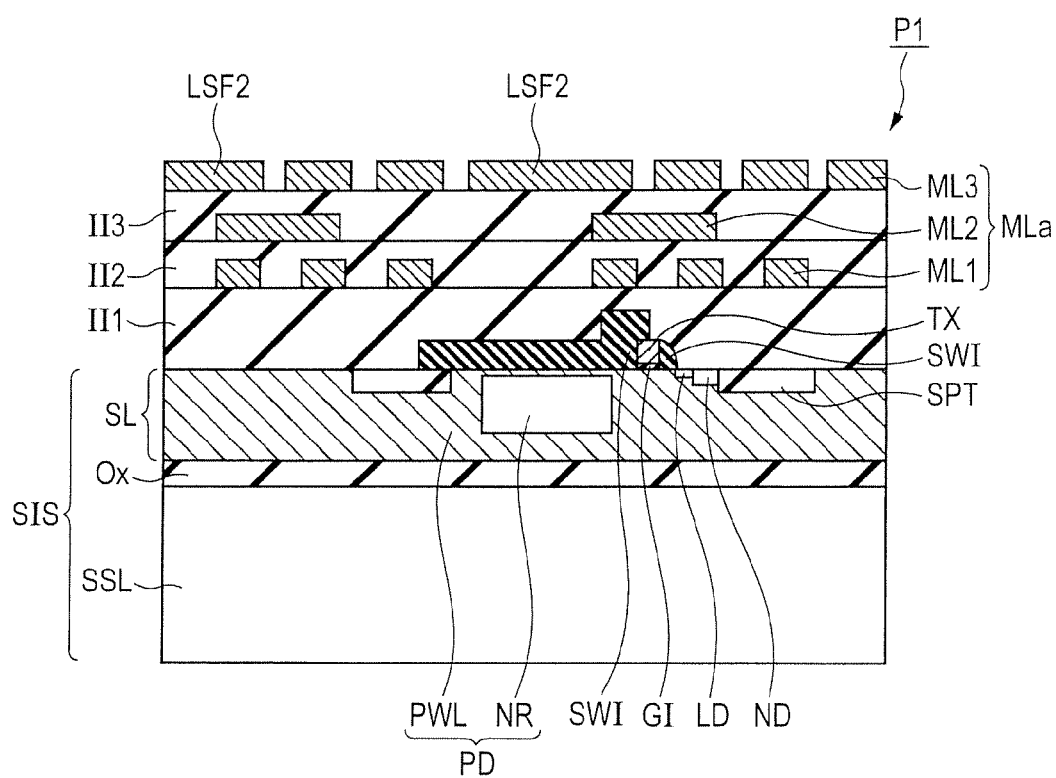
FIG. 20 is a schematic cross-sectional view showing a fourteenth step of the manufacturing method of the semiconductor device in Embodiment 1.

Referring to FIG. 20, by, e.g., a typical CVD method, the interlayer insulating film II1 made of, e.g., a silicon oxide film is formed so as to cover the upper surface of the structure formed in the step of FIG. 19. Over the interlayer insulating film II1, the interconnect layers ML1 each made of a thin film of, e.g., aluminum are formed by, e.g., a typical sputtering method, a typical photoengraving technique, and etching.

Next, over the interlayer insulating film II1, the interlayer insulating film II2 made of, e.g., a silicon oxide film is formed by, e.g., a typical CVD method so as to cover the upper surfaces of the interconnect layers ML1. Over the interlayer insulating film II2, by, e.g., a typical sputtering method, a typical photoengraving technique, and etching, the interconnect layers ML2 each made of a thin film of, e.g., aluminum are formed. Further, over the interlayer insulating film II2, an interlayer insulating film II3 made of, e.g., a silicon oxide film is formed by, e.g., a typical CVD method so as to cover the upper surfaces of the interconnect layers ML2. Over the interlayer insulating film II3, by, e.g., a typical sputtering method, a typical photoengraving technique, and etching, the interconnect layers ML3 each made of a thin film of, e.g., aluminum is formed.

At this time, the pattern of the interconnect layers ML3 is preferably formed so as to overlap at least parts of the photodiodes PD in the vertical direction in the drawing which is perpendicular to the main surface of the semiconductor layer SL or the like (i.e., direction perpendicular to the junction surface to be formed eventually). The interconnect layers ML3 placed so as to overlap the photodiodes PD are formed as the second light blocking film LSF2. The interconnect layers ML3 formed as the second light blocking film LSF2 are preferably formed at positions located between the photodiodes PD and the capacitor elements CD when the first substrate P1 and the second substrate P2 are eventually joined together. More preferably, the second light blocking film LSF2 is formed so as to completely overlap the photodiodes PD in the direction perpendicular to the junction surface to be formed eventually.

Figure 21:
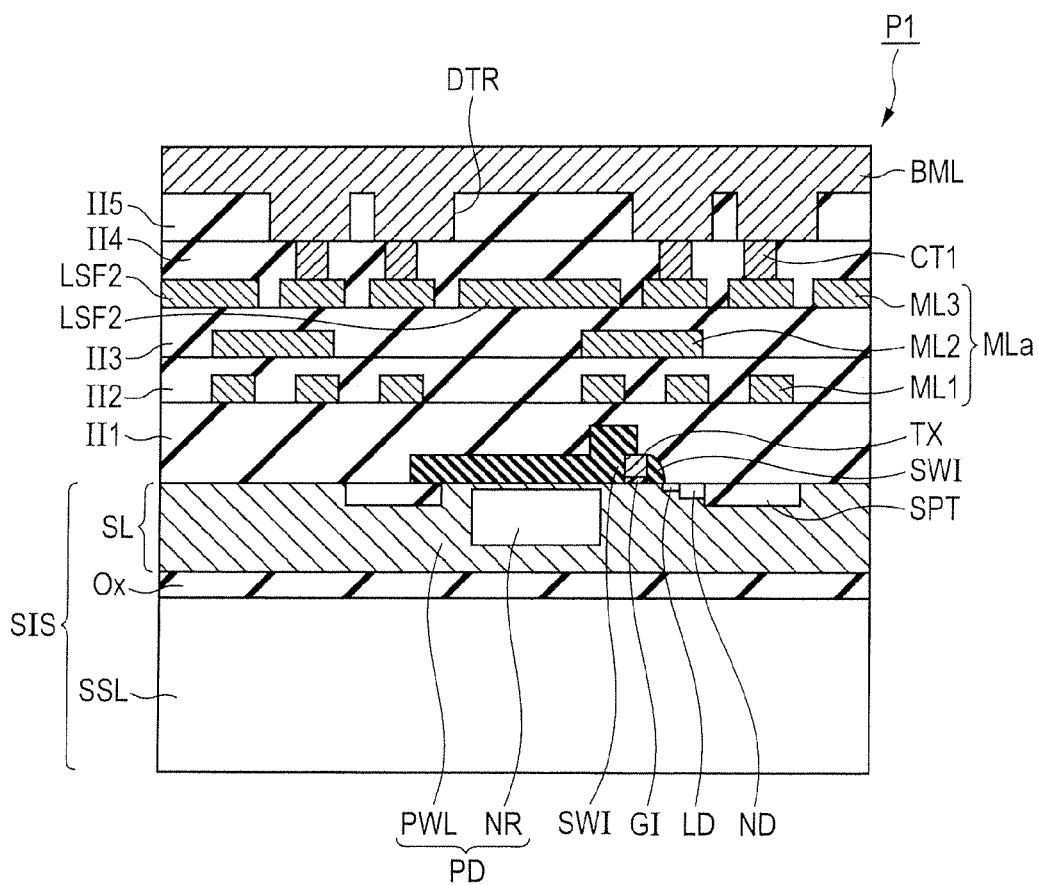
FIG. 21 is a schematic cross-sectional view showing a fifteenth step of the manufacturing method of the semiconductor device in Embodiment 1.

Referring to FIG. 21, over the interlayer insulating film II3, an interlayer insulating film II4 made of, e.g., a silicon oxide film is formed by, e.g., a typical CVD method so as to cover the upper surfaces of the interconnect layers ML1. Then, using a typical photoengraving technique and a typical etching technique, contact holes are formed in the interlayer insulating film II4 so as to reach the upper surfaces of the interconnect layers ML3.

Over the interlayer insulating film II4, by, e.g., a CVD method, a thin film of tungsten is formed so as to be embedded in each of the contact holes. By removing the thin film of tungsten over the interlayer insulating film II4 by CMP, the contacts CT1 each having a configuration in which the thin film of tungsten is formed in the contact hole are formed.

Next, by, e.g., a typical CVD method, an interlayer insulating film II5 made of, e.g., a silicon oxide film is formed so as to cover the upper surfaces of the interlayer insulating film II4 and the contacts CT1. Then, in the same manner as in the step of FIG. 14, by subjecting the interlayer insulating film II5 to a typical photoengraving process and etching, the plurality of trench portions DTR are formed so as to extend from the uppermost surface of the interlayer insulating film II5 and reach the upper surfaces of the contacts CT1.

Next, by, e.g., a typical sputtering method, a thin film of aluminum or tungsten is formed as the embedding metal film BML over the interlayer insulating film II5 so as to fill (be embedded in) the trench portions DTR.

A combination of the interlayer insulating films II1 to II5 formed in each of the foregoing steps corresponds to the interlayer insulating film II (first interlayer insulating film) shown in FIG. 4. On the other hand, a combination of the interconnect layers ML1, ML2, and ML3 corresponds to each of the interconnect layers ML (first interconnect layer) in which the plurality of interconnect layers are stacked with the first interlayer insulating film II (II1 to II5) being interposed therebetween.

Figure 22:
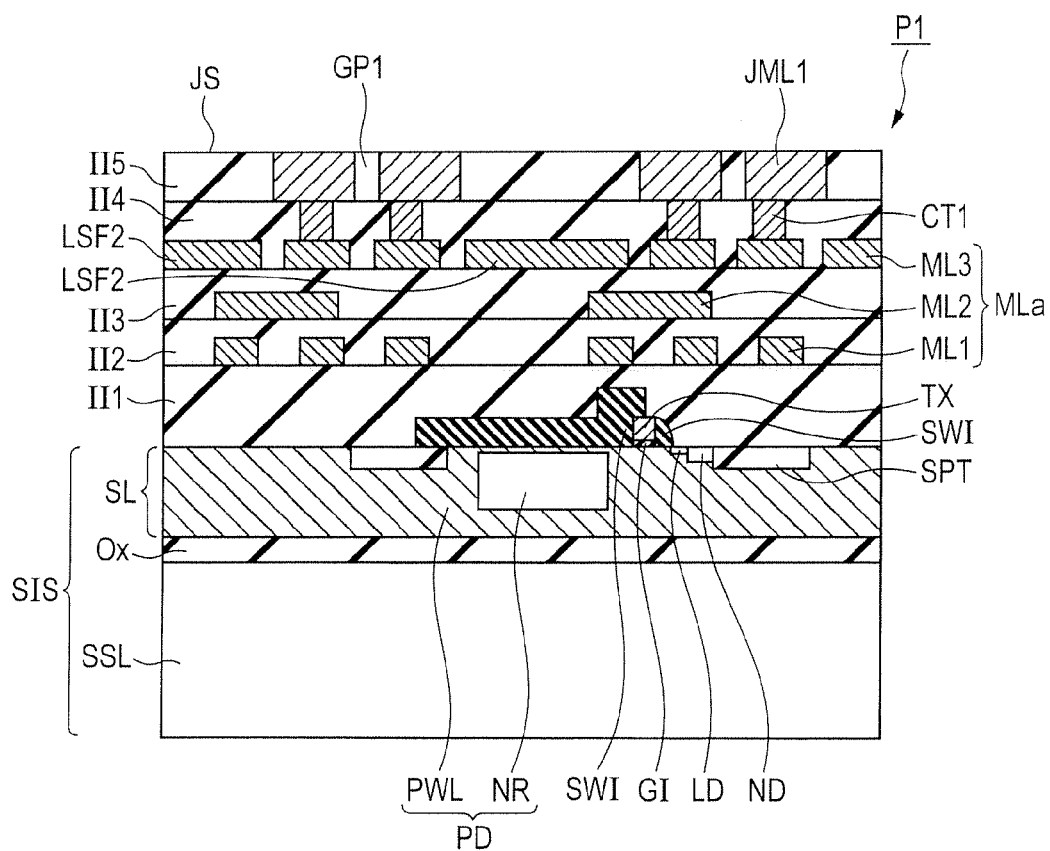
FIG. 22 is a schematic cross-sectional view showing a sixteenth step of the manufacturing method of the semiconductor device in Embodiment 1.

Referring to FIG. 22, in the same manner as in the step of FIG. 15, the embedding metal film BML over the interlayer insulating film II5 is removed by CMP to form the first coupling portions JML1 each having a configuration in which the thin film of aluminum or tungsten is formed in the trench portion DTR.

The uppermost surface of the interlayer insulating film II5 after planarized by, e.g., CMP serves as the junction surface JS between the first substrate P1 and the second substrate P2. That is, the first coupling portions JML are formed at the junction surface JS. Thus, the first substrate P1 having the photodiodes PD and forming at least a part of each of the pixels PE (except for the capacitor element CD and the like forming the pixel PE) is formed (though the first light blocking film and the like have not been formed yet).

Figure 23:
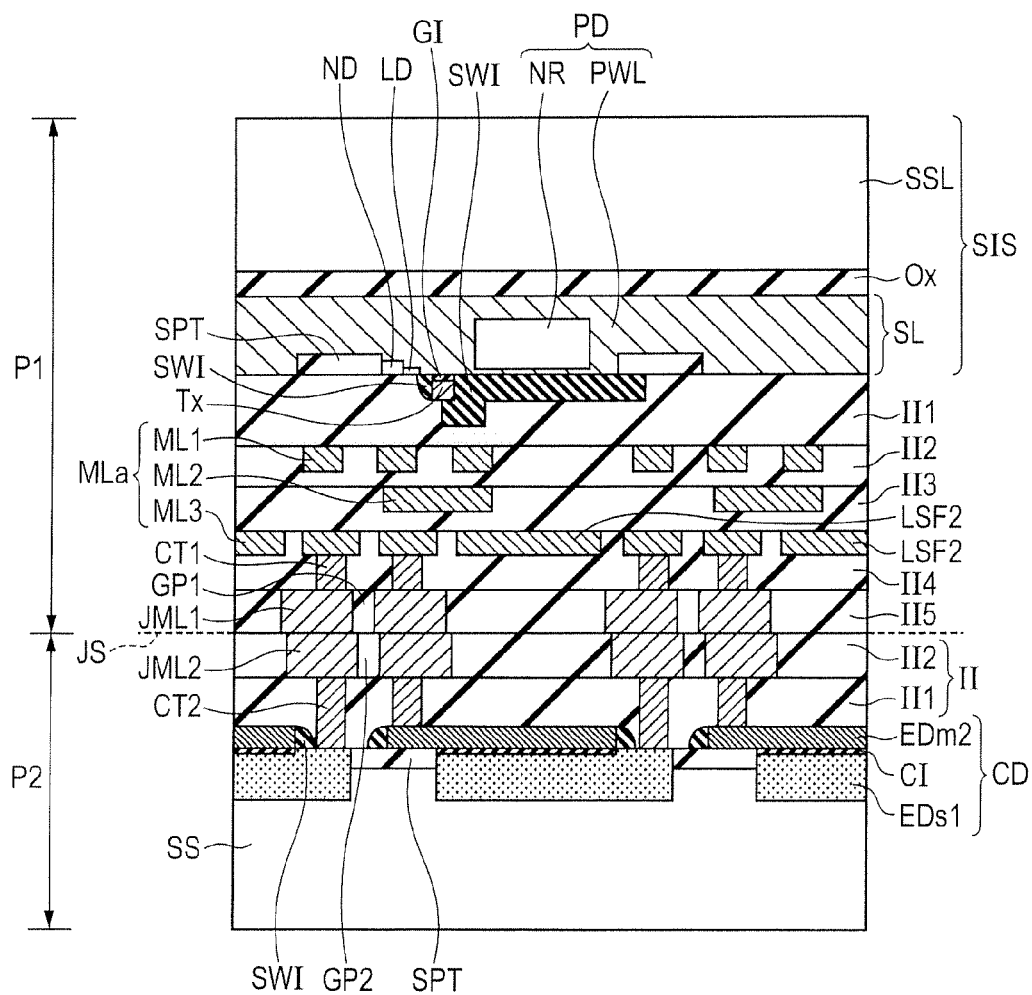
FIG. 23 is a schematic cross-sectional view showing a seventeenth step of the manufacturing method of the semiconductor device in Embodiment 1.

Referring to FIG. 23, using a generally known joining method, the surface of the first substrate P1 corresponding to the junction surface JS and the surface of the second substrate P2 corresponding to the junction surface JS are joined together. At this time, the joining is performed such that the first coupling portions JML1 which are formed at the surface of the first substrate P1 corresponding to the junction surface JS and the second coupling portions JML2 to be joined thereto which are formed at the surface of the second substrate P2 corresponding to the junction surface JS come in at least partial contact with each other. This provides electrical coupling between the first coupling portions JML1 and the second coupling portions JML2.

The amount of misalignment tolerated when the first coupling portions JML1 and the second coupling portions JML2 to be joined thereto are thus joined together is larger when the foregoing coupling portions JML1 and JML2 are arranged as in FIG. 6C than when the foregoing coupling portions JML1 and JML2 are arranged as in FIG. 6B. Accordingly, the first and second coupling portions JML1 and JML2 are more preferably formed such that the direction of the vector of the shortest length of the first gap portion GP1 between the pair of first coupling portions JML1 adjacent to each other in planar view and the direction of the vector of the shortest length of the second gap portion GP2 between the pair of second coupling portions JML2 adjacent to each other in planar view extend in directions oblique (e.g., directions at 45°) to the directions in which the plurality of pixels arranged in a grid pattern are aligned.

Figure 24:
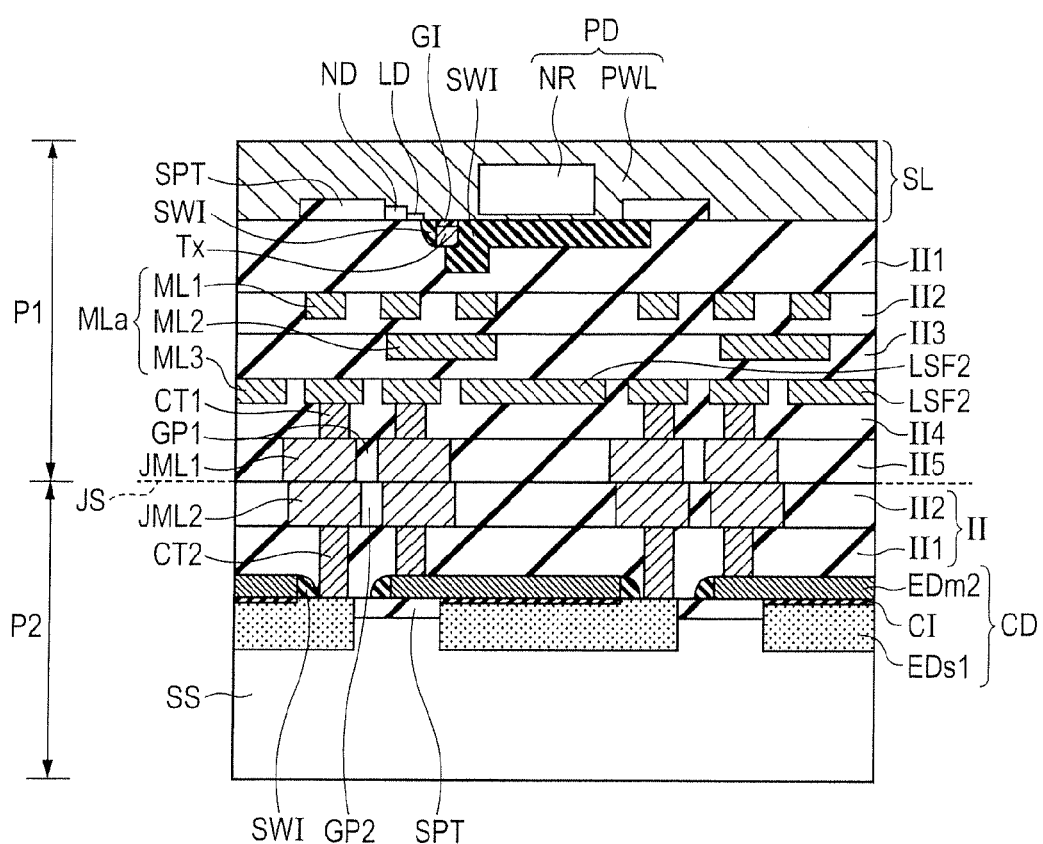
FIG. 24 is a schematic cross-sectional view showing an eighteenth step of the manufacturing method of the semiconductor device in Embodiment 1.

Referring to FIG. 24, the underlying substrate SSL is removed by polishing so as to expose at least the upper surface of the insulating film layer Ox. In the removal by polishing performed herein, the underlying substrate SSL is removed first by typical grinding processing (crude processing). Then, by CMP, the underlying substrate SSL is processed to be removed with higher precision than in the foregoing crude processing such that the processed surface is flatter. The resultant residues of the underlying substrate SSL are substantially completely removed by typical wet etching using an alkaline solution to expose the surface of the insulating film layer Ox with high planarity. At this time, the insulating film layer Ox functions as an etching stopper.

Next, a hydrofluoric-acid-based chemical solution is used to remove the insulating film layer Ox made of a silicon oxide film and expose the main surface of the semiconductor layer SL (on the side where the insulating film layer Ox has been formed).

Figure 25:
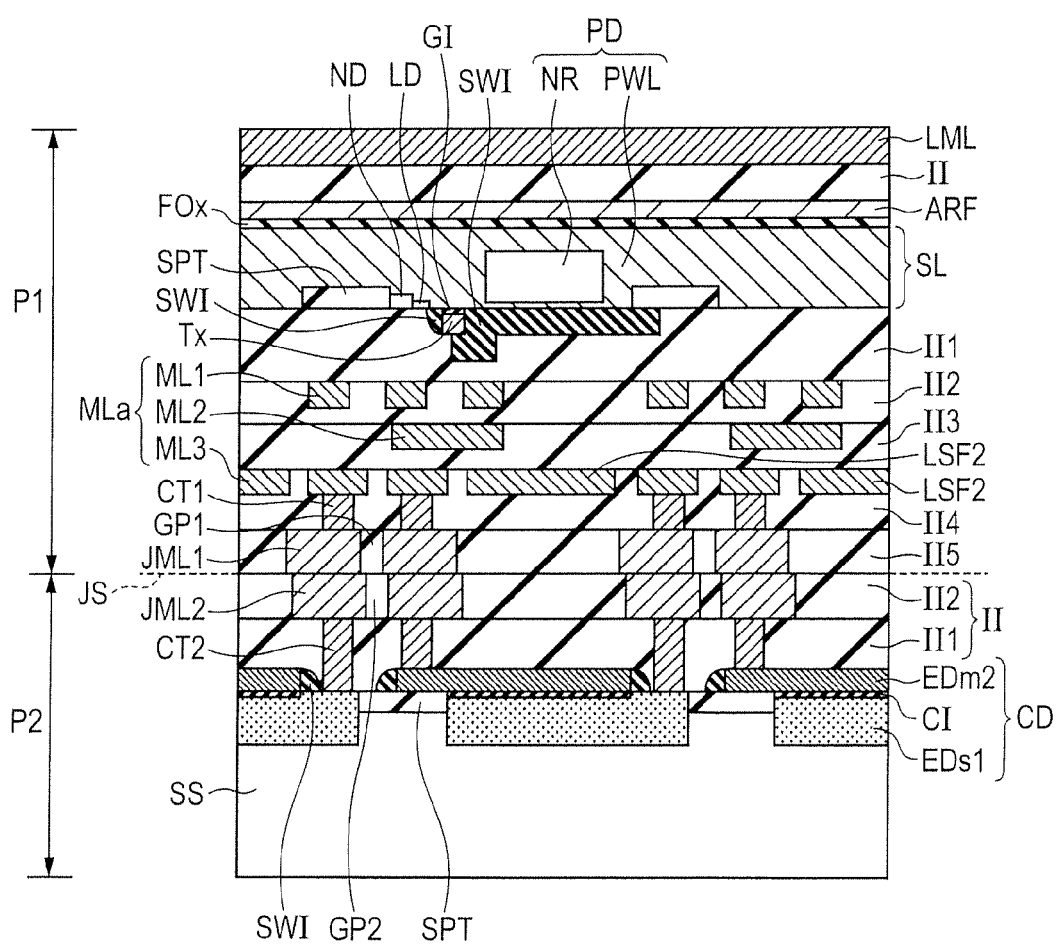
FIG. 25 is a schematic cross-sectional view showing a nineteenth step of the manufacturing method of the semiconductor device in Embodiment 1.

Referring to FIG. 25, by a typical CVD method, over the main surface of the semiconductor layer SL exposed by the processing shown in FIG. 24, the thin silicon oxide film FOx is formed. Next, the antireflection film ARF, the interlayer insulating film II, and a laminate metal film LML are stacked in this order so as to cover the silicon oxide film FOx.

The antireflection film ARF is interposed between the thin silicon oxide film FOx and the interlayer insulating film II made of a silicon oxide film and formed of a material such as a silicon nitride film or a metal oxide film, each having a refractive index of a value between the refractive index of a silicon single crystal and the refractive index of the silicon oxide film.

For example, if the antireflection film ARF is not placed, due to the refractive index difference between each of the interlayer insulating film II and the thin silicon oxide film FOx (silicon oxide film) and the semiconductor layer SL (silicon single crystal) located thereunder, light incident on the region is reflected at a high ratio. However, by providing an antireflection film formed of a material having a refractive index of the value between the refractive index of the silicon oxide film and the refractive index of a silicon single crystal, such as a silicon nitride film, the ratio of the reflection mentioned above can be reduced. This allows desired light to be more efficiently incident on the photodiode PD.

The laminate metal film LML is formed so as to form the first light blocking film described later. For example, the laminate metal film LML is formed of a thin film made of a material which shows a light blocking property to the light applied to illuminate the photodiodes PD, such as a thin film of, e.g., aluminum or tungsten.

Figure 26:
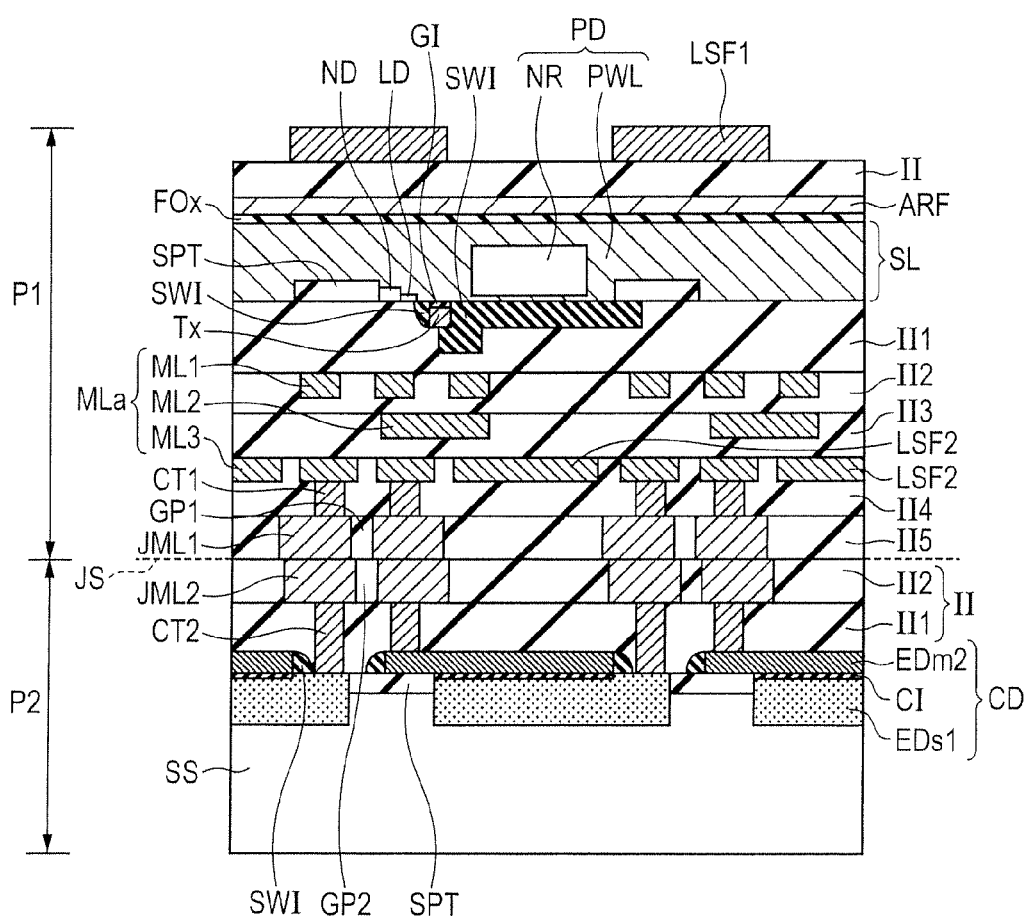
FIG. 26 is a schematic cross-sectional view showing a twentieth step of the manufacturing method of the semiconductor device in Embodiment 1.

Referring to FIG. 26, by a typical photoengraving technique and etching, the laminate metal film LML is patterned to serve as the first light blocking film LSF1. Here, the plurality of first coupling portions JML1 and the plurality of second coupling portions JML2 are formed to be spaced apart from each other at the junction surface JS. The first and second gap portions GP1 and GP2 interposed between those ones of the first and second coupling portions JML1 and JML2 which are present outside the regions overlapping the photodiodes PD (in the direction perpendicular to the junction surface JS, i.e., in planar view) are formed so as to overlap the first light blocking film LSF1 in the direction perpendicular to the junction surface JS.

Figure 27:
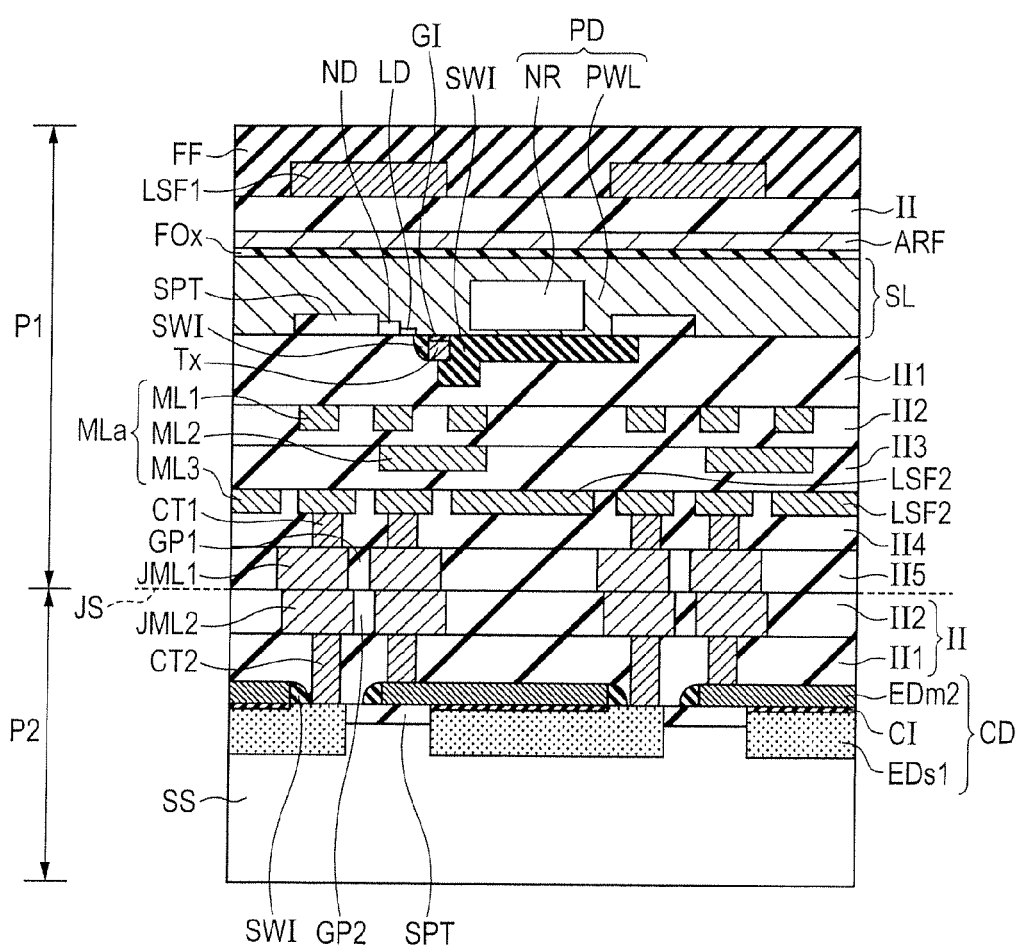
FIG. 27 is a schematic cross-sectional view showing a twenty-first step of the manufacturing method of the semiconductor device in Embodiment 1.

Referring to FIG. 27, over the interlayer insulating film II, the planarization layer FF is formed so as to cover the upper surface of the first light blocking film LSF1. The planarization layer FF is formed by applying a coat-type silicon oxide film such as, e.g., SOG (Spin On Glass) to the upper surface of each of the interlayer insulating film II and the light blocking films LSF and rotating the upper surfaces of the interlayer insulating film II and the light blocking film LSF. The upper surface of the planarization layer FF after being formed by the foregoing rotation has reduced roughness and is flat.

Thereafter, over the upper surface (back surface) of the planarization layer FF, the color filters FLT and the on-chip lenses LNS are formed, whereby the solid-state image sensing element having the configuration shown in FIG. 4 is formed.

Next, the function/effect of the present embodiment will be described.

In general, the light applied to the photodiodes PD to cause photoelectric conversion therein is transmitted at a high ratio by an insulating film (silicon oxide film) such as the interlayer insulating film II and reflected at a high ratio by such a metal thin film (of aluminum or the like) as forming each of the first light blocking film LSF1 and the first coupling portions JML1. As a result, light is likely to be reflected (blocked) by the first and second coupling portions JML1 and JML2, the interconnect layers MLa, and the like. On the other hand, light is likely to be transmitted by the first and second gap portions GP1 and GP2 interposed between the pair of first coupling portions JML1 and the pair of second coupling portions JML2 and the like (because the metal thin film is not placed therein).

Accordingly, in the solid-state image sensing element of the present embodiment, the first light blocking film LSF1 is placed so as to overlap the first and second gap portions GP1 and GP2 present outside the regions overlapping the photodiodes PD in planar view. As a result, light incident in the direction perpendicular to the junction surface JS from the back side (upper side) of the solid-state image sensing element is blocked by the first light blocking film LSF1 immediately over the first and second gap portions GP1 and GP2 and inhibited from further travelling from the first and second gap portions GP1 and GP2 toward the capacitor elements CD located on the lower side (front side) thereof. This enhances the effect of inhibiting the occurrence of a problem such as the leakage of the signal charges stored in the capacitor elements CD due to the incidence of the light on the capacitor elements CD.

The regions immediately over the regions where the photodiodes PD are formed in the direction perpendicular to the junction surface JS (regions overlapping the photodiodes PD in planar view) should transmit the light intended to reach the photodiodes PD so that the first light blocking film LSF1 is not placed therein. On the other hand, in the region other than the regions immediately over the regions overlapping the photodiodes PD in planar view, the first light blocking films LSF1 are preferably provided on the upper side (on the back side) of the photodiodes PD. This can inhibit light from traveling from the region other than the photodiodes PD toward the capacitor elements CD.

Next, in the present embodiment, after the photodiodes PD and the capacitor elements CD are formed individually in the different substrates P1 and P2, the first substrate P1 and the second substrate P2 are joined together. As a result, the photodiodes PD and the capacitor elements CD are located so as to be opposed to each other in the direction perpendicular to the junction surface JS. Accordingly, the areas occupied by the photodiodes PD and the capacitor elements CD in the main surfaces of the substrates can be reduced to be smaller than in the case where the photodiodes PD and the capacitor elements CD are arranged side by side in the same substrate in the direction along the main surface thereof. This allows easy high-degree integration of the pixels.

In the solid-state image sensing element in which the photodiodes PD and the capacitor elements CD are thus placed to be opposed to each other, the first light blocking film LSF1 is not placed immediately over the regions where the photodiodes PD are formed. However, immediately under (on the front side) of the photodiodes PD in the direction perpendicular to the junction surface JS, the second light blocking film LSF2 is placed so as to overlap the photodiodes PD. Accordingly, light traveling in the direction perpendicular to the junction surface JS and transmitted by the photodiodes PD is blocked by the second light blocking film LSF2. As a result, the light is inhibited from further traveling toward the capacitor elements CD on the lower side (front side) of the second light blocking film LSF2. This enhances the effect of inhibiting the occurrence of a problem such as the leakage of the signal charges stored in the capacitor elements CD due to the incidence of light on the capacitor elements CD. Such an effect is enhanced by the location of the second light blocking film LSF2 between the photodiodes PD and the capacitor elements CD in the direction perpendicular to the junction surface JS and further enhanced by the second light blocking film LSF2 formed so as to completely overlap the photodiodes PD.

The capacitor elements CD are formed at positions away from the surface of the second substrate P2 corresponding to the junction surface JS. Specifically, the capacitor elements CD are formed on the lower side (front side) of the junction surface JS. That is, the first and second electrodes of the capacitor elements CD are formed at positions away from the junction surface JS.

This can inhibit the signal charges in the capacitor elements CD from leaking out due to unintended travel of light toward the capacitor elements CD resulting from the deformation of the first and second electrodes of the capacitor elements CD caused by a stress applied thereto upon joining together of the first and second substrates P1 and P2 at the junction surface JS.

Since the capacitor elements CD are not formed at the surface of the second substrate P2 corresponding to the junction surface JS, it is possible to increase the area (size) of the gap portion GP1 or GP2 between the first or second coupling portions JML1 and JML2 at the junction surface JS. This is because, if the capacitor elements CD are formed at the junction surface JS, by increasing the area of each of the capacitor elements CD in terms of increasing the electric capacitance of the capacitor element CD, the area (size) of the gap portion GP1 or GP2 may possibly be reduced.

Since the area (size) of the first or second gap portion GP1 and GP2 can be increased, it is possible to increase the tolerable amount of misalignment when the first and second substrates P1 and P2 are joined together and increase processing accuracy.

In addition, if the first coupling portions JML1 and the second coupling portions JML2 are arranged such that the directions of the vectors of the gap portions extend in directions oblique to the directions in which the pixels are aligned as shown in FIG. 6C, the amount of misalignment tolerated when the first and second coupling portions JML1 and JML2 are joined together can be increased (to be larger than in the case where the extending directions of the shortest lengths of the gap portions are along the directions in which the pixels are aligned). This further simplifies the process of joining together the first substrate P1 and the second substrate 2 and improve processing efficiency.

Note that, depending on the amount of misalignment which occurs during the joining together of the first coupling portions JML1 and the second coupling portions JML2, the positional relationship between the first light blocking films LSF1 and the second gap portions GP2 changes. However, irrespective of the change, the first light blocking film LSF1 is preferably placed so as to overlap the second gap portions GP2.

Also, in the present embodiment, when the second substrate P2 is formed, the capacitor elements CD are formed first and then the second coupling portions JML2 are formed. This allows the first and second electrodes of the capacitor elements CD to be formed under temperature conditions higher than those for the second coupling portions JML2. As a result, even if the first electrodes EDs1 are semiconductor regions in the supporting substrate SS in which a conductive impurity is diffused as in the present embodiment, highly reliable capacitor elements can be formed without causing a problem such as a reduction in the function of each of the electrodes due to heat in the subsequent step.

In the present embodiment, by joining together the first substrate P1 having the photodiodes PD and the second substrate P2 having the capacitor elements CD, the solid-state image sensing element is formed. This allows easier formation of the capacitor elements CD under high temperature conditions prior to the formation of the other components such as the interconnects than in the case where all the components forming the solid-state image sensing element are formed in one substrate.

Embodiment 2

Figure 28:
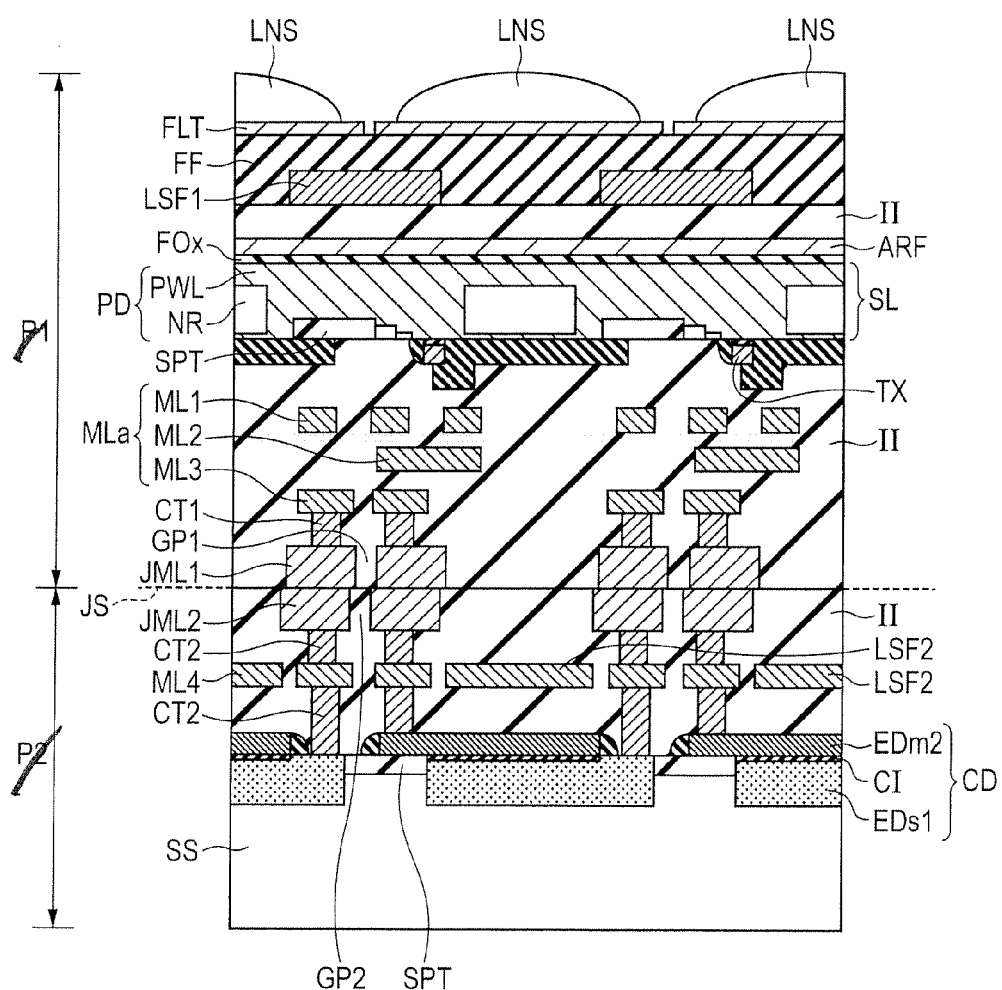
FIG. 28 is a schematic cross-sectional view showing a configuration of the portion of a semiconductor device in Embodiment 2 along the line IV-IV in FIG. 3.

In the solid-state image sensing element as the semiconductor device of Embodiment 1, as shown in FIGS. 4 and 5, the second light blocking film LSF2 is formed in the same layer as each of the interconnect layers ML3 in the first substrate P1. On the other hand, referring to FIG. 28, in a solid-state image sensing element as a semiconductor device of Embodiment 2, the second light blocking film LSF2 is formed in the same layer as each of the interconnect layers ML4 in the substrate P2. In this point, the present embodiment is different from Embodiment 1.

The second light blocking film LSF2 may be formed in the first substrate P1 as in Embodiment 1 or may also be formed in the second substrate P2 as in the present embodiment. Similarly to the second light blocking film LSF2 in Embodiment 1, the second light blocking film LSF2 used herein can also inhibit the light transmitted by the photodiodes PD and travelling toward the front surface side (lower side) from reaching the capacitor elements CD. The effect of inhibiting light from reaching the capacitor elements CD achieved by the first light blocking film LSF1 in the present embodiment is also the same as in Embodiment 1.

Note that the configuration of the present embodiment is otherwise substantially the same as the configuration of Embodiment 1 shown in FIG. 5. Therefore, like components are designated by like reference numerals and a description thereof will not be repeated.

Next, using FIGS. 29 to 32, a manufacturing method of the solid-state image sensing element as a manufacturing method of the semiconductor device of the present invention will be described. Here, in particular, a description will be given of a manufacturing method of the second substrate P2 in the present embodiment.

Referring to FIG. 29, after the same processing as shown in FIGS. 7 to 12 in Embodiment 1 is performed, a laminate metal film LML made of a thin film of, e.g., aluminum is formed by, e.g., a typical sputtering method so as to cover the upper surfaces of the interlayer insulating film II1 and the contacts CT2.

Referring to FIG. 30, by a typical photoengraving technique and etching, the laminate metal film LML is patterned to serve as the interconnect layers ML4. The pattern of the interconnect layers ML4 is preferably formed so as to overlap at least some of the photodiodes PD in a vertical direction in the drawing (i.e., direction perpendicular to a junction surface to be formed eventually) which is perpendicular to the main surface of the supporting substrate SS. By thus being formed, the pattern of the interconnect layers ML4 will be opposed to at least some of the photodiodes PD by subsequent joining together of the first and second substrates P1 and P2. The interconnect layers ML4 placed so as to overlap the photodiodes PD are formed as the second light blocking film LSF2 at positions generally immediately over the capacitor elements CD.

Figure 31:
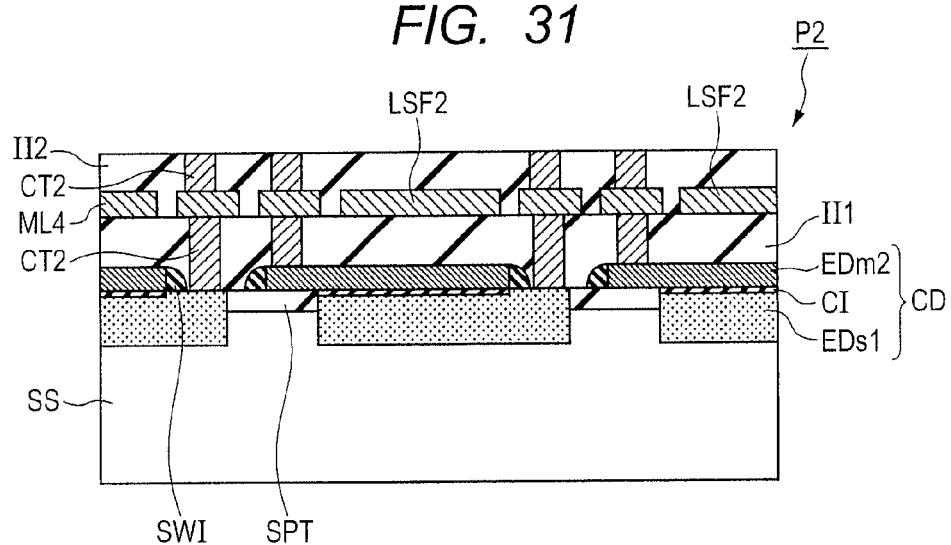
FIG. 31 is a schematic cross-sectional view showing a third step of the manufacturing method of the semiconductor device in Embodiment 2.

Referring to FIG. 31, in the same manner as in the step of FIG. 21, over the interlayer insulating film II1, the interlayer insulating film II2 made of, e.g., a silicon oxide film is formed by, e.g., a typical CVD method so as to cover the upper surfaces of the interconnect layers ML4. Then, using a typical photoengraving technique and a typical etching technique, contact holes are formed in the interlayer insulating film II1 so as to reach the upper surfaces of the interconnect layers ML4. Thereafter, by, e.g., a CVD method, a thin film of, e.g., tungsten is formed over the interlayer insulating film II4. By removing the thin film of tungsten over the interlayer insulating film II4 by CMP, the contacts CT2 each having a configuration in which the thin film of tungsten is formed in the contact hole are formed.

Figure 32:
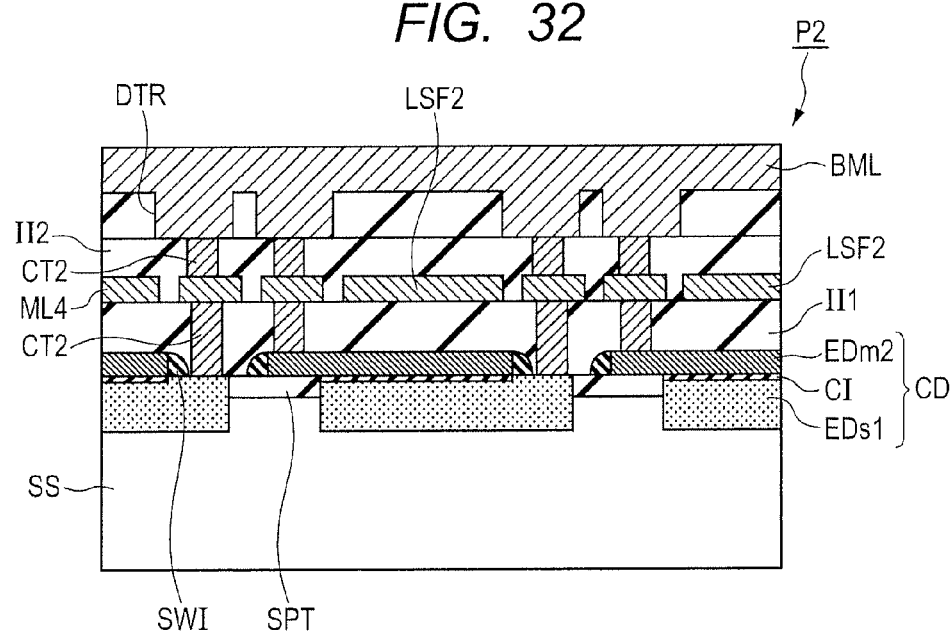
FIG. 32 is a schematic cross-sectional view showing a fourth step of the manufacturing method of the semiconductor device in Embodiment 2.

Referring to FIG. 32, in the same manner as shown in the step of FIG. 21, the interlayer insulating film II3 made of, e.g., a silicon oxide film is formed by, e.g., a typical CVD method so as to cover the upper surfaces of the interlayer insulating film II2 and the contacts CT2. Then, by performing the same processing as in FIGS. 13 and 14, the plurality of trench portions DTR are formed so as to extend from the uppermost surface of the interlayer insulating film II3 and reach the upper surfaces of the contacts CT2 and the embedding metal film BML is formed so as to be embedded therein. The subsequent step is the same as shown in FIG. 15 in Embodiment 1. The foregoing steps in FIGS. 29 to 32 are the same as in the manufacturing method of the second substrate P2 having the configuration shown in FIG. 5 in Embodiment 1. A combination of the interlayer insulating films II1 to II3 corresponds to the interlayer insulating film II (second interlayer insulating film) in the second substrate P2 shown in FIG. 28.

Embodiment 3

Figure 33:
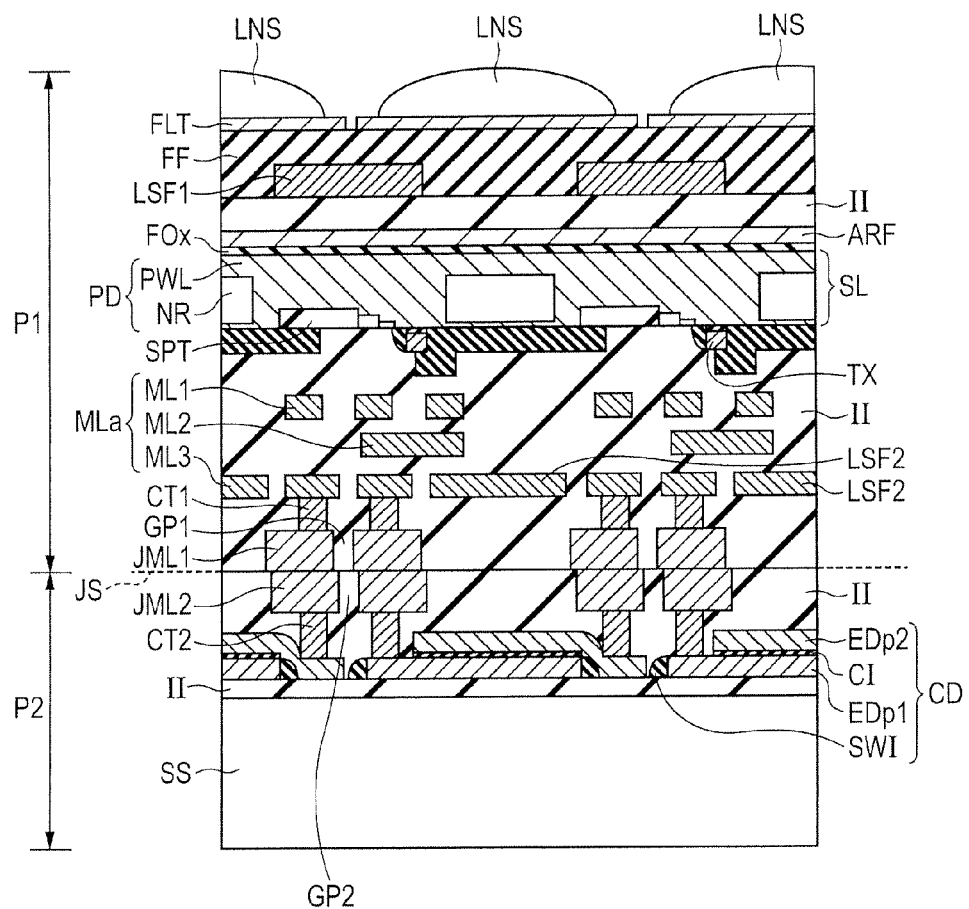
FIG. 33 is a schematic cross-sectional view showing a configuration of the portion of a semiconductor device in a first example of Embodiment 3 along the line IV-IV in FIG. 3.

Referring to FIG. 33, in a solid-state image sensing element as a semiconductor device in a first example of the present embodiment, each of first and second electrodes EDp1 and EDp2 forming the capacitor elements CD is formed of a semiconductor layer containing a conductive impurity such as a polysilicon layer. That is, each of the capacitor elements CD includes the first electrode EDp1 made of polysilicon containing a conductive impurity, the dielectric layer CI covering at least a part of the upper surface of the first electrode EDp1, and the second electrode EDp2 made of polysilicon containing a conductive impurity and covering at least a part of the upper surface of the dielectric layer CI. Note that the capacitor elements CD are formed over the supporting substrate SS forming the second substrate P2 with the interlayer insulating film II being interposed therebetween. Over the side walls of the first electrodes EDp1, the sidewall insulating films SWI are formed.

Note that the configuration of the present embodiment is otherwise substantially the same as the configuration of Embodiment 1 shown in FIG. 4. Therefore, like components are designated by like reference numerals and a description thereof will not be repeated. The second substrate P2 in FIG. 33 may also have the same form (having the interconnect layers ML4) as that of the second substrate P2 in FIG. 5.

Next, using FIGS. 34 to 36, a manufacturing method of the solid-state image sensing element will be described as a manufacturing method of the semiconductor device in the first example of the present embodiment. Here, in particular, a description will be given of a manufacturing method of the second substrate P2 in the foregoing first example.

Figure 34:
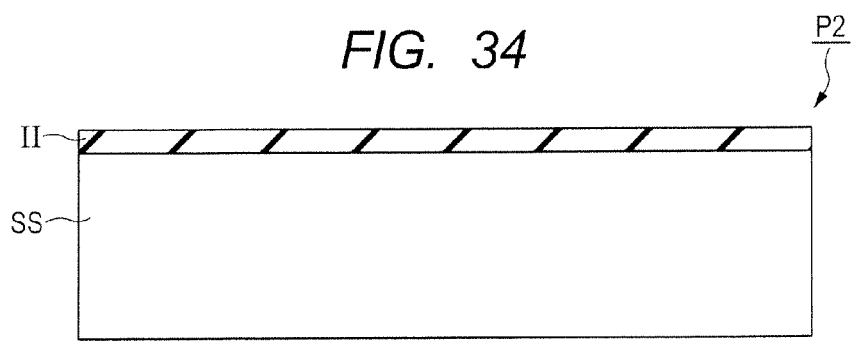
FIG. 34 is a schematic cross-sectional view showing a first step of a manufacturing method of the semiconductor device in the first example of Embodiment 3.

Referring to FIG. 34, over one of the main surfaces of the supporting substrate SS prepared in the same manner as in the step of FIG. 7, the interlayer insulating film II as, e.g., a silicon oxide film is formed.

Figure 35:
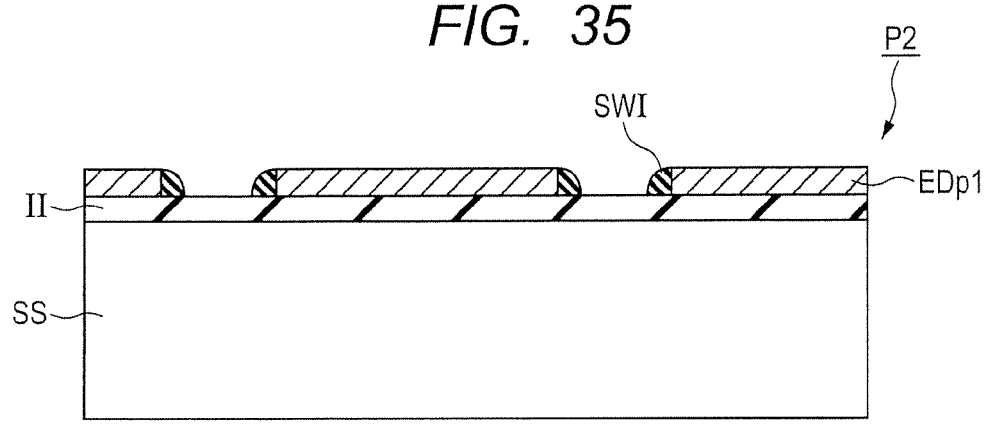
FIG. 35 is a schematic cross-sectional view showing a second step of the manufacturing method of the semiconductor device in the first example of Embodiment 3.

Referring to FIG. 35, over the interlayer insulating film II, a semiconductor layer containing a conductive impurity such as a polysilicon layer is formed by, e.g., a typical CVD method and patterned by a typical photoengraving technique and etching to form the first electrodes EDp1. Then, an insulating film such as a silicon nitride film is formed in the same manner as in the step of FIG. 10. By performing a typical etch-back process on the insulating film in the same manner as in the step of FIG. 11, the sidewall insulating films SWI are formed so as to remain over the side walls of the first electrodes EDp1.

Figure 36:
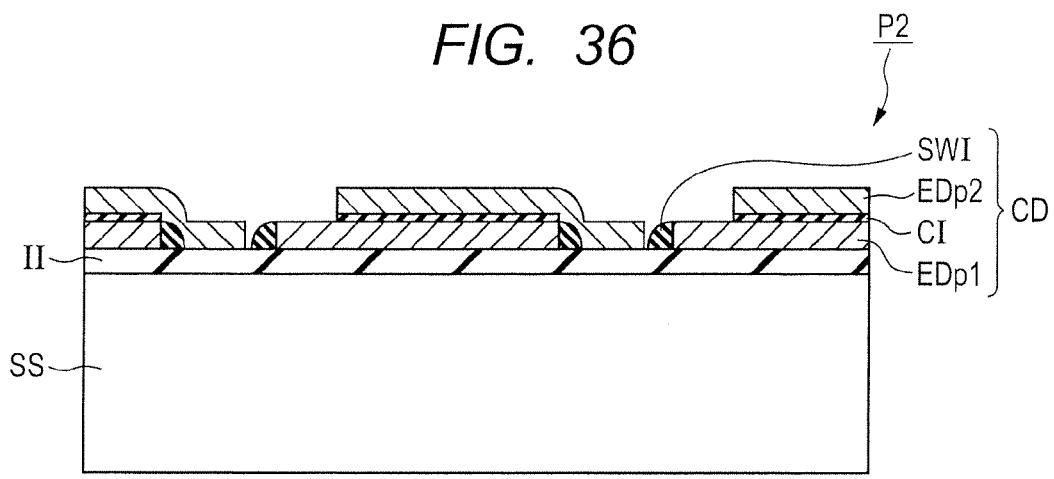
FIG. 36 is a schematic cross-sectional view showing a third step of the manufacturing method of the semiconductor device in the first example of Embodiment 3.

Referring to FIG. 36, by, e.g., a typical thermal oxidation method, the insulating films CI each as a dielectric layer made of, e.g., a silicon oxide film are formed so as to cover at least parts of the upper surfaces of the first electrodes EDs1. The process is the same as that of the formation of the dielectric layers CI in FIG. 9.

Next, a semiconductor layer containing a conductive impurity such as a polysilicon layer is formed by, e.g., a CVD method so as to cover the upper surface of the structure formed in the previous step. The semiconductor layer is patterned by a typical photoengraving technique and etching to form the second electrodes EDp2. Here, the second electrodes EDp2 are formed so as to cover at least parts of the upper surfaces of the dielectric layers CI formed so as to cover at least the upper surfaces of the first electrodes EDs1. Thus, the capacitor elements CD in the first example of the present embodiment are formed.

Figure 37:
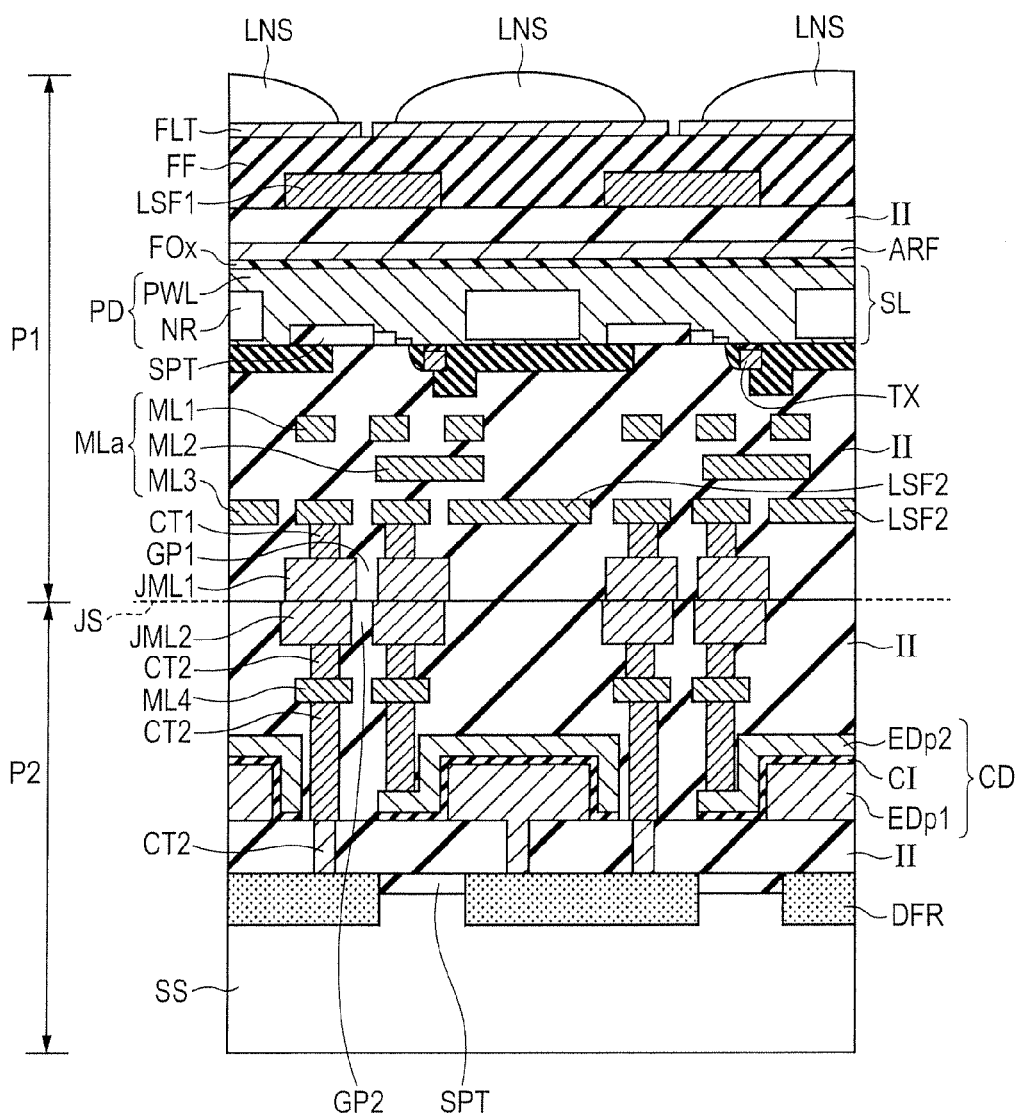
FIG. 37 is a schematic cross-sectional view showing a configuration of the portion of a semiconductor device in a second example of Embodiment 3 along the line IV-IV in FIG. 3.

Referring to FIG. 37, in a solid-state image sensing element as a semiconductor device in a second example of the present embodiment, in the same manner as in the solid-state image sensing element in the first example in FIG. 33, each of the first and second electrodes EDp1 and EDp2 is formed of polysilicon as a semiconductor layer containing a conductive impurity. However, in FIG. 37, each of the first electrodes EDp1 has a thickness (in a direction perpendicular to the junction surface JS) larger than that of each of the first electrodes EDp1 in FIG. 33. Consequently, each of the capacitor elements CD in FIG. 37 has a structure which is overall more three-dimensional than each of the capacitor elements CD in FIG. 33. Note that, as shown in FIG. 37, the dielectric layers C1 covering the upper surfaces of the first electrodes EDp1 may also extend continuously from over the upper surfaces the first electrodes EDp1 to over the side surfaces of the electrodes EDp1 so as to cover the upper surfaces and side surfaces of the first electrodes EDp1.

Note that, in FIG. 37, over the main surface of the supporting substrate SS on the back side (upper side) thereof, the isolation insulating films SPT and the impurity diffusion regions DFR (used as the first electrodes EDs1 in FIG. 4) are formed in the same manner as in the supporting substrate SS in Embodiment 1 (FIG. 4). The impurity diffusion regions DFR each containing a conductive impurity are electrically coupled to the first electrodes EDp1 and the coupling portions JML1 and JML2 via the contacts CT2 formed so as to extend through the interlayer insulating film II.

The supporting substrate SS may have a configuration as shown in FIG. 37 or may also have a simpler configuration as shown in FIG. 33. In FIG. 33 also, the supporting substrate SS having the same configuration as that in FIG. 37 may be used.

Note that the configuration in the second example of the present embodiment shown in FIG. 37 is otherwise substantially the same as that in the first example of the present embodiment shown in FIG. 33. Therefore, like components are designated by like reference numerals and a description thereof will not be repeated.

Next, using FIGS. 38 to 41, a description will be given of a manufacturing method of the solid-state image sensing element as a manufacturing method of the semiconductor device in the second example of the present embodiment. Here, in particular, a description will be given of a manufacturing method of the second substrate P2 in the foregoing second embodiment.

Figure 38:
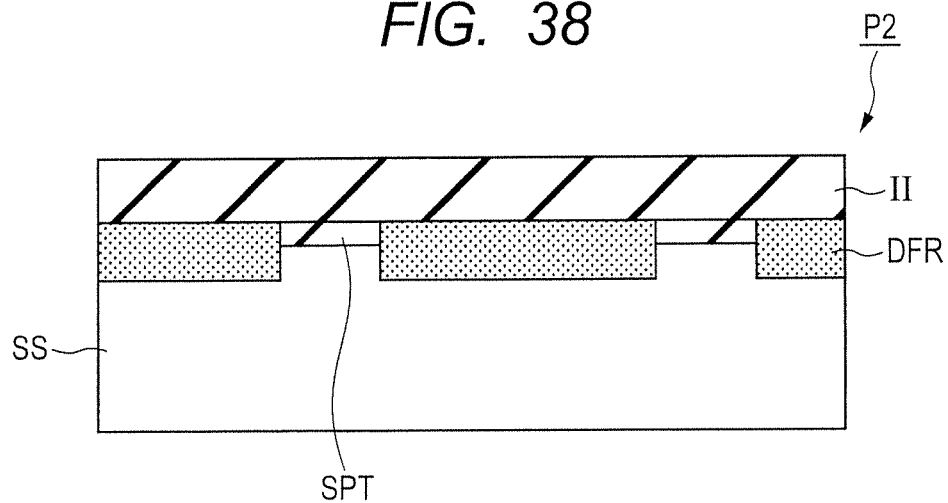
FIG. 38 is a schematic cross-sectional view showing a first step of a manufacturing method of the semiconductor device in the second example of Embodiment 3.

Referring to FIG. 38, in one of the main surfaces of the supporting substrate SS provided in the same manner as in the step of FIG. 7, the isolation insulating films SPT and the impurity diffusion regions DFR are formed in the same manner as in the step of FIG. 8. The interlayer insulating film II made of, e.g., a silicon oxide film is formed by, e.g., a typical CVD method so as to cover the surface of the supporting substrate SS in which the isolation insulating films SPT and the impurity diffusion regions DFR are formed.

Figure 39:
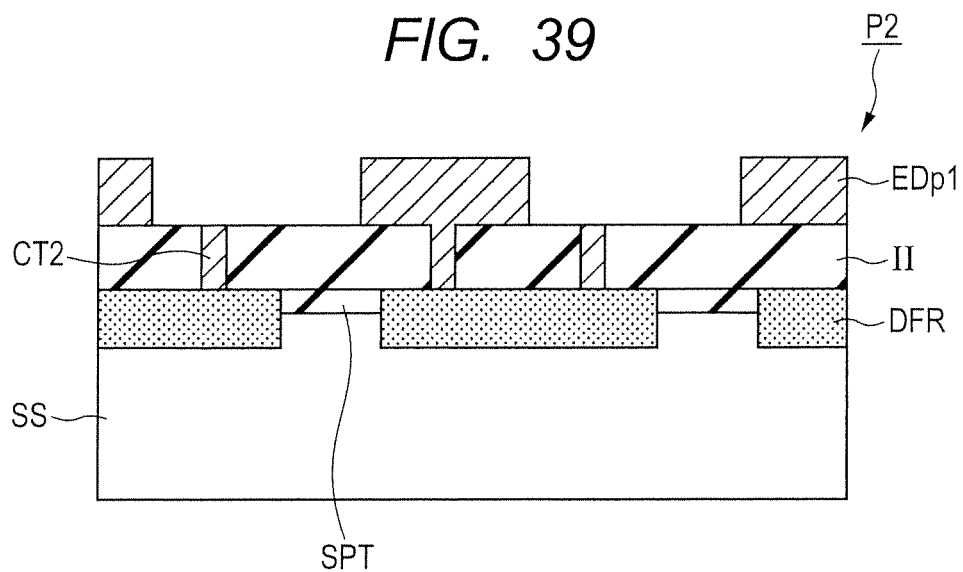
FIG. 39 is a schematic cross-sectional view showing a second step of the manufacturing method of the semiconductor device in the second example of Embodiment 3.

Referring to FIG. 39, through holes are formed so as to extend from the uppermost surface of the interlayer insulating film II over the supporting substrate SS in the downward direction in the drawing through the interlayer insulating film II and reach the impurity diffusion regions DFR. Then, over the interlayer insulating film II, a thin film of polysilicon as, e.g., a semiconductor layer containing a conductive impurity is formed by, e.g., a typical CVD method so as to be embedded in each of the through holes. Here, the thin film of polysilicon is formed to be thicker than, e.g., each of the first electrodes EDp1 formed in the step of FIG. 35.

By performing a typical photoengraving process and etching on the thin film of polysilicon, a pattern of the first electrodes EDp1 each made of the thin film of polysilicon is formed. Here, the first electrodes EDp1 are formed so as to cover the contacts CT2 each made of the embedded thin film of polysilicon. The first electrodes EDp1 are formed so as to be integrated with the contacts CT2 and electrically coupled to the impurity diffusion regions DFR. On the other hand, the contacts CT2 each made of the thin film of polysilicon embedded in the through hole are formed such that the upper surfaces thereof are exposed.

Figure 40:
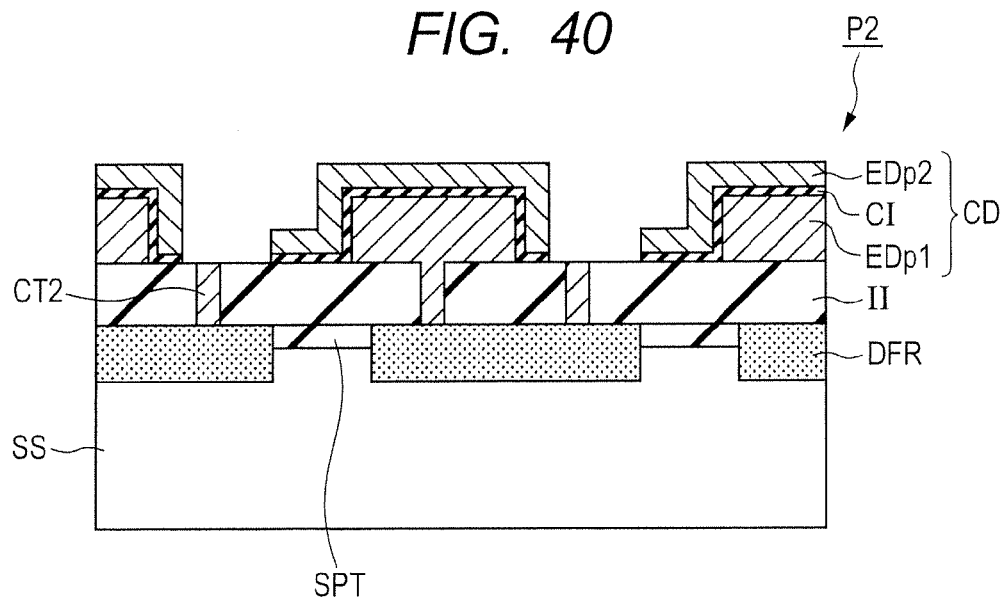
FIG. 40 is a schematic cross-sectional view showing a third step of the manufacturing method of the semiconductor device in the second example of Embodiment 3.

Referring to FIG. 40, the insulating film CI as a dielectric layer made of, e.g., a silicon oxide film is formed by, e.g., a typical thermal oxidation method so as to cover the upper surface of the structure formed in the step of FIG. 39. The insulating film CI is patterned by a typical photoengraving technique and etching so as to cover at least parts of the upper surfaces and side surfaces of the first electrodes EDp1 and cover the upper surface of the interlayer insulating film II in the regions adjacent to the first electrodes EDp1 in the direction along the main surface of the supporting substrate SS. However, the insulating film CI need not necessarily have such a form and may also be formed so as to, e.g., cover at least parts of the upper surfaces of the first electrodes EDp1.

Next, a semiconductor layer containing a conductive impurity such as a polysilicon layer is formed by, e.g., a CVD method so as to cover the upper surface of the structure formed in the previous step. The semiconductor layer is patterned by a typical photoengraving technique and etching to form the second electrodes EDp2. In FIG. 40, the second electrodes EDp2 are formed so as to cover the upper surfaces of the insulating films CI. However, the second electrodes EDp2 need not necessarily have such a form and may also be formed so as to, e.g., cover at least parts of the upper surfaces of the insulating films CI.

Figure 41:
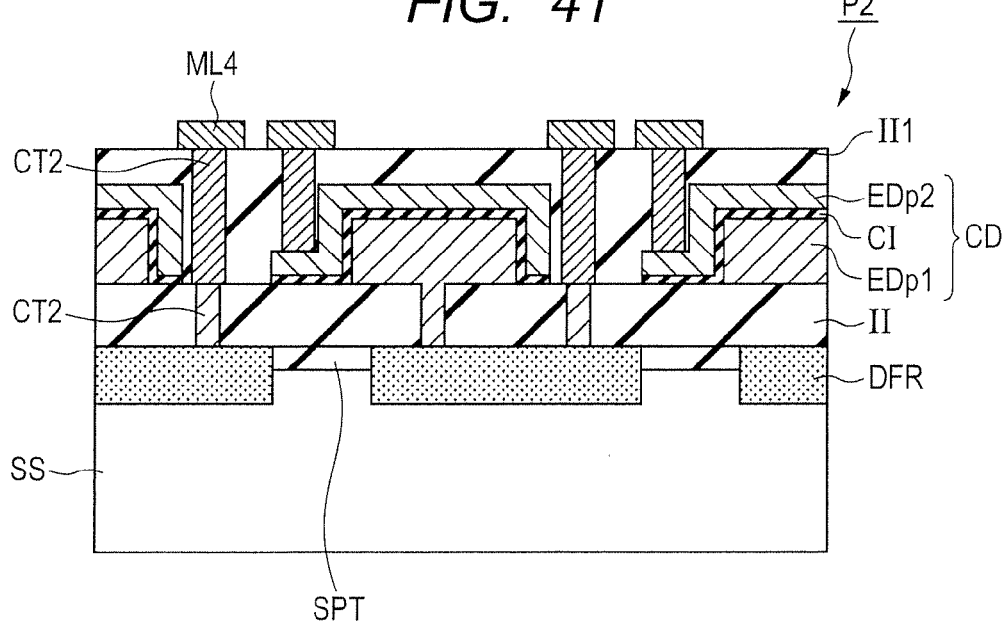
FIG. 41 is a schematic cross-sectional view showing a fourth step of the manufacturing method of the semiconductor device in the second example of Embodiment 3.

Referring to FIG. 41, the interlayer insulating film Ill (interlayer insulating film II in FIG. 37) is formed so as to cover the upper surface of the structure formed in the step of FIG. 40. Through holes are formed so as to extend through the interlayer insulating film II1 and reach the contacts CT2 or the second electrodes Edp2. A metal material such as tungsten is embedded in the through holes to form the contacts CT2 in the interlayer insulating film II1. In addition, in the same manner as in the step of, e.g., FIG. 30, the interconnect layers ML4 are formed by, e.g., a typical sputtering method, a typical photoengraving technique, and etching to cover the upper surfaces of the contacts CT2

Next, the function/effect of the present embodiment will be described.

In the present embodiment also, in the same manner as in Embodiments 1 and 2, when the second substrate P2 is formed, the capacitor elements CD are formed first and then layers such as the interconnect layers ML4 (formed at a temperature lower than that for the metal material) are formed. Accordingly, in the step of forming the electrodes of the capacitor elements CD, processing at a temperature higher than that used in the step of forming a metal material such as that of each of the interconnect layers ML4 can be used. Therefore, it is possible to apply the solid-state image sensing element having the highly reliable capacitor elements CD having the first and second electrodes each formed of polysilicon to a solid-state image sensing element which has been highly integrated by joining together two substrates. Each of the capacitor elements CD having the electrodes formed of polysilicon is allowed to have performance higher than that of the capacitor element CD having electrodes each formed of, e.g., a metal layer.

Note that the first and second light blocking films LSF1 and LSF2 in the present embodiment also achieve the effect of inhibiting light from traveling toward the capacitor elements CD similarly to the first and second light blocking films LSF1 and LSF2 in each of Embodiments 1 and 2.

Embodiment 4

Figure 42:
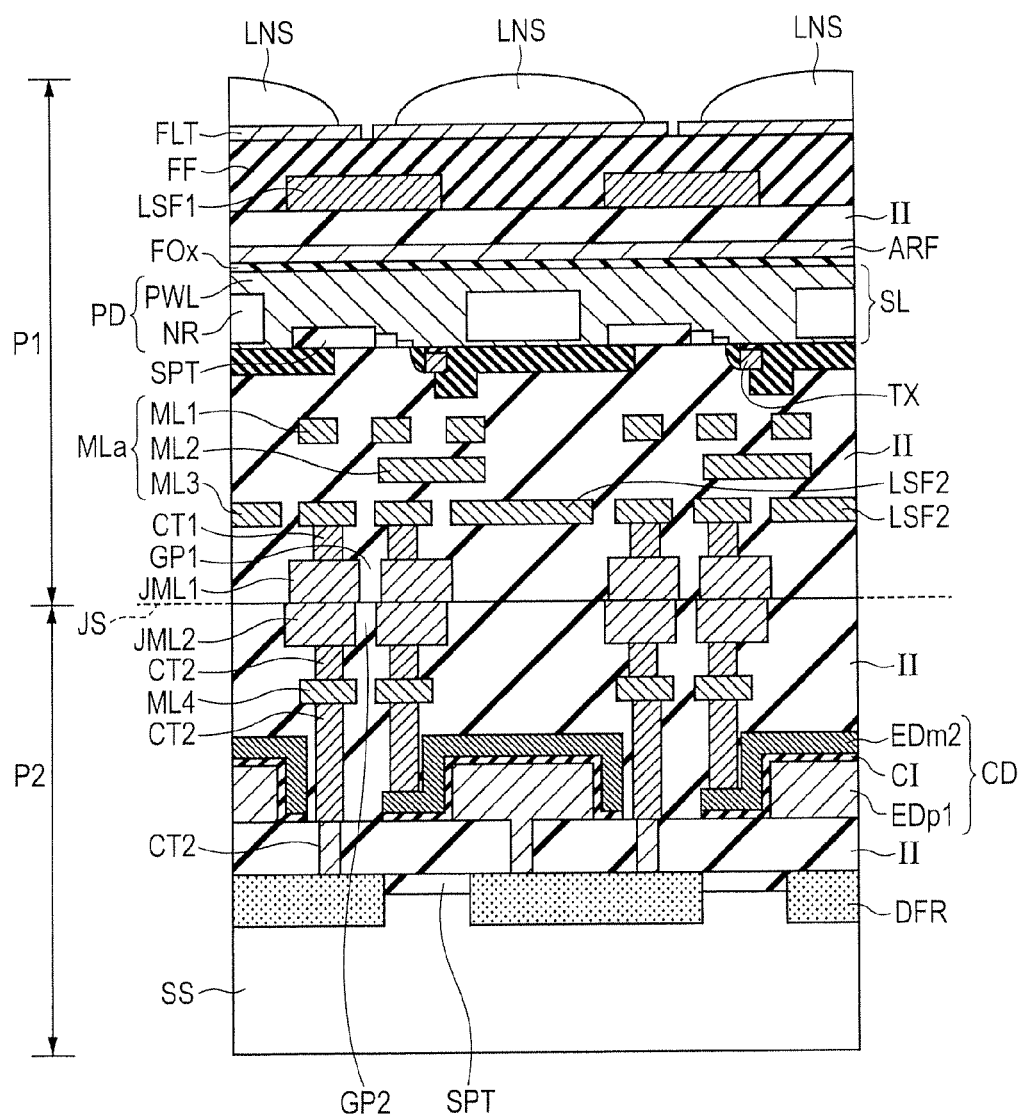
FIG. 42 is a schematic cross-sectional view showing a configuration of the portion of a semiconductor device in Embodiment 4 along the line IV-IV in FIG. 3.

Referring to FIG. 42, in a solid-state image sensing element as a semiconductor device of the present embodiment, instead of the second electrodes EDp2 of the solid-state image sensing element of FIG. 37, the second electrodes EDm2 each as a metal layer made of, e.g., titanium nitride are formed. In this point, FIG. 42 is different from FIG. 37.

Thus, as the second electrodes EDm2, instead of a pattern of the polysilicon layer, a pattern of a metal layer may also be used. The metal layer is formed under temperature conditions lower than those for the polysilicon layer, but this presents no problem unless, in each of the steps for forming the second substrate P2 after the second electrodes EDm2 are formed and the step of joining together the first and second substrates P1 and P2, the processing temperature in the step of forming the second electrodes EDm2 is exceeded.

The configuration of the present embodiment is otherwise substantially the same as the configuration of Embodiment 1 shown in FIG. 5. Therefore, like components are designated by like reference numerals and a description thereof will not be repeated.

Figure 43:
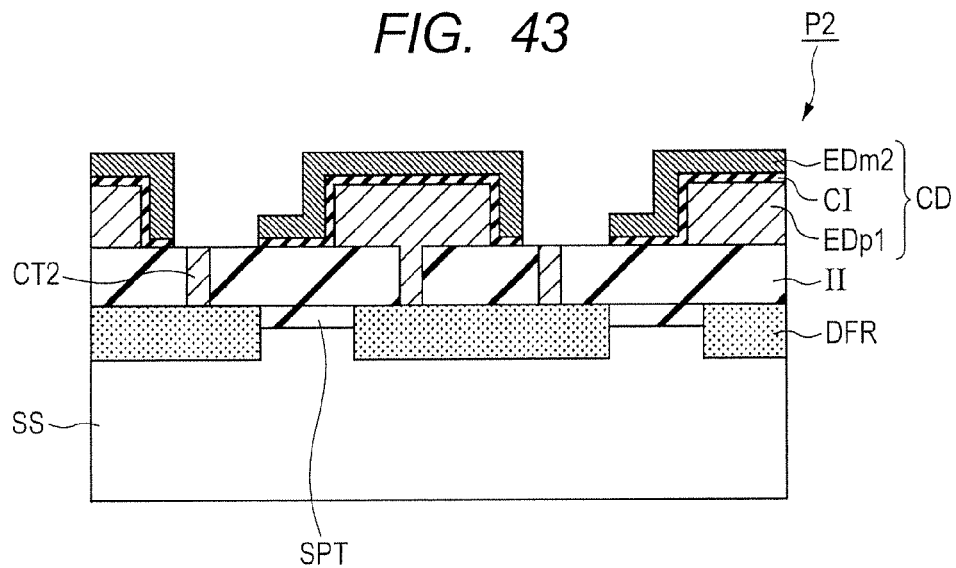
FIG. 43 is a schematic cross-sectional view showing a first step of a manufacturing method of the semiconductor device in Embodiment 4.
Figure 44:
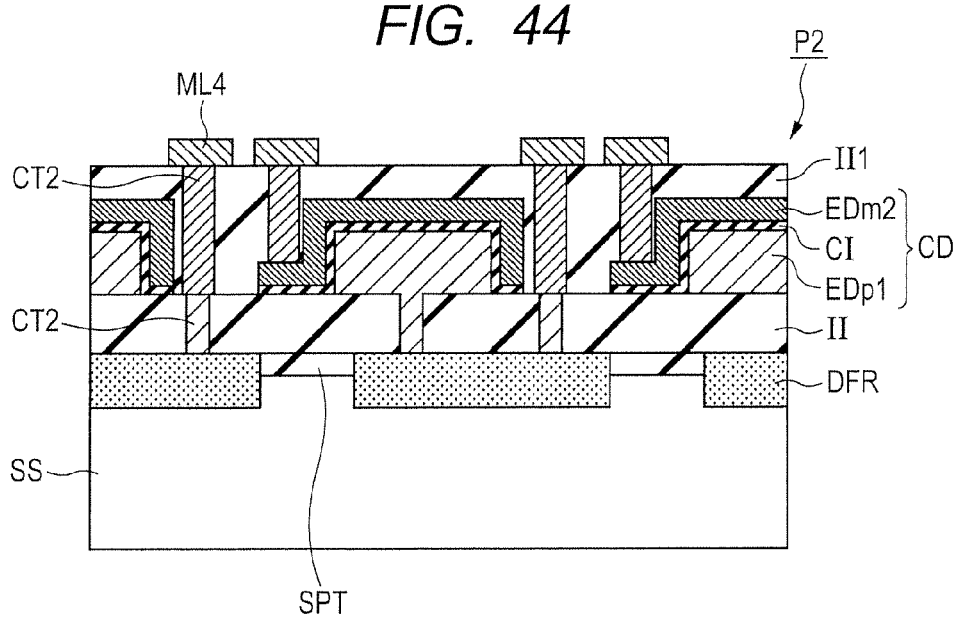
FIG. 44 is a schematic cross-sectional view showing a second step of the manufacturing method of the semiconductor device in Embodiment 4.

Referring to FIGS. 43 to 44, in a manufacturing method of the solid-state image sensing element as a manufacturing method of the semiconductor device of the present embodiment, the second electrodes EDm2 each as the metal layer is used as a replacement for the second electrodes EDp2 formed in the manufacturing method in the second example of Embodiment 3 shown in FIGS. 40 and 41. The manufacturing method in the present embodiment is otherwise basically the same as the manufacturing method in the second example of Embodiment 3. For example, the second electrodes EDm2 each as the metal layer made of titanium nitride are preferably formed by, e.g., a typical CVD method.

Embodiment 5

Figure 45:
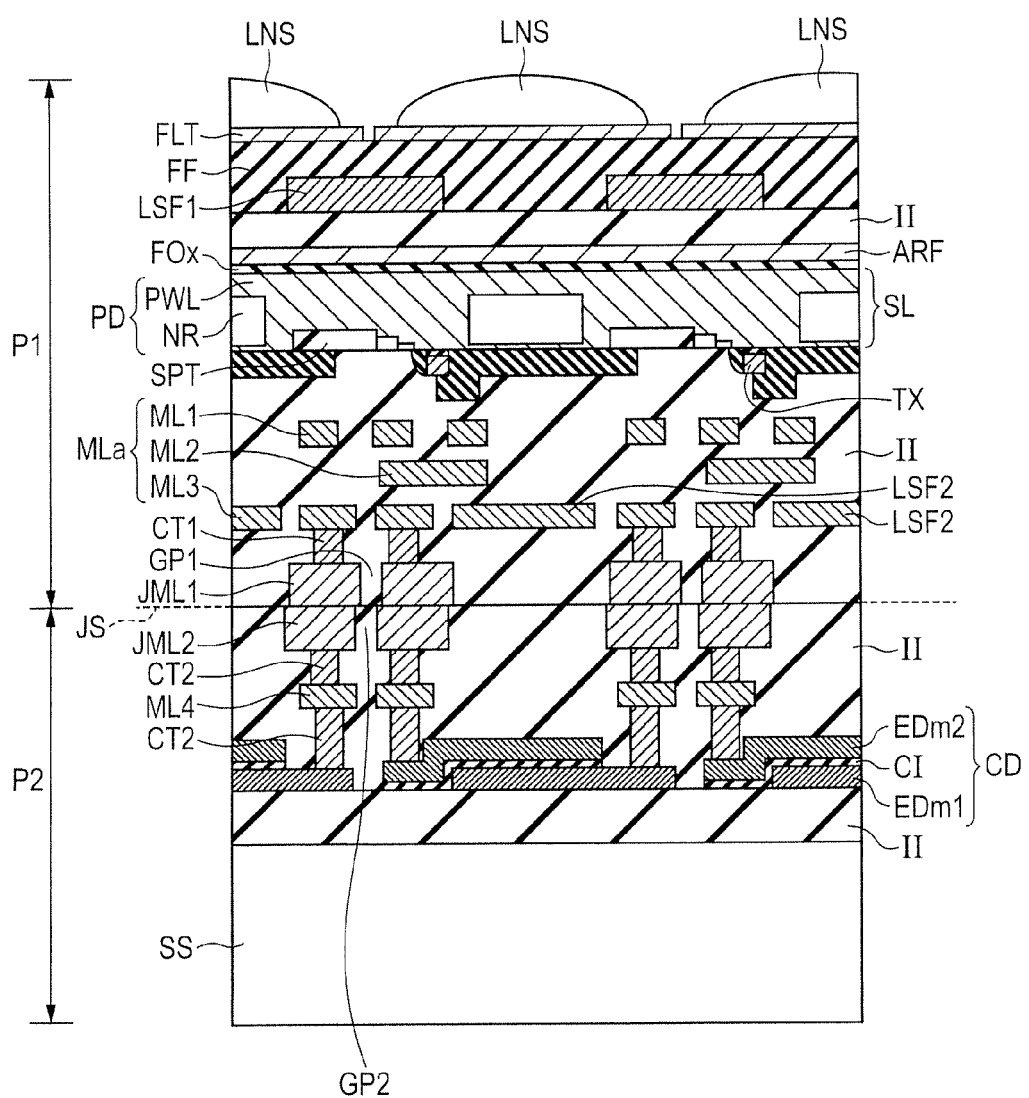
FIG. 45 is a schematic cross-sectional view showing a configuration of the portion of a semiconductor device in a first example of Embodiment 5 along the line IV-IV in FIG. 3.

Referring to FIG. 45, in a solid-state image sensing element as a semiconductor device in a first example of the present embodiment, each of the first and second electrodes EDm1 and EDm2 forming the capacitor elements CD is formed of a metal layer and each of the capacitor elements CD has a so-called MIM-type stacked structure. That is, the capacitor element CD has the first electrode EDm1 as the metal layer, the dielectric layer CI covering at least a part of the upper surface of the first electrode EDm1, and the second electrode EDm2 as the metal layer covering at least a part of the upper surface of the dielectric layer CI.

Each of the capacitor elements CD in FIG. 45 is a MIM-type capacitor element which two-dimensionally uses the first and second electrodes Edm1 and EDm2 each as the metal layer. That is, between the first and second electrodes EDm1 and Edm2, only the thin dielectric layer CI is interposed. The first and second electrodes EDm1 and EDm2 two-dimensionally extend so as to occupy relatively large areas in planar view.

Note that the configuration of the present embodiment is otherwise substantially the same as the configuration in the first example of Embodiment 3 shown in, e.g., FIG. 33. Therefore, like components are designated by like reference numerals and a description thereof will not be repeated. The second substrate P2 in FIG. 45 may also have the same form (not having the interconnect layers ML4) as that of the second substrate P2 in FIG. 4.

Next, using FIGS. 46 and 47, a description will be given of a manufacturing method of the solid-state image sensing element as a manufacturing method of the semiconductor device in the first example of the present embodiment. Here, in particular, a description will be given of a manufacturing method of the second substrate P2 in the foregoing first example.

Figure 46:
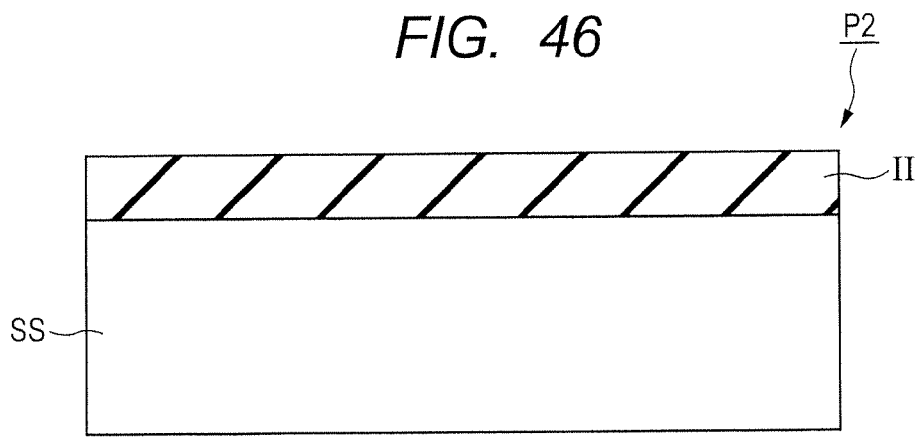
FIG. 46 is a schematic cross-sectional view showing a first step of a manufacturing method of the semiconductor device in the first example of Embodiment 5.

Referring to FIG. 46, in the same manner as in, e.g., the step of FIG. 34, over one of the main surfaces of the supporting substrate SS, the interlayer insulating film II as, e.g., a silicon oxide film is formed.

Figure 47:
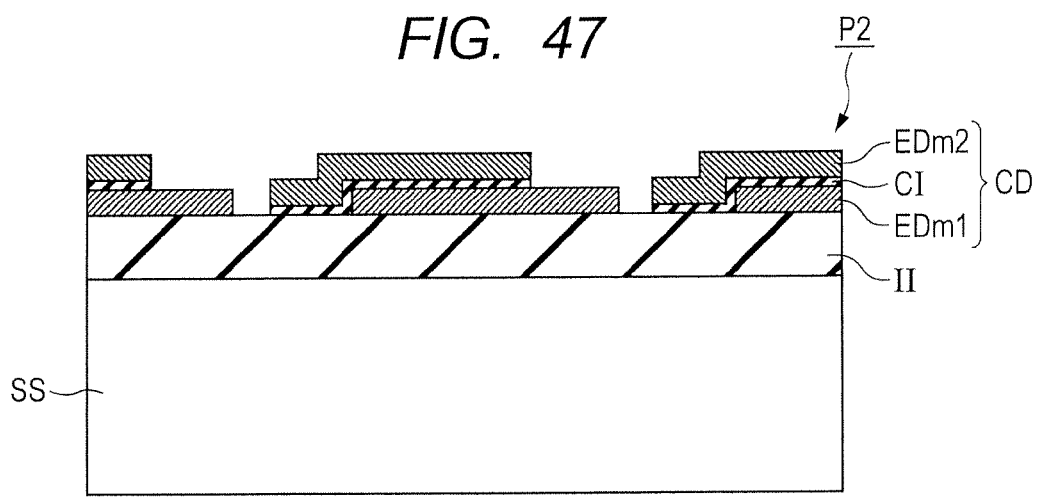
FIG. 47 is a schematic cross-sectional view showing a second step of the manufacturing method of the semiconductor device in the first example of Embodiment 5.

Referring to FIG. 47, over the interlayer insulating film II, a metal layer of titanium nitride or the like is formed by, e.g., a CVD method. The metal layer is patterned by a typical photoengraving technique and etching to form the first electrodes EDm1. Then, the insulating film CI as a dielectric layer made of a silicon oxide film or the like is formed by, e.g., a typical thermal oxidation method so as to cover the upper surface of the resulting structure. The insulating film CI1 is patterned so as to cover at least a part of the upper surface of each of the first electrodes EDm1. Then, a metal layer of titanium nitride or the like is formed by, e.g., a CVD method so as to cover the upper surface of the structure formed in the previous step. The metal layer is patterned so as to cover at least a part of the upper surface of each of the insulating films CI to form the second electrodes EDm2. Thus, the capacitor elements CD in the first example of the present embodiment are formed.

Figure 48:
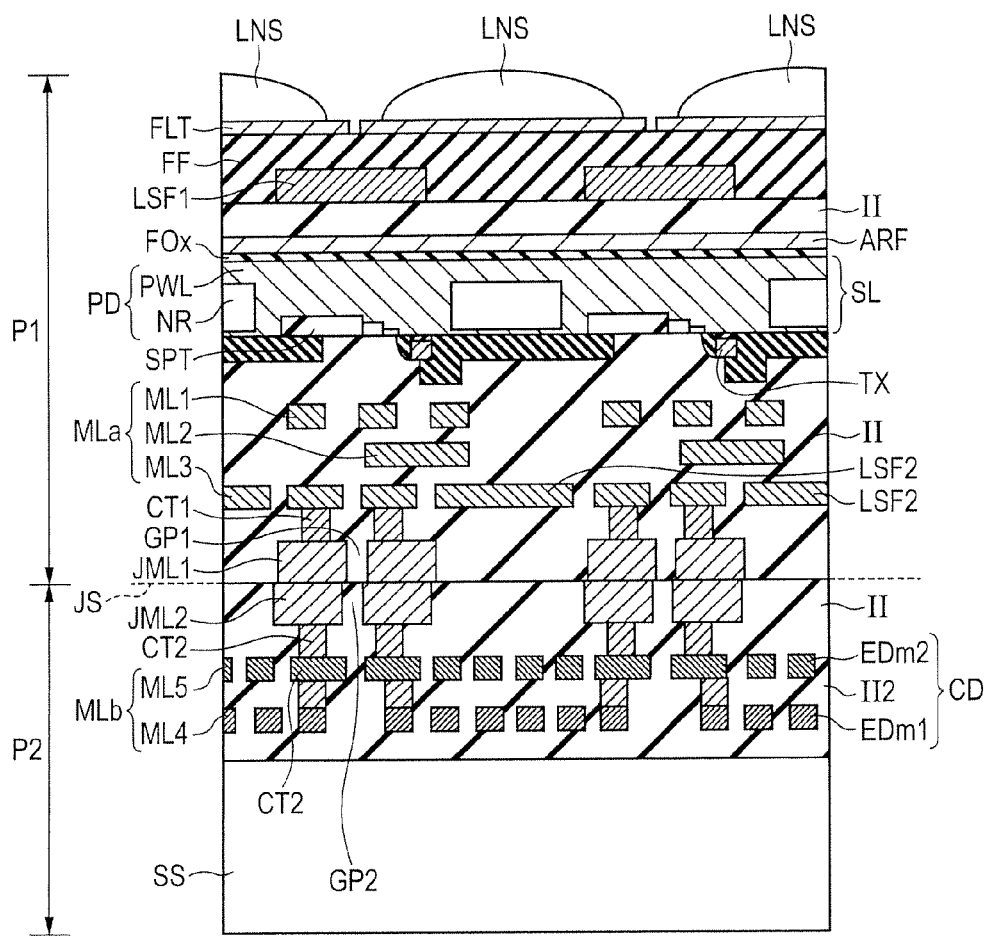
FIG. 48 is a schematic cross-sectional view showing a configuration of the portion of a semiconductor device in a second example of Embodiment 5 along the line IV-IV in FIG. 3.

Referring to FIG. 48, in a solid-state image sensing element as a semiconductor device in a second example of the present embodiment, in the same manner as in the solid-state image sensing element in the first example in FIG. 45, each of the first and second electrodes EDm1 and EDm2 forming the capacitor elements CD is formed of a metal film and each of the capacitor elements CD has a so-called MIM-type stacked structure.

Each of the capacitor elements CD in FIG. 48 is called a fringe capacitor formed of a pair of interconnect layers opposed to each other and an interlayer insulating film as a dielectric layer interposed between the pair of interconnect layers. Specifically, on the front side (lower side) of the interlayer insulating film II2 as a part of the second interlayer insulating film II (made of, e.g., a silicon oxide film) in the second substrate P2, a pattern of the plurality of interconnect layers ML4 is formed such that the interlayer insulating film II2 is interposed therebetween. On the other hand, on the back side (upper side) of the interlayer insulating film II2, a pattern of the plurality of interconnect layers ML5 is formed such that the interlayer insulating film II2 is interposed therebetween. The interconnect layers ML4 and ML5 are each included in second interconnect layers MLb formed of a generally known metal material (such as aluminum or tungsten) similarly to the first interconnect layers MLa including the interconnect layers ML1 to ML3 mentioned above.

When attention is focused on one of the plurality of interconnect layers ML4 formed to be spaced apart from each other, the interconnect layer ML5 is opposed to the interconnect layer ML4 from immediately above (on the back side thereof) in a direction perpendicular to the junction surface JS so as to overlap the interconnect layer ML4 in planar view. Between the foregoing interconnect layer ML4 and the interconnect layer ML5 opposed thereto, the second interlayer insulating film II is interposed.

It is assumed that the interconnect layer ML4 (as one of the layers forming each of the second interconnect layers MLb) corresponds to the first electrode EDm1, the interconnect layer ML5 (as another of the layers forming the second interconnect layer MLb other than the foregoing layer forming the second interconnect layer MLb) corresponds to the second electrode EDm2, and the interlayer insulating film between the two electrodes corresponds to the interlayer insulating film II2 (as the dielectric layer forming the second interlayer insulating film II) covering at least a part of the upper surface of the first electrode EDm1. Thus, the two electrodes and the interlayer insulating film form each of the capacitor elements CD.

However, any of the interconnect layers ML4 may also have a configuration electrically coupled to the interconnect layer ML5 by the contact CT2 interposed between the interconnect layer ML4 and the interconnect layer ML5 located immediately thereabove.

Note that the configuration in the second example of the present embodiment shown in FIG. 48 is otherwise substantially the same as that in the first example of the present embodiment shown in FIG. 45. Therefore, like components are designated by like reference numerals and a description thereof will not be repeated.

Next, using FIGS. 49 to 51, a description will be given of a manufacturing method of the solid-state image sensing element as a manufacturing method of the semiconductor device in the second example of the present embodiment. Here, in particular, a description will be given of a manufacturing method of the second substrate P2 in the foregoing second example.

Figure 49:
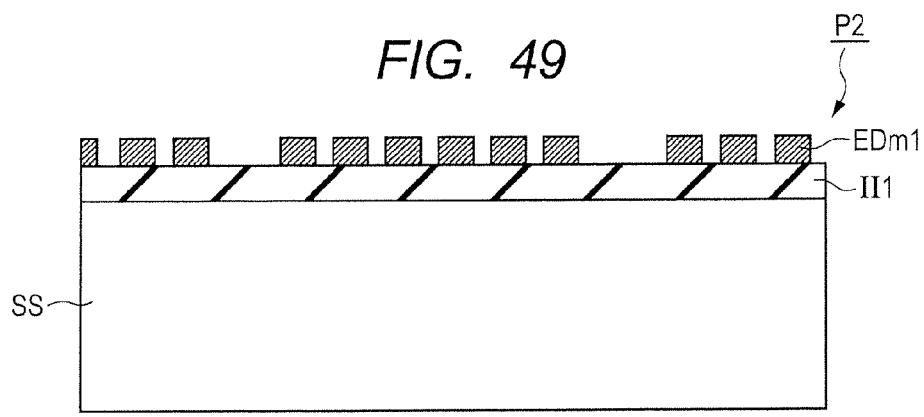
FIG. 49 is a schematic cross-sectional view showing a first step of a manufacturing method of the semiconductor device in the second example of Embodiment 5.

Referring to FIG. 49, in the same manner as in, e.g., the step of FIG. 46, over one of the main surfaces of the supporting substrate SS, the interlayer insulating film II1 such as, e.g., a silicon oxide film is formed. Over the interlayer insulating film II, by, e.g., a typical sputtering method, a typical photoengraving technique, and etching, the first electrodes EDm1 each made of a thin film of, e.g., aluminum is formed. The first electrodes EDm1 are the interconnect layers ML4 each as one of the plurality of (layered) interconnect layers forming each of the second interconnect layers MLb in FIG. 48.

Referring to FIG. 50, over the interlayer insulating film II1, the interlayer insulating film II2 made of, e.g., a silicon oxide film is formed by, e.g., a typical CVD method so as to cover the upper surfaces of the interconnect layers ML4. Then, using a typical photoengraving technique and a typical etching technique, contact holes are formed in the interlayer insulating film II2 so as to reach the upper surfaces of some of the interconnect layers ML4. Then, a thin film of, e.g., tungsten is formed so as to be embedded in the contact holes described above to form the contacts CT2.

The portions of the interlayer insulating film II formed so as to cover the upper surfaces (at least parts thereof) of the interconnect layers ML4 which are not removed to form the contacts CT2 serve as the dielectric layers of the capacitor elements CD to be formed eventually.

Referring to FIG. 51, by, e.g., a typical sputtering method, a typical photoengraving technique, and etching, the second electrodes Edm2 each made of a thin film of, e.g., aluminum are formed so as to cover the upper surfaces of the interlayer insulating film II2 and the contacts CT2. Each of the second electrodes EDm2 corresponds to the interconnect layer ML5 as one of the plurality of interconnect layers forming each of the second interconnect layers MLb in FIG. 48 which is other than the foregoing interconnect layer ML4.

A combination of the foregoing interlayer insulating films II1 and II2 corresponds to the interlayer insulating film II (second interlayer insulating film) in the second substrate P2 shown in FIG. 48. The second interconnect layer MLb as the second interlayer insulating film includes the plurality of interconnects which are stacked such that the interlayer insulating film II is interposed therebetween. The interlayer insulating film II and the interconnect layers ML4 and ML5 formed as one layer and another layer in the second interconnect layer MLb form each of the capacitor elements CD.

The first and second light blocking films LSF1 and LSF2 in the present embodiment also achieve the effect of inhibiting light from traveling toward the capacitor elements CD, similarly to the first and second light blocking films LSF1 and LSF2 in each of Embodiments 1 and 2. In the present embodiment in which each of the first and second electrodes is formed as a metal layer also, the capacitor elements CD are formed in the second substrate P2 and then the second substrate P2 is joined to the first substrate P1 formed with the photodiodes PD. This allows a highly reliable solid-state image sensing element to be formed without being bound by processing temperatures during the formation of the individual components.

Embodiment 6

Figure 52:
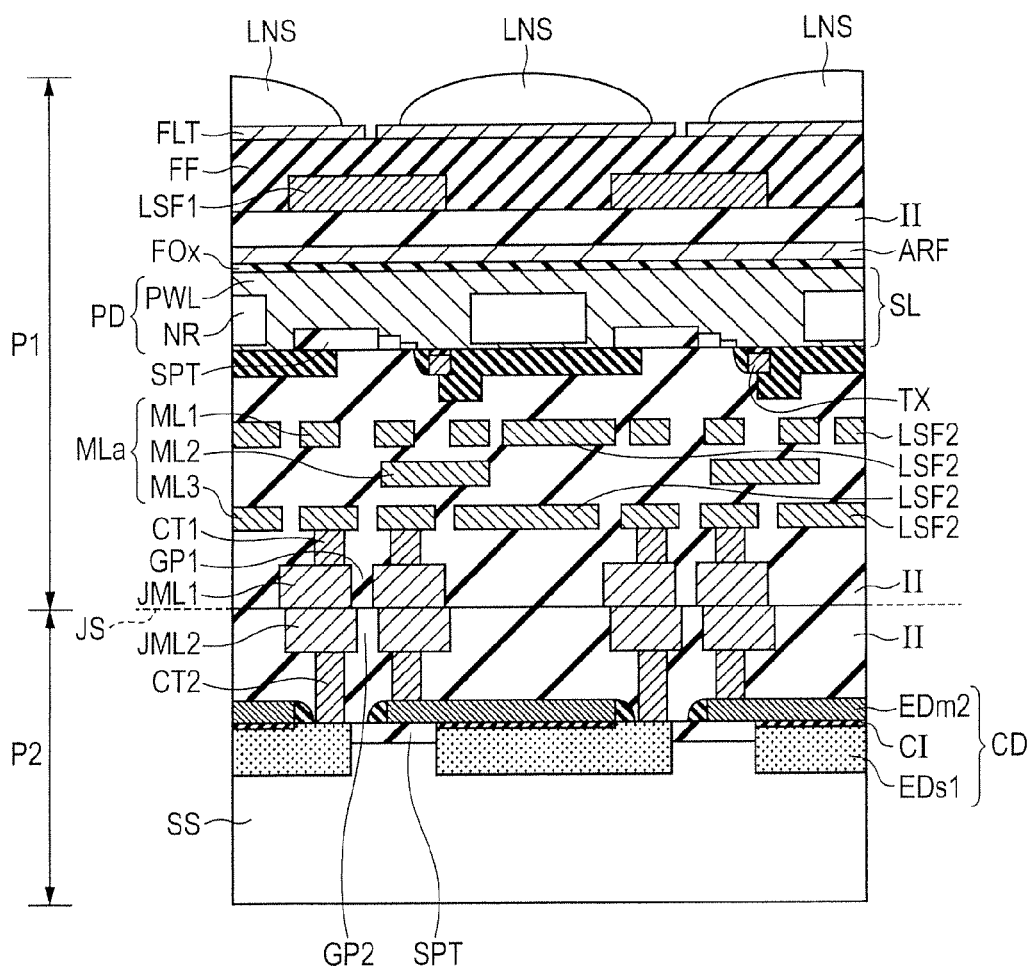
FIG. 52 is a schematic cross-sectional view showing a configuration of the portion of a semiconductor device in Embodiment 6 along the line IV-IV in FIG. 3.

Referring to FIG. 52, in a solid-state image sensing element as a semiconductor device in the present embodiment, the second light blocking film LSF2 formed in the first substrate P1 is formed not only as some of the interconnect layers ML3 but also as some of the interconnect layers ML1. Note that the second light blocking film LSF2 may also be formed only as some of the interconnect layers ML1.

Thus, the present embodiment is different from Embodiment 1 in that, in the first substrate P1, of the first interconnect layers MLa each including the plurality of (e.g., three) interconnect layers ML1 to ML3 which are stacked such that the first interlayer insulating film II is interposed therebetween, some of the interconnect layers ML1 closest to the photodiodes PD are used as the second light blocking film SF2.

Note that the configuration of the present embodiment is otherwise substantially the same as that of Embodiment 1 shown in FIG. 4. Therefore, like components are designated by like reference numerals and a description thereof will not be repeated.

Next, using FIG. 53, a description will be given of a manufacturing method of the solid-state image sensing element as a manufacturing method of the semiconductor device of the present embodiment. Here, in particular, a description will be given of a manufacturing method of the first substrate P1.

Figure 53:
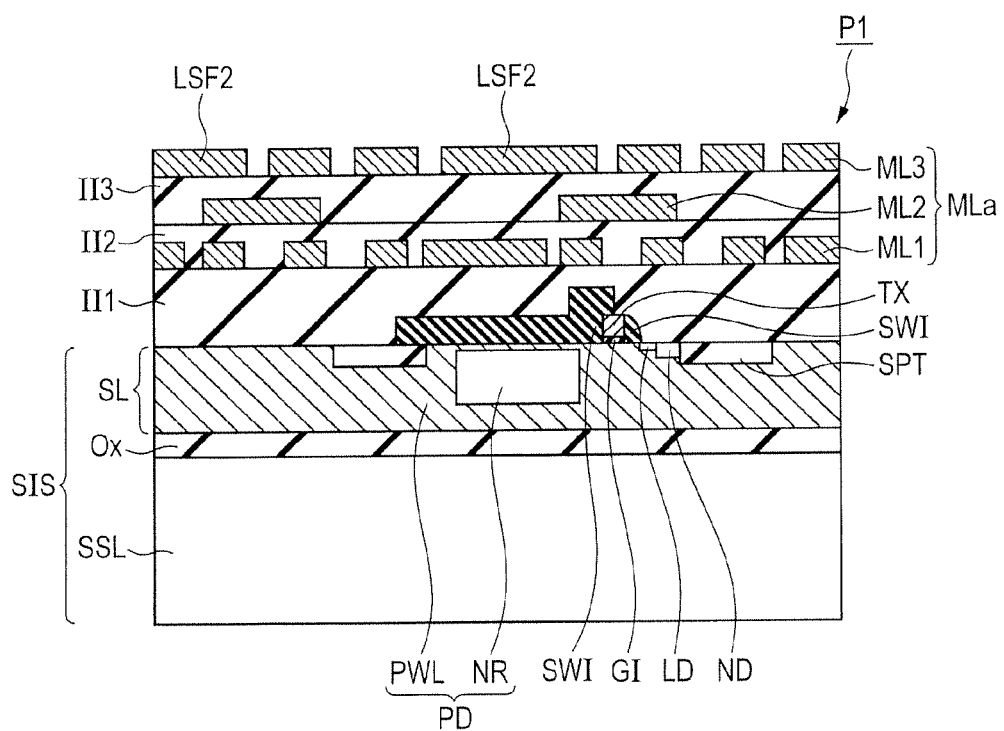
FIG. 53 is a schematic cross-sectional view showing a first step of a manufacturing method of the semiconductor device in Embodiment 6.

Referring to FIG. 53, basically the same processing as in FIGS. 16 to 20 in Embodiment 1 is performed. That is, after the same processing as in each of the steps shown in FIGS. 16 to 19 is performed, the interlayer insulating film Il1 is formed and a pattern of the interconnect layers ML1 is formed using a typical sputtering method, a typical photoengraving technique, and etching so as to cover the upper surface of the interlayer insulating film II1. Then, in the same manner as in the steps of forming the interlayer insulating film II1 and the interconnect layers ML1, the interlayer insulating films II2 and II3 and the interconnect layers ML2 and ML3 are formed. Thus, the interlayer insulating films II1 to II3 as the first interlayer insulating film II and the plurality of interconnect layers ML1 to ML3 which are stacked such that the interlayer insulating films II1 to II3 are interposed therebetween are formed.

Here, some of the interconnect layers ML1 closest to the photodiodes PD are formed so as to overlap the photodiodes PD in planar view to be formed as the second light blocking film LSF2.

Next, the function/effect of the present embodiment will be described.

When the second light blocking film LSF2 is formed as some of the interconnect layers ML1 closest to the photodiodes PD as in the present embodiment, light reflected by the second light blocking film LSF2 due to the light blocking function thereof is more likely to be incident again on the photodiodes PD than when the distance from the second blocking film LSF2 to each of the photodiodes PD is large. This enhances the use efficiency of the light incident on the photodiodes PD to enhance the photoelectric converting function of the photodiodes PD.

Note that the second light blocking film LSF2 may also be formed as some of the interconnect layers ML2 or, alternatively, the second light blocking film LSF2 may also be formed as some of each of the interconnect layers ML1 to ML3 forming the interconnect layers MLa.

Embodiment 7

Figure 54:
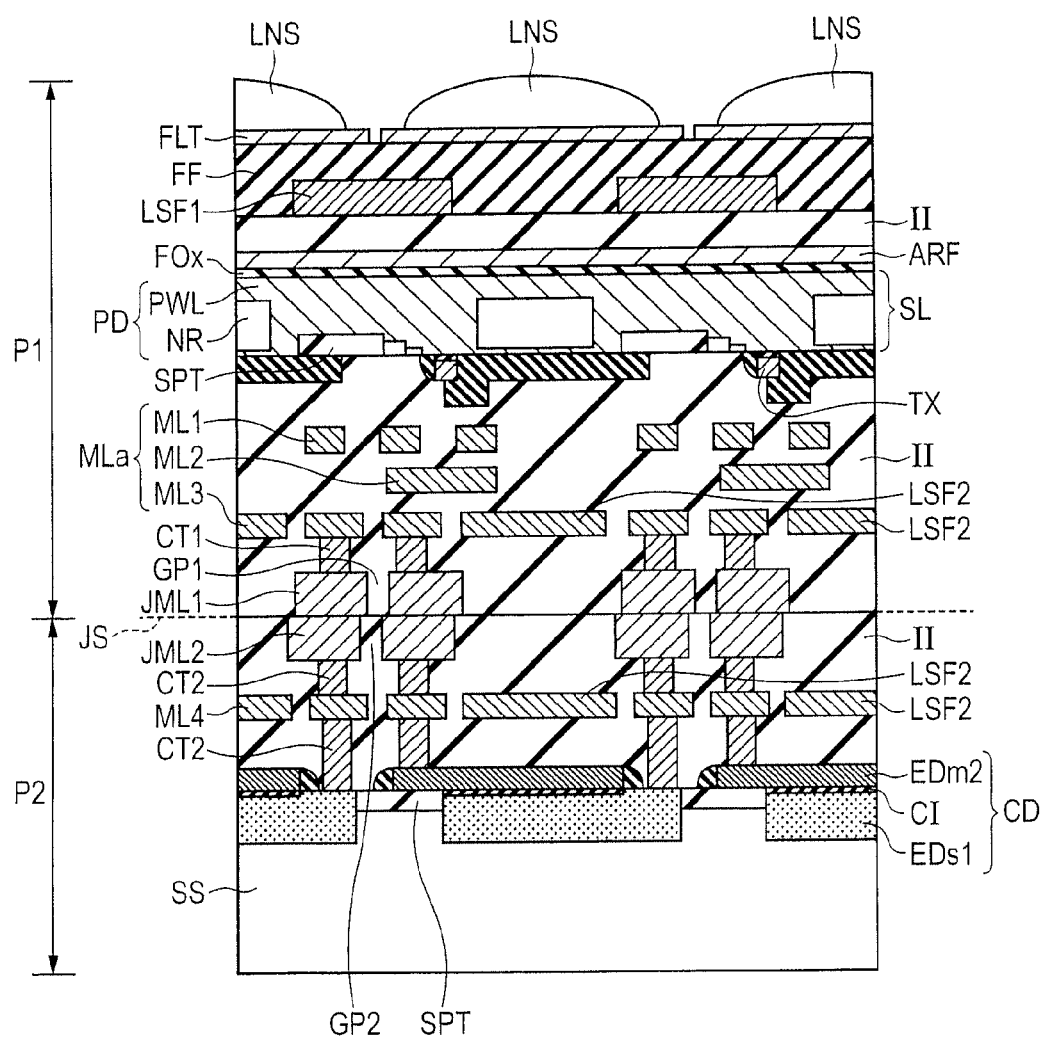
FIG. 54 is a schematic cross-sectional view showing a configuration of the portion of a semiconductor device in Embodiment 7 along the line IV-IV in FIG. 3.

Referring to FIG. 54, in a solid-state image sensing element as a semiconductor device of the present embodiment, the second light blocking film LSF2 is placed as some of the interconnect layers ML1 in the first substrate P1 and also as some of the interconnect layers ML4 in the second substrate P2. That is, in the present embodiment, the second light blocking film LSF2 is placed in each of the first substrate P1 and the second substrate P2.

Thus, the second light blocking film LSF2 may also be placed in each of the first substrate P1 and the second substrate P2. This further enhances the effect of inhibiting light from traveling toward the capacitor elements CD achieved by the second light blocking film LSF2.

Finally, a description will be given of the gist of an embodiment.

Figure 55:
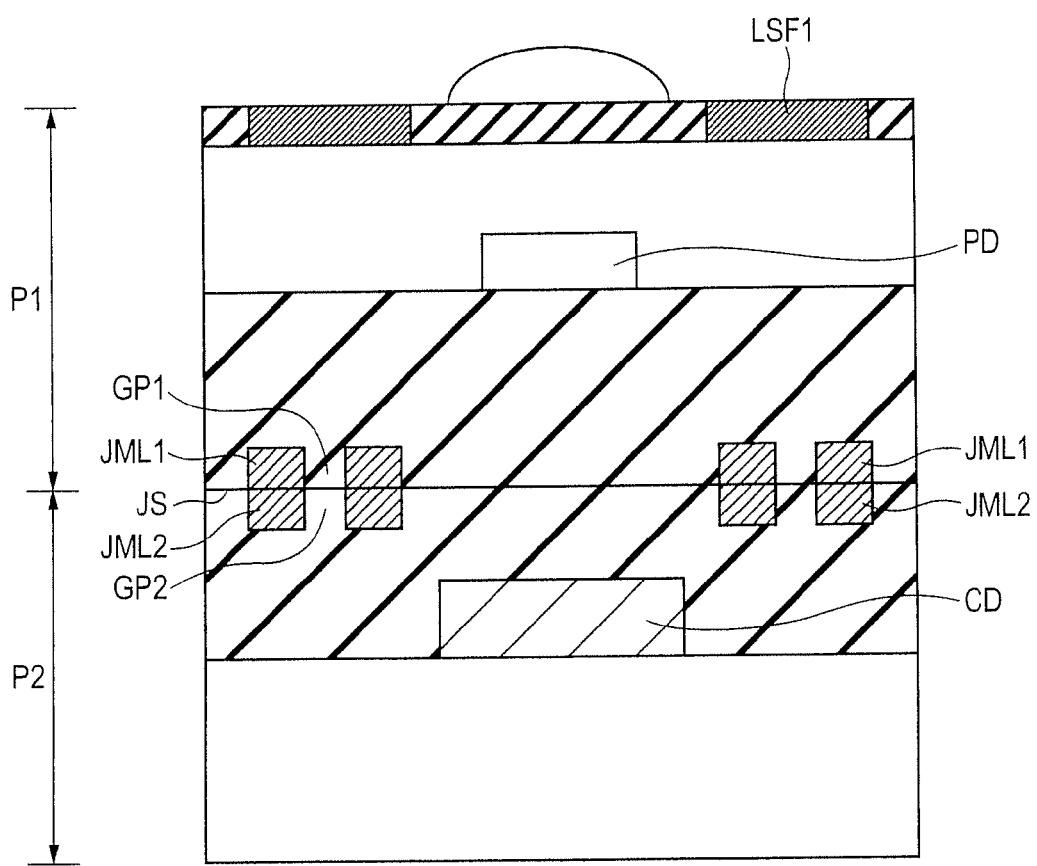
FIG. 55 is a first example of a schematic cross-sectional view showing the gist of a configuration of an embodiment.

Referring to FIG. 55, the outline of a solid-state image sensing element as a semiconductor device of the embodiment is as follows. The solid-state image sensing element includes the first substrate P1 having the photodiodes PD in each of which photoelectric conversion is performed, and the second substrate P2 having the capacitor elements CD which store therein charges resulting from the photoelectric conversion in the photodiodes PD. The first substrate P1 and the second substrate P2 are joined together at the junction surface JS so as to be integrated with each other. The photodiodes PD and the capacitor elements CD are placed so as to be opposed to each other in a direction perpendicular to the junction surface JS. The capacitor elements CD are placed at positions away from the junction surface JS. At the surface of the first substrate P1 corresponding to the junction surface JS with the second substrate P2, the first coupling portions JML1 are formed. At the surface of the second substrate P2 corresponding to the junction surface JA with the first substrate P1, the second coupling portions JML2 are formed. The first gap portion GP1 interposed between the plurality of first coupling portions JML1 and the second gap portion GP2 interposed between the plurality of second coupling portions JML2 which are present outside regions two-dimensionally overlapping the photodiodes PD are placed so as to overlap the first light blocking films LSF1 in the direction perpendicular to the junction surface JS.

Figure 56:
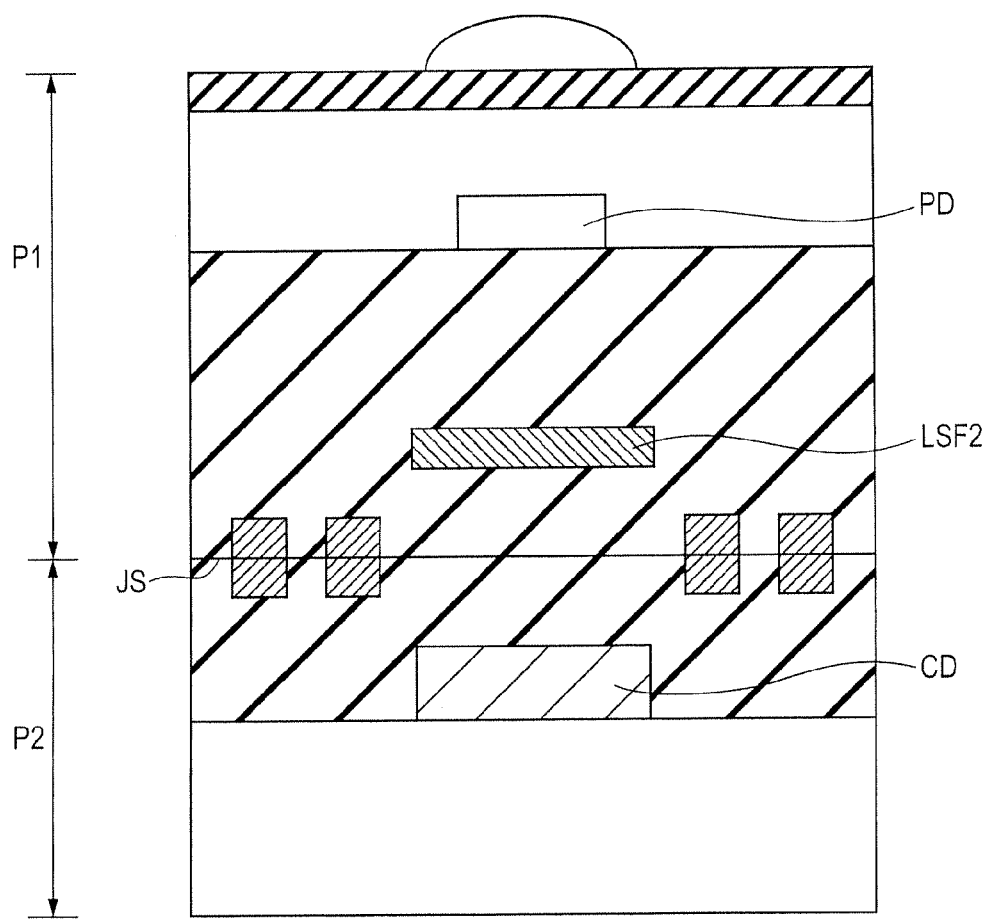
FIG. 56 is a second example of the schematic cross-sectional view showing the gist of the configuration of the embodiment.

Referring to FIG. 56, the outline of a solid-state image sensing element as a semiconductor device of another embodiment is as follows. In the same manner as in FIG. 55, the first substrate P1 having the photodiodes PD and the second substrate P2 having the capacitor elements CD are joined together at the junction surface JS. The photodiodes PD and the capacitor elements CD are placed so as to be opposed to each other. The second light blocking film LSF2 is placed immediately under the photodiodes PD so as to overlap the second light blocking film LSF2 in a direction perpendicular to the junction surface JS.

A part of the content of the description of other embodiments will be described below, though the following description partly overlaps the description given above.

(1) A semiconductor device includes a first substrate forming at least a part of each of a plurality of pixels including a plurality of light receiving elements in each of which photoelectric conversion is performed, and a second substrate having capacitor elements which store therein charges supplied from the light receiving elements. The foregoing first substrate and second substrate are joined together at a junction surface therebetween so as to be integrated with each other. The foregoing light receiving elements and capacitor elements are placed so as to be opposed to each other in a direction perpendicular to the junction surface. The foregoing capacitor elements are at positions away from a surface of the second substrate corresponding to the junction surface. The foregoing first substrate includes a light-receiving-element-side light blocking film placed on a side of each of the light receiving elements where light is supplied to the light receiving element so as to block the light supplied to the light receiving element, and a plurality of first coupling portions formed at a surface of the first substrate corresponding to the junction surface so as to electrically couple the first substrate and the second substrate to each other. The foregoing second substrate includes a plurality of second coupling portions formed at the surface of the second substrate corresponding to the junction surface so as to be electrically coupled to the first coupling portions. A first gap portion interposed between the plurality of first coupling portions and a second gap portion interposed between the plurality of second coupling portions, each of which is present outside regions overlapping the foregoing light receiving elements in planar view, are placed so as to overlap the light-receiving-element-side light blocking film in the direction perpendicular to the junction surface at which the first substrate and the second substrate are joined together. Each of the foregoing capacitor elements includes a first electrode as a metal layer, a dielectric layer covering at least a part of an upper surface of the first electrode, and a second electrode as a metal layer covering at least a part of an upper surface of the dielectric layer.

(2) A semiconductor device includes a first substrate forming at least a part of each of a plurality of pixels including a plurality of light receiving elements in each of which photoelectric conversion is performed, and a second substrate having capacitor elements which store therein charges supplied from the light receiving elements. The foregoing first substrate and second substrate are joined together at a junction surface therebetween so as to be integrated with each other. The foregoing light receiving elements and capacitor elements are placed so as to be opposed to each other in a direction perpendicular to the junction surface. The foregoing capacitor elements are at positions away from a surface of the second substrate corresponding to the junction surface. The semiconductor device further includes a capacitor-element-side light blocking film which is provided so as to overlap the light receiving elements in the direction perpendicular to the foregoing junction surface and block light traveling from the light receiving elements toward the second substrate. The foregoing capacitor-element-side light blocking film is located between the light receiving elements and the capacitor elements in the direction perpendicular to the junction surface.

(3) In the semiconductor device in (2), the foregoing first substrate includes a plurality of first coupling portions formed at a surface of the first substrate corresponding to the junction surface so as to electrically couple the first substrate and the second substrate to each other. The foregoing second substrate includes a plurality of second coupling portions formed at the surface of the second substrate corresponding to the junction surface so as to be electrically coupled to the first coupling portions. The foregoing first substrate includes a light-receiving-element-side light blocking film placed on a side of each of the light receiving elements where light is supplied to the light receiving element so as to block the light supplied to the light receiving element. A first gap portion interposed between the plurality of first coupling portions and a second gap portion interposed between the plurality of second coupling portions, each of which is present outside regions overlapping the foregoing light receiving elements in planar view, are placed so as to overlap the light-receiving-element-side light blocking film in the direction perpendicular to the junction surface at which the first substrate and the second substrate are joined together.

(4) In the semiconductor device in (2), the foregoing capacitor-element-side light blocking film is placed in the first substrate. The foregoing first substrate includes a first interlayer insulating film, and a plurality of first interconnect layers stacked such that the first interlayer insulating film is interposed therebetween. A part of the one of the plurality of first interconnect layers which is closest to the light receiving elements is used as the capacitor-element-side light blocking film.

(5) In the semiconductor device in (2), each of the foregoing capacitor elements includes a first electrode as a semiconductor layer containing a conductive impurity, a dielectric layer covering at least a part of an upper surface of the first electrode, and a second electrode as a metal layer or a semiconductor layer containing a conductive impurity which covers at least a part of an upper surface of the dielectric layer. Note that each of the foregoing capacitor elements may also include a first electrode as a semiconductor region in a supporting substrate in which a conductive impurity is diffused, a dielectric layer covering at least a part of an upper surface of the first electrode, and a second electrode as a metal layer or a semiconductor layer containing a conductive impurity which covers at least a part of an upper surface of the dielectric layer.

(6) In the semiconductor device in (2), each of the foregoing capacitor elements includes a first electrode as a metal layer, a dielectric layer covering at least a part of an upper surface of the first electrode, and a second electrode as a metal layer covering at least a part of an upper surface of the dielectric layer.

(7) In the semiconductor device in (2), the foregoing second substrate includes a second interlayer insulating film, and a plurality of second interconnect layers formed such that the second interlayer insulating film is interposed therebetween. A portion including a first electrode as one of the plurality of stacked second interconnect layers, a dielectric layer as the second interlayer insulating film which covers at least a part of an upper surface of the first electrode, and a second electrode as another of the second interconnect layers which is other than the one of the second interconnect layers and covers at least a part of an upper surface of the dielectric layer is used as each of the capacitor elements.

(8) In a method of manufacturing a semiconductor device, a first substrate forming at least a part of each of a plurality of pixels including a plurality of light receiving elements in each of which photoelectric conversion is performed is provided first. A second substrate having capacitor elements which store therein charges supplied from the foregoing light receiving elements is provided. The foregoing first substrate and second substrate are joined together so as to be electrically coupled to each other. In the foregoing step of providing the first substrate, the light receiving elements are formed and first coupling portions are formed at a junction surface between the first substrate and the second substrate. In the foregoing step of providing the second substrate, the capacitor elements are formed in a supporting substrate and second coupling portions are formed at the junction surface between the second substrate and the first substrate. In the foregoing joining step, a surface of the first substrate corresponding to the junction surface and a surface of the second substrate corresponding to the junction surface are joined together so as to bring the first coupling portions formed in the first substrate and the second coupling portions formed in the second substrate into contact with each other. The capacitor elements formed in the foregoing second substrate are formed at positions away from the surface of the second substrate corresponding to the junction surface.

(9) In the method of manufacturing a semiconductor device in (8), in the step of providing the foregoing first substrate, a light-receiving-element-side light blocking film placed on a side of each of the light receiving elements where light is supplied to the light receiving element is further formed so as to block the light supplied to the light receiving element. A plurality of the foregoing first and second coupling portions are formed. In the foregoing step of forming the first coupling portions, a first gap portion interposed between the plurality of first coupling portions, which is present outside regions overlapping the light receiving elements in planar view, is formed so as to overlap the light-receiving-element-side light blocking film in a direction perpendicular to the junction surface at which the first substrate and the second substrate are joined together in the joining step. In the foregoing step of forming the second coupling portions, a second gap portion interposed between the plurality of second coupling portions, which is present outside regions overlapping the light receiving elements in planar view after the joining step, is formed so as to overlap the light-receiving-element-side light blocking film in the direction perpendicular to the junction surface at which the first substrate and the second substrate are joined together in the joining step.

(10) In the method of manufacturing a semiconductor device in (8), a capacitor-element-side light blocking film which blocks light traveling from the light receiving elements toward the second substrate is further formed so as to overlap the light receiving elements in the direction perpendicular to the junction surface. The foregoing capacitor-element-side light blocking film is formed between the light receiving elements and the capacitor elements in the direction perpendicular to the junction surface.

(11) In the method of manufacturing a semiconductor device in (10), the capacitor-element-side light blocking film is formed so as to completely overlap the light receiving elements in the direction perpendicular to the junction surface.

(12) In the method of manufacturing a semiconductor device in (8), in the step of providing the foregoing first substrate, the plurality of pixels are arranged in a grid pattern in planar view. In the steps of providing the foregoing first and second substrates, the first coupling portions and the second coupling portions are formed such that a direction of a vector of a shortest length of the first gap portion between the pair of first coupling portions adjacent to each other in planar view and a direction of a vector of a shortest length of the second gap portion between the pair of second coupling portions adjacent to each other in planar view extend obliquely to directions in which the pixels are aligned.

(13) In the method of manufacturing a semiconductor device in (10), the capacitor-element-side light blocking film is formed in the first substrate.

(14) In the method of manufacturing a semiconductor device in (13), in the step of providing the foregoing first substrate, a first interlayer insulating film is formed and a plurality of first interconnect layers are further formed to be stacked such that the first interlayer insulating film is interposed therebetween. A part of the one of the plurality of first interconnect layers which is closest to the light receiving elements is used as the capacitor-element-side light blocking film.

(15) In the method of manufacturing a semiconductor device in (10), the capacitor-element-side light blocking film is placed in the second substrate.

(16) In the method of manufacturing a semiconductor device in (8), in the foregoing step of forming the capacitor elements, a first electrode as a semiconductor region in a supporting substrate in which a conductive impurity is diffused is formed. A dielectric layer covering at least a part of an upper surface of the first electrode is formed. A second electrode as a metal layer or a semiconductor layer containing a conductive impurity which covers at least a part of an upper surface of the foregoing dielectric layer is formed.

(17) In the method of manufacturing a semiconductor device in (8), in the foregoing step of forming the capacitor elements, a first electrode as a semiconductor layer containing a conductive impurity is formed. A dielectric layer covering at least a part of an upper surface of the foregoing first electrode is formed. A second electrode as a semiconductor layer containing a conductive impurity which covers at least a part of an upper surface of the foregoing dielectric layer is formed.

(18) In the method of manufacturing a semiconductor device in (8), in the foregoing step of forming the capacitor elements, a first electrode as a semiconductor layer containing a conductive impurity is formed. A dielectric layer covering at least a part of an upper surface of the foregoing first electrode is formed. A second electrode as a metal layer which covers at least a part of an upper surface of the foregoing dielectric layer is formed.

(19) In the method of manufacturing a semiconductor device in (8), in the foregoing step of forming the capacitor elements, a first electrode as a metal layer is formed. A dielectric layer covering at least a part of an upper surface of the foregoing first electrode is formed. A second electrode as a metal layer which covers at least a part of an upper surface of the foregoing dielectric layer is formed.

(20) In the method of manufacturing a semiconductor device in (8), in the foregoing step of providing the second substrate, a second interlayer insulating film is formed and a plurality of second interconnect layers are formed to be stacked such that the second interlayer insulating film is interposed therebetween. A portion including a first electrode as one of the plurality of stacked second interconnect layers, a dielectric layer as the second interlayer insulating film which covers at least a part of an upper surface of the first electrode, and a second electrode as another of the second interconnect layers which is other than the one of the second interconnect layers and covers at least a part of an upper surface of the dielectric layer is used as each of the capacitor elements.

(21) A semiconductor device includes a first substrate forming at least a part of each of a plurality of pixels including a plurality of light receiving elements in each of which photoelectric conversion is performed, and a second substrate having capacitor elements which store therein charges supplied from the light receiving elements. The foregoing first substrate and second substrate are joined together at a junction surface therebetween so as to be integrated with each other. The foregoing light receiving elements and capacitor elements are placed so as to be opposed to each other in a direction perpendicular to the junction surface. The foregoing capacitor elements are at positions away from a surface of the second substrate corresponding to the junction surface. The semiconductor device further includes a capacitor-element-side light blocking film which is provided so as to overlap the light receiving elements in the direction perpendicular to the foregoing junction surface and block light traveling from the light receiving elements toward the second substrate. The foregoing capacitor-element-side light blocking film is located between the light receiving elements and the capacitor elements in the direction perpendicular to the junction surface. Each of the capacitor elements includes a first electrode as a metal layer, a dielectric layer covering at least a part of an upper surface of the first electrode, and a second electrode as a metal layer covering at least a part of an upper surface of the dielectric layer.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:

1. A semiconductor device, comprising:
a first substrate forming at least a part of each of a plurality of pixels including a plurality of light receiving elements in each of which photoelectric conversion is performed; and
a second substrate having capacitor elements which store therein charges supplied from the light receiving elements,
wherein the first substrate and the second substrate are joined together at a junction surface therebetween so as to be integrated with each other,
wherein the light receiving elements and the capacitor elements are placed so as to be opposed to each other in a direction perpendicular to the junction surface, and
wherein the capacitor elements are at positions away from a surface of the second substrate corresponding to the junction surface,
the semiconductor device further comprising:
a capacitor-element-side light blocking film which is provided so as to overlap the light receiving elements in the direction perpendicular to the junction surface and block light traveling from the light receiving elements toward the second substrate,
wherein the capacitor-element-side light blocking film is located between the light receiving elements and the capacitor elements in the direction perpendicular to the junction surface.

2. A semiconductor device according to claim 1,
wherein the capacitor-element-side light blocking film is formed so as to completely overlap the light receiving elements in the direction perpendicular to the junction surface.

3. A semiconductor device according to claim 1,
wherein the first substrate includes:
a plurality of first coupling portions formed at a surface of the first substrate corresponding to the junction surface so as to electrically couple the first substrate and the second substrate to each other, and
wherein the second substrate includes:
a plurality of second coupling portions formed at the surface of the second substrate corresponding to the junction surface so as to be electrically coupled to the first coupling portions.

4. A semiconductor device according to claim 3,
wherein the pixels are arranged in a grid pattern in planar view, and
wherein the first coupling portions and the second coupling portions are arranged such that a direction of a vector of a shortest length of the first gap portion between the pair of first coupling portions adjacent to each other in planar view and a direction of a vector of a shortest length of the second gap portion between the pair of second coupling portions adjacent to each other in planar view extend obliquely to directions in which the pixels are aligned.

5. A semiconductor device according to claim 1,
wherein the capacitor-element-side light blocking film is placed in the first substrate.

6. A semiconductor device according to claim 1,
wherein the capacitor-element-side light blocking film is placed in the second substrate.

7. A semiconductor device according to claim 1,
wherein each of the capacitor elements includes:
a first electrode as a semiconductor region in a supporting substrate forming the second substrate in which a conductive impurity is diffused;
a dielectric layer covering at least a part of an upper surface of the first electrode; and
a second electrode as a metal layer or a semiconductor layer containing a conductive impurity which covers at least a part of an upper surface of the dielectric layer.

8. A semiconductor device according to claim 1,
wherein each of the capacitor elements includes:
a first electrode as a semiconductor layer containing a conductive impurity;
a dielectric layer covering at least a part of an upper surface of the first electrode; and
a second electrode as a metal layer or a semiconductor layer containing a conductive impurity which covers at least a part of an upper surface of the dielectric layer.

* * * * *